(12) United States Patent
Lee et al.

(10) Patent No.: US 10,903,284 B2
(45) Date of Patent: Jan. 26, 2021

(54) DISPLAY DEVICE

(71) Applicant: Samsung Display Co., Ltd., Yongin-si (KR)

(72) Inventors: So Young Lee, Suwon-si (KR); Sun Mi Kang, Cheonan-si (KR); Hyun Ho Kim, Hwaseong-si (KR); Cheol Jang, Uiwang-si (KR); Sun Young Jung, Suwon-si (KR); Sang Hwan Cho, Suwon-si (KR); Chung Sock Choi, Seoul (KR); Sang Hyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/981,837

(22) Filed: May 16, 2018

(65) Prior Publication Data
US 2018/0350883 A1    Dec. 6, 2018

(30) Foreign Application Priority Data

Jun. 2, 2017    (KR) .................. 10-2017-0069269

(51) Int. Cl.
*H01L 27/32* (2006.01)
*G06F 3/041* (2006.01)
*G02B 27/42* (2006.01)
*H01L 51/52* (2006.01)
(Continued)

(52) U.S. Cl.
CPC .............. *H01L 27/323* (2013.01); *G02B 1/11* (2013.01); *G02B 27/4233* (2013.01); *G06F 3/044* (2013.01); *G06F 3/0412* (2013.01); *H01L 51/5275* (2013.01); *H01L 51/5281* (2013.01); *G06F 2203/04103* (2013.01); *G06F 2203/04111* (2013.01)

(58) Field of Classification Search
CPC .............. H01L 27/323; H01L 51/5281; H01L 51/5275; G06F 3/0412; G06F 3/044; G06F 2203/04111; G06F 2203/04113; G02B 27/4233; G02B 1/11
See application file for complete search history.

(56) References Cited

U.S. PATENT DOCUMENTS

| | | | |
|---|---|---|---|
| 2010/0150513 A1* | 6/2010 | Zhang | B82Y 20/00 385/131 |
| 2011/0069014 A1* | 3/2011 | Huang | G06F 3/03547 345/173 |

FOREIGN PATENT DOCUMENTS

WO    2015/191949    12/2015

OTHER PUBLICATIONS

Jan Genzer and Jan Groenewold, "Soft matter with hard skin: From skin wrinkles to templating and material characterization" published on Feb. 8, 2006, available at: http://pubs.rsc.org/en/Content/ArticleLanding/2006/SM/b516741h#!divAbstract(Downloaded on May 16, 2017).

* cited by examiner

*Primary Examiner* — Towfiq Elahi
(74) *Attorney, Agent, or Firm* — H.C. Park & Associates, PLC

(57) ABSTRACT

A display device, including: a substrate; a first light-emitting element disposed on the substrate; an encapsulation layer disposed on the first light-emitting element; an input sensing layer disposed on the encapsulation layer; and a diffraction pattern layer disposed on the input sensing layer. The diffraction pattern layer may include a plurality of diffraction patterns arranged to have a first period in one direction.

40 Claims, 94 Drawing Sheets

(51) Int. Cl.
*G02B 1/11* (2015.01)
*G06F 3/044* (2006.01)

DISPLAY DEVICE

CROSS-REFERENCE TO RELATED APPLICATION

This application claims priority from and the benefit of Korean Patent Application No. 10-2017-0069269, filed on Jun. 2, 2017, which is hereby incorporated by reference for all purposes as if fully set forth herein.

BACKGROUND

Field

Exemplary embodiments relate to a display device.

Discussion of the Background

Display devices have become increasingly important in accordance with developments in multimedia technology. Accordingly, various types of display devices, such as a liquid crystal display (LCD), an organic light-emitting display, and the like have been used.

An organic light emitting display device, among other display devices, displays an image by using organic light-emitting elements that generate light by recombining electrons and holes. The organic light emitting display device has numerous advantages, such as a high response speed, high luminance, a wide viewing angle, and low power consumption.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of increasing an effective light-emitting area ratio.

Exemplary embodiments provide also provide a display device capable of minimizing blurring of the displayed image.

However, exemplary embodiments are not restricted to those set forth herein. The above and other exemplary embodiments of the inventive concept will become more apparent to one of ordinary skill in the art to which the inventive concept pertains by referencing the detailed description of the inventive concept given below.

Additional aspects will be set forth in the detailed description which follows, and, in part, will be apparent from the disclosure, or may be learned by practice of the inventive concept.

An exemplary embodiment discloses a display device including a substrate; a first light-emitting element disposed on the substrate; an encapsulation layer disposed on the first light-emitting element; an input sensing layer disposed on the encapsulation layer; and a diffraction pattern layer disposed on the input sensing layer. The diffraction pattern layer may include a plurality of diffraction patterns arranged to have a first period in one direction.

An exemplary embodiment also discloses a display device including a substrate; a first light-emitting element disposed on the substrate; an encapsulation layer disposed on the first light-emitting element; a diffraction pattern layer disposed on the encapsulation layer; and an input sensing layer disposed on the diffraction pattern layer. The diffraction pattern layer may include a plurality of diffraction patterns arranged to have a first period in one direction.

An exemplary embodiment also discloses a display device including a substrate; a first light-emitting element disposed on the substrate; an encapsulation layer disposed on the first light-emitting element; an input sensing layer disposed on the encapsulation layer; and a diffraction pattern layer including a plurality of diffraction patterns disposed on an optical path of light emitted from the first light-emitting element. The diffraction patterns may be arranged to have a first period in one direction, and when a cross-sectional width of one of the diffraction patterns may be defined as a first length, the first period and the first length satisfy the following equation: $0.4 \leq d1/DP1 < 1$, where DP denotes the first period and $d1$ denotes the first length.

According to the aforementioned and other exemplary embodiments of the inventive concept, the effective light-emitting area ratio can be increased.

Also, the visibility of blurring can be minimized.

Other features and exemplary embodiments may be apparent from the following detailed description, the drawings, and the claims.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
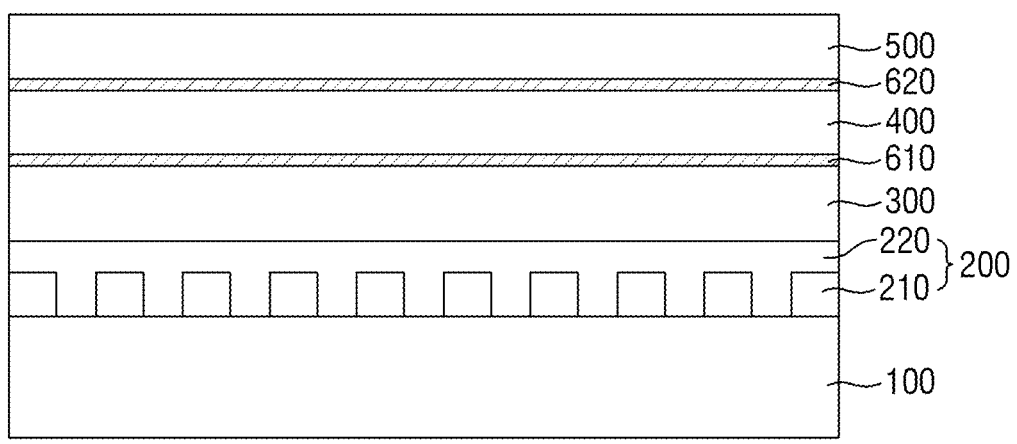
FIG. 1 is a cross-sectional view of a display device according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the inventive concept.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments will be described with reference to the accompanying drawings.

FIG. 1 is a schematic cross-sectional view of a display device according to an exemplary embodiment of the inventive concept.

Referring to FIG. 1, the display device may include a display panel 100, a diffraction pattern layer 200, an input sensing layer 300, an anti-reflection panel 400, and a window panel 500.

In the description that follows, elements formed by a continuous process may be collectively referred to as a "layer", and elements coupled to one another via another element or an adhesive member may be collectively referred to as a "panel". A panel includes a base layer providing a base surface, but a layer may not include any base layer. That is, a layer denotes one or more elements disposed on a base surface provided by another element. Examples of a base layer may include a synthetic resin film, a composite film, and a glass substrate.

Accordingly, in a case where the input sensing layer 300 includes a base layer, the input sensing layer 300 may also be referred to as an input sensing panel. Also, in a case where the anti-reflection panel 400 and the window panel 500 do not include a base layer, the anti-reflection panel 400 and the window panel 500 may also be referred to as an anti-reflection layer and a window layer, respectively.

The display panel 100 generates an image. In one exemplary embodiment, the display panel 100 may be an emissive display panel. Specifically, the display panel 100 may be an organic light-emitting display panel. However, the type of the display panel 100 is not particularly limited. That is, the display panel 100 may be a quantum dot display panel or a liquid crystal display (LCD) panel. The display panel 100 will hereinafter be described, taking an organic light-emitting display panel.

A display panel including a first encapsulation layer 160 will hereinafter be referred to as the display panel 100. A display panel including a second encapsulation layer 170 will hereinafter be referred to as a display panel 101 (or 102).

Referring to FIG. 1, although not specifically illustrated, the display device may include a protective member, which is disposed below the display panel 100. In one exemplary embodiment, the protective member may be coupled to the display panel 100 by an adhesive member. The material of the adhesive member is not particularly limited. In one exemplary embodiment, the adhesive member may be an optically clear adhesive (OCA) or optically clear resin (OCR) member or a pressure sensitive adhesive (PSA) member.

The diffraction pattern layer 200 may be disposed on the display panel 100. Specifically, the diffraction pattern layer 200 may be disposed on the optical path of light emitted from a plurality of display elements included in the display panel 100. In one exemplary embodiment, the display elements may be organic light-emitting elements. The location of the diffraction pattern layer 200 is not particularly limited as long as the diffraction pattern layer 200 is positioned on the optical path of light emitted from the display elements included in the display panel 100.

The diffraction pattern layer 200 may include a plurality of diffraction patterns 210 and a first passivation layer 220. In one exemplary embodiment, the diffraction patterns 210 may be disposed directly on the display panel 100. That is, an additional adhesive member may not be disposed between the diffraction patterns 210 and the display panel 100. In one exemplary embodiment, the diffraction patterns 210 may be formed on the display panel 100 through a continuous process.

The diffraction patterns 210 may expand the light-emitting area of the display device by diffracting light emitted from the display panel 100. This will be described later with reference to FIG. 8. In one exemplary embodiment, the diffraction patterns 210 may be patterns having periodicity. The periodicity and the shape of the diffraction patterns 210 will be described later with reference to FIGS. 4 through 6.

The first passivation layer 220 may be disposed on the diffraction patterns 210. In one exemplary embodiment, the first passivation layer 220 may be formed to cover the diffraction patterns 210. The material of the first passivation layer 220 is not particularly limited. In one exemplary embodiment, the first passivation layer 220 may be formed of an organic film or an inorganic film. The organic film may comprise at least one of an acrylic resin, a methacrylic resin, polyisoprene, a vinyl resin, an epoxy resin, a urethane resin, a cellulose resin, a siloxane resin, a polyimide (PI) resin, and a perylene resin. The inorganic film may comprise at least one of aluminum oxide, titanium oxide, silicon oxide, silicon oxynitride, zirconium oxide, and hafnium oxide. The first passivation layer 220 may be replaced with an air layer.

The input sensing layer 300 may be disposed on the diffraction pattern layer 200. In one exemplary embodiment, the input sensing layer 300 may be formed on the first passivation layer 220 through a continuous process. The input sensing layer 300 may obtain coordinate information from an external input such as, for example, a touch input. That is, the input sensing layer 300 may be a touch panel that senses a user's touch, or a fingerprint sensing panel that acquires fingerprint information from a user's finger.

In one exemplary embodiment, the input sensing layer 300 may sense an external input in a capacitive manner. The type of input sensing method used by the input sensing layer 300 is not particularly limited. In one exemplary embodiment, the input sensing layer 300 may sense an external input using an electromagnetic induction method or a pressure sensing method.

FIG. 1 illustrates that the input sensing layer 300 generally overlaps with the display panel 100, but the inventive concept is not limited thereto. That is, the input sensing layer 300 may overlap with only part of the display panel 100, for example, at least part of a display area for displaying an image. Alternatively, the input sensing layer 300 may overlap with a non-display area that does not display an image.

The anti-reflection panel 400 may be disposed on the input sensing layer 300. In one exemplary embodiment, the anti-reflection panel 400 may be coupled to the input sensing layer 300 via a first adhesive member 610. In one exemplary embodiment, the first adhesive member 610 may be a PSA member, but the inventive concept is not limited thereto. That is, alternatively, the first adhesive member 610 may be an OCA member. Still alternatively, the first adhesive member 610 may be an OCR member.

The anti-reflection panel 400 may reduce the reflectance of external light incident thereupon from the top of the window panel 500. In one exemplary embodiment, the anti-reflection panel 400 may include a retarder and a polarizer.

In one exemplary embodiment, the retarder may be of a film type or a liquid crystal coating type. The retarder may include a $\lambda/2$ retarder and/or a $\lambda/4$ retarder. In one exemplary embodiment, the polarizer may be of a film type or a liquid crystal coating type. The film-type polarizer may be a stretch-type synthetic resin film. The liquid-crystal-coating-type polarizer may include liquid crystal molecules arranged in a predetermined manner. In one exemplary embodiment, the retarder and the polarizer may further include a protective film. The retarder and the polarizer may be defined as the base layer of the anti-reflection panel 400. If the retarder and the polarizer further include a protective film, the protective film may be defined as the base layer of the anti-reflection panel 400.

The window panel 500 may be disposed on the anti-reflection panel 400. In one exemplary embodiment, the window panel 500 and the anti-reflection panel 400 may be coupled to each other via a second adhesive member 620. In one exemplary embodiment, the second adhesive member 620 may be a PSA member, but the inventive concept is not limited thereto. That is, alternatively, the second adhesive member 620 may be an OCA member. Still alternatively, the second adhesive member 620 may be an OCR member.

The order in which the diffraction pattern layer 200, the input sensing layer 300, the anti-reflection panel 400, and the window panel 500 are stacked is not limited to that illustrated in FIG. 1, and this will be described later in detail.

FIG. 1 illustrates an example in which the diffraction pattern layer 200, the input sensing layer 300, the anti-reflection panel 400, and the window panel 500 are disposed on the display panel 100, but the inventive concept is not limited thereto. That is, in another example, the diffraction pattern layer 200, the input sensing layer 300, the anti-reflection panel 400, and the window panel 500 may be disposed on the display panel 101 (or 102).

The order in which the diffraction pattern layer 200, the input sensing layer 300, and the window panel 500 are stacked may vary. The display panel 100, including the first encapsulation layer 160 and the diffraction pattern layer 200, will hereinafter be described. For convenience, the input sensing layer 300, the anti-reflection panel 400, and the window panel 500 are omitted from FIGS. 2 through 16.

Figure 2:
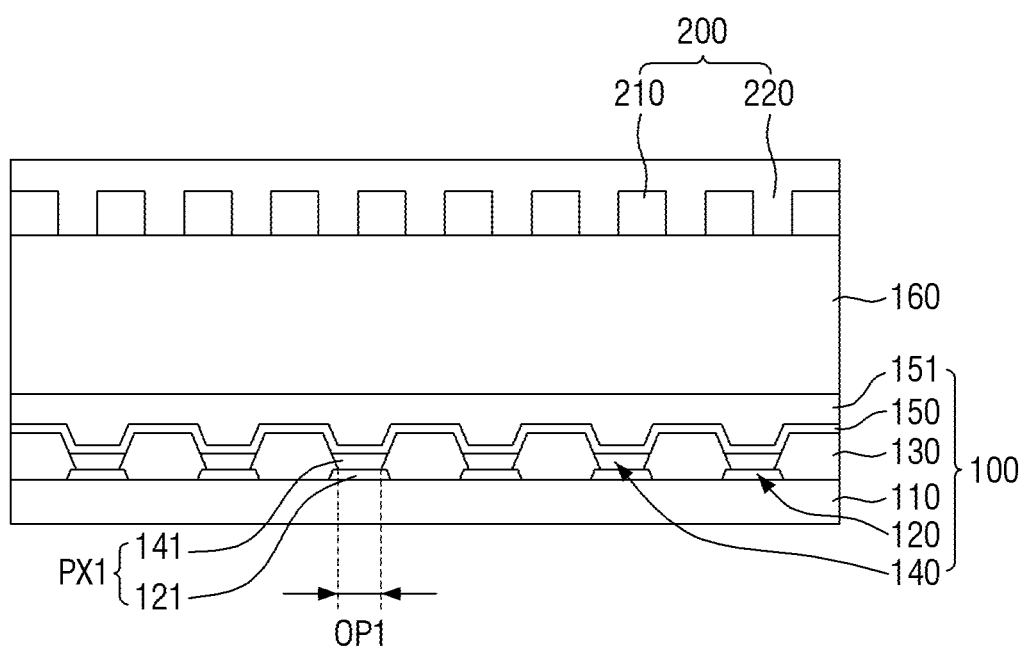
FIG. 2 is a cross-sectional view illustrating a display panel and a diffraction pattern layer according to the exemplary embodiment of FIG. 1.
Figure 3:
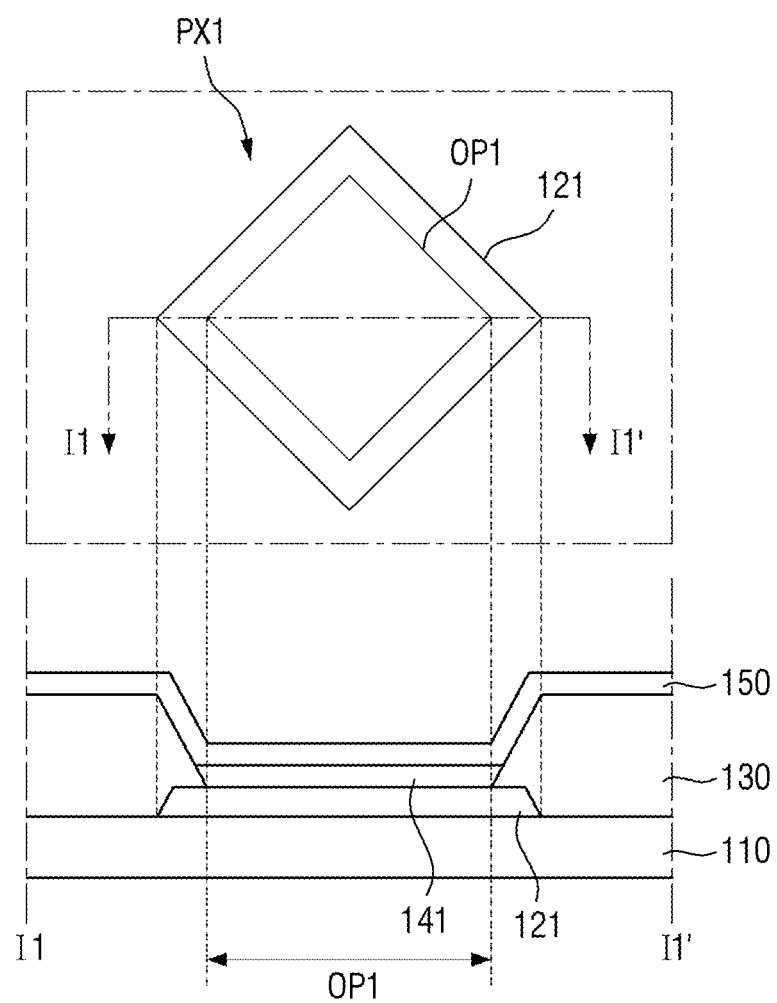
FIG. 3 shows a plan view and a cross-sectional view of a first pixel unit of FIG. 2.

FIG. 2 is a cross-sectional view illustrating a display panel and a diffraction pattern layer according to the exemplary embodiment of FIG. 1. FIG. 3 shows a plan view and a cross-sectional view of a first pixel unit of FIG. 2.

Referring to FIGS. 2 and 3, the display panel 100 may include a first substrate 110, a plurality of pixel electrodes 120, which include a first pixel electrode 121, a pixel defining film 130, a plurality of organic light-emitting elements 140, which include a first organic light-emitting element 141, a common electrode 150, a first buffer layer 151, and the first encapsulation layer 160. A pixel unit including the first pixel electrode 121 and the first organic light-emitting element 141 will hereinafter be referred to as a first pixel unit PX1.

In one exemplary embodiment, the first substrate 110 may be an insulating substrate. The first substrate 110 may be formed of glass, quartz, or a polymer resin. The material of the polymer resin may be polyethersulphone (PES), polyacrylate (PA), polyarylate (PAR), polyetherimide (PEI), polyethylene naphthalate (PEN), polyethylene terephthalate (PET), polyphenylenesulfide (PPS), polyallylate, PI, polycarbonate (PC), cellulose triacetate (CAT), cellulose acetate propionate (CAP), or a combination thereof. In another exemplary embodiment, the first substrate 110 may be a flexible substrate comprising PI.

The pixel electrodes 120 may be disposed on the first substrate 110. Although not specifically illustrated, a plurality of elements may be further provided between the first substrate 110 and the pixel electrodes 120. The plurality of elements may include a buffer layer, a plurality of conductive wires, an insulating layer, and a plurality of thin film transistors (TFTs). The TFTs may use amorphous silicon, polysilicon, low temperature polysilicon (LTPS), an oxide semiconductor, or an organic semiconductor as their channel layer. The type of the channel layer may differ from one TFT to another TFT. In one exemplary embodiment, a TFT comprising an oxide semiconductor and a TFT comprising LTPS may both be included in a single pixel unit in consideration of the functions of the TFTs or the order of processes.

The pixel electrode 120 will hereinafter be described, taking the first pixel electrode 121. In one exemplary embodiment, the first pixel electrode 121 may be an anode electrode. In a case where the first pixel electrode 121 is an anode electrode, the first pixel electrode 121 may comprise a reflective material. In one exemplary embodiment, the reflective material may include at least one reflective film formed of a material selected from the group consisting of silver (Ag), magnesium (Mg), chromium (Cr), gold (Au), platinum (Pt), nickel (Ni), copper (Cu), tungsten (W), and aluminum (Al) and a transparent or translucent electrode formed on the reflective film.

The transparent or translucent electrode may comprise at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The pixel defining film 130 may be disposed on the first pixel electrode 121. The pixel defining film 130 includes an opening OP1 exposing at least part of the first pixel electrode 121. The pixel defining film 130 may comprise an organic material or an inorganic material. In one exemplary embodiment, the pixel defining film 130 may comprise a material such as a photoresist, a PI resin, an acrylic resin, a silicon compound, or a polyacrylic resin.

In one exemplary embodiment, the shape of the first pixel electrode 121 may be rhombic. In one exemplary embodiment, the shape of an opening OP1 of the pixel defining film 130 may also be rhombic. However, the shape of the first pixel electrode 121 and the shape of the opening OP1 of the pixel defining film 130 are not particularly limited. That is, the shape of the first pixel electrode 121 and the shape of the opening OP1 of the pixel defining film 130 may vary depending on the arrangement of a plurality of pixel units.

The organic light-emitting elements 140 may be disposed on the pixel electrodes 120 and the pixel defining film 130. The organic light-emitting elements 140 will hereinafter be described, taking the first organic light-emitting element 141. The first organic light-emitting element 141 may be disposed on part of the first pixel electrode 121 exposed by the opening OP1 of the pixel defining film 130. That is, the first organic light-emitting element 141 may overlap with the opening OP1 of the pixel defining film 130. In one exemplary embodiment, the first organic light-emitting element 141 may cover at least part of the opening OP1 of the pixel defining film 130.

In one exemplary embodiment, the first organic light-emitting element 141 may emit one of red light, green light, and blue light. The wavelength of the red light may range from about 620 nm to 750 nm, the wavelength of the green light may range from about 495 nm to 570 nm, and the wavelength of the blue light may range from about 450 nm to 495 nm.

In another exemplary embodiment, the first organic light-emitting element 141 may emit white light. In this exemplary embodiment, the first organic light-emitting element 141 may include a stack of a red light-emitting layer, a green light-emitting layer, and a blue light-emitting layer. The first organic light-emitting element 141 may further include a color filter for displaying red, green, and blue colors.

Although not specifically illustrated, the first organic light-emitting element 141 may have a multilayer structure including a hole injection layer (HIL), a hole transport layer (HTL), an electron transport layer (ETL), and an electron injection layer (EIL).

The common electrode 150 may be disposed on the first organic light-emitting element 141 and the pixel defining film 130. In one exemplary embodiment, the common electrode 150 may be formed on the entire first organic light-emitting element 141 and the entire pixel defining film 130. In one exemplary embodiment, the common electrode 150 may be a cathode electrode. In one exemplary embodiment, the common electrode 150 may comprise at least one selected from the group consisting of lithium (Li), calcium (Ca), LiF/Ca, LiF/Al, Al, Ag, and Mg. The common electrode 150 may be formed of a metal thin film having a low work function. In one exemplary embodiment, the common electrode 150 may be a transparent or translucent electrode comprising at least one selected from the group consisting of ITO, IZO, ZnO, indium oxide, IGO, and AZO.

The first buffer layer 151 may be disposed on the common electrode 150. The material of the first buffer layer 151 is not particularly limited. In one exemplary embodiment, the first buffer layer 151 may comprise an inorganic material or an organic material. The first buffer layer 151 may have a single- or multilayer structure in which at least one of an organic layer and an inorganic layer is stacked. In another exemplary embodiment, the first buffer layer 151 may be an air layer. In a case where the first buffer layer 151 is an air layer, no particular element is provided between the common electrode 150 and the first encapsulation layer 160. The first buffer layer 151 may not be provided.

Although not specifically illustrated, a capping layer may be disposed on the common electrode 150. The capping layer may prevent light incident upon the common electrode 150 from being lost by total reflection. In one exemplary embodiment, the capping layer may be formed of an organic film or an inorganic film. In one exemplary embodiment, the first buffer layer 151 may perform the functions of the capping layer.

The first encapsulation layer 160 may be disposed on the first substrate 110 to cover the organic light-emitting elements 140. That is, the organic light-emitting elements 140 may be disposed between the first substrate 110 and the first encapsulation layer 160. The first encapsulation layer 160 may block the organic light-emitting elements 140 from external oxygen and moisture.

In one exemplary embodiment, the first encapsulation layer 160 may be a transparent insulating substrate. The first encapsulation layer 160 may be a glass substrate, a quartz substrate, or a transparent resin substrate. A sealing member may be formed between the first encapsulation layer 160 and the first substrate 110 to bond the first encapsulation layer 160 and the first substrate 110 together. The first encapsulation layer 160 will hereinafter be described as being a transparent insulating substrate, and the second encapsulation layer 170 will hereinafter be described as having a structure in which organic and/or inorganic layers are stacked.

The diffraction pattern layer 200 will hereinafter be described.

The diffraction pattern layer 200 may be disposed on the first encapsulation layer 160. Specifically, the diffraction pattern layer 200 may be disposed on the optical path of light emitted from the organic light-emitting elements 140. The location of the diffraction pattern layer 200 is not particularly limited as long as the diffraction pattern layer 200 is disposed on the optical path of light emitted from the organic light-emitting elements 140. For example, referring to FIG. 2, the diffraction pattern layer 200 may be disposed above or below the first encapsulation layer 160. The diffraction pattern layer 200 will hereinafter be described as being disposed above the first encapsulation layer 160.

As described above, the diffraction patterns 210 may be patterns having periodicity. In one exemplary embodiment, the diffraction patterns 210 may all have the same shape. The periodicity and the shape of the diffraction patterns 210 will be described with reference to FIGS. 4 to 6.

Figure 4:
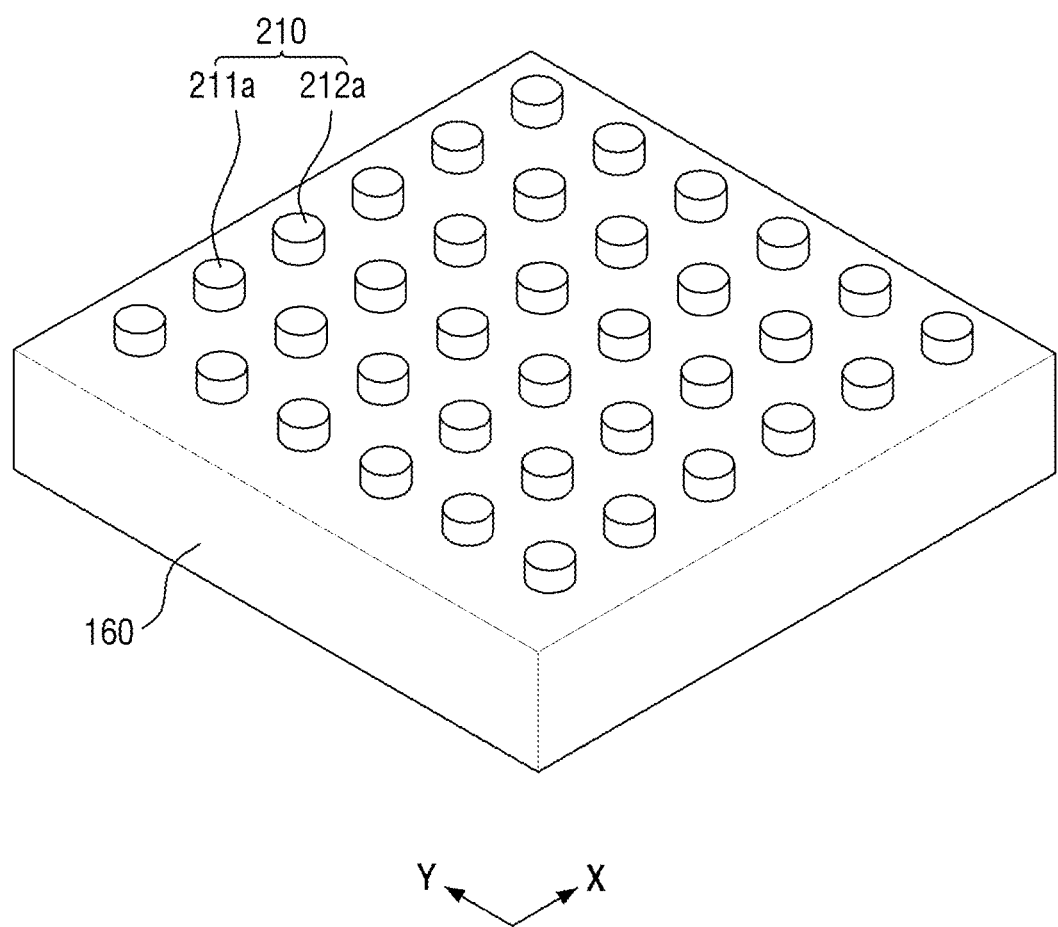
FIG. 4 is a perspective view illustrating a first encapsulation layer and the diffraction pattern layer of FIG. 2.
Figure 5:
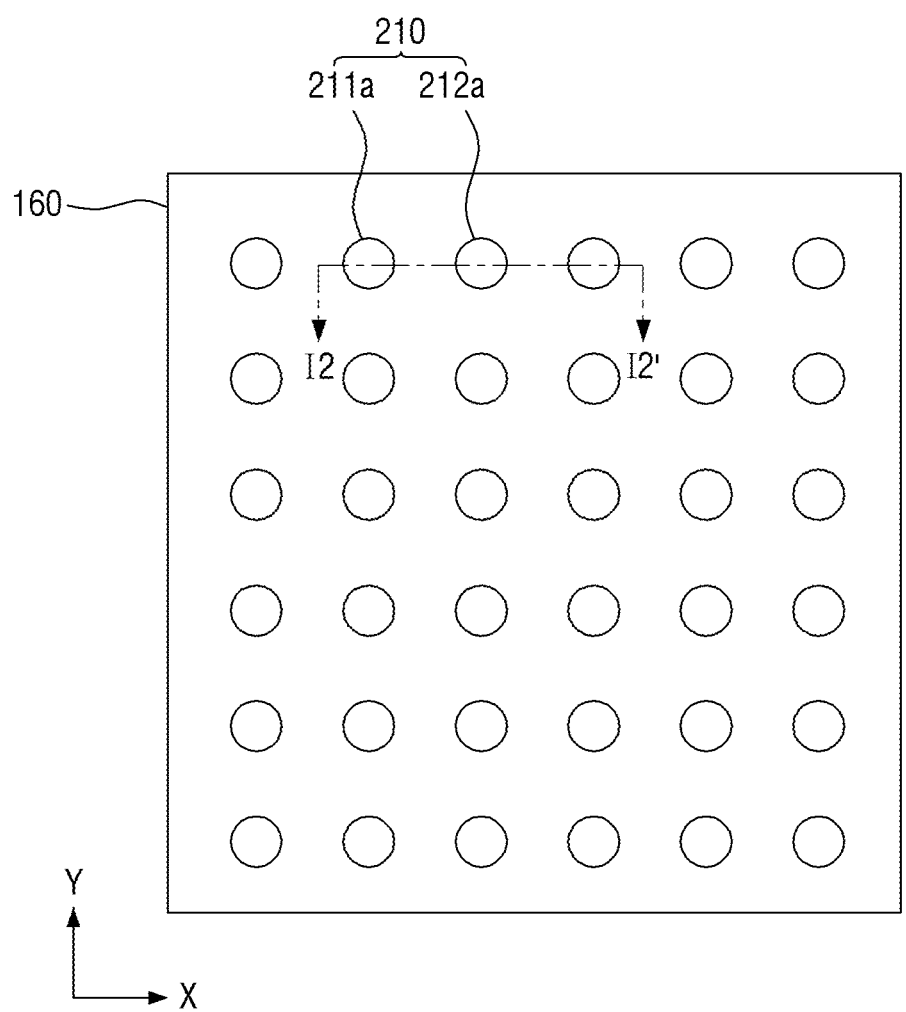
FIG. 5 is a plan view illustrating the first encapsulation layer and the diffraction pattern layer of FIG. 4.
Figure 6:
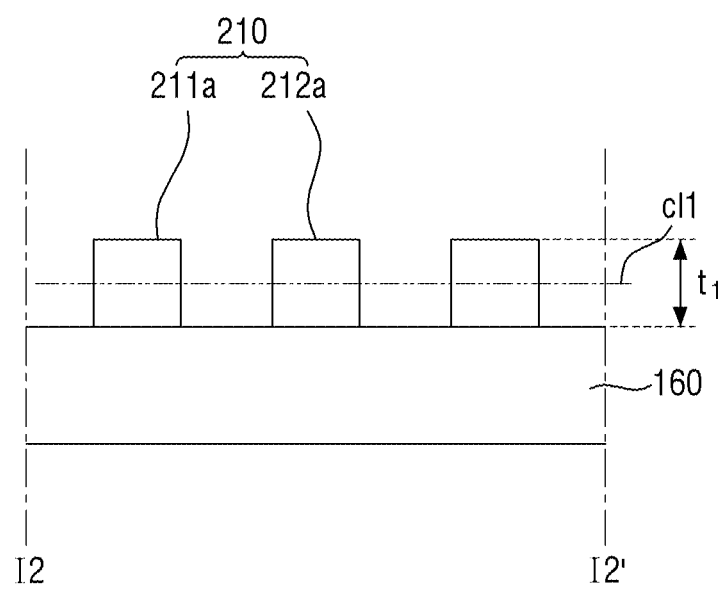
FIG. 6 is a cross-sectional view taken along line 12-12' of FIG. 5.

FIG. 4 is a perspective view illustrating the first encapsulation layer and the diffraction pattern layer of FIG. 2. FIG. 5 is a plan view illustrating the first encapsulation layer and the diffraction pattern layer of FIG. 4. FIG. 6 is a cross-sectional view taken along line 12-12' of FIG. 5.

Referring to FIGS. 4 through 6, the diffraction patterns 210 may be disposed on the first encapsulation layer 160. Referring to FIG. 4, in one exemplary embodiment, the diffraction patterns 210 may protrude from the first encapsulation layer 160 in an upward direction. The upward direction may refer to the direction of the optical path of light emitted from the organic light-emitting elements 140 of FIG. 2.

In one exemplary embodiment, the diffraction patterns 210 may have a cylindrical shape. That is, the top and bottom surfaces of each of the diffraction patterns 210 may have a circular shape. The circular shape encompasses a substantially circular shape in a plan view. For example, the circular shape may include an oval shape or a substantially circular polygonal shape.

The diffraction patterns 210 may have a first thickness $t_1$. The first thickness $t_1$ refers to the distance from the bottom surface to the top surface of each of the diffraction patterns 210.

The diffraction patterns 210 may be arranged to have a first period DP1. The diffraction patterns 210 may have a first length d1. The first period DP1 and the first length d1 will hereinafter be described with reference to FIGS. 6 and 7, taking first and second diffraction patterns 211a and 212a.

Figure 7:
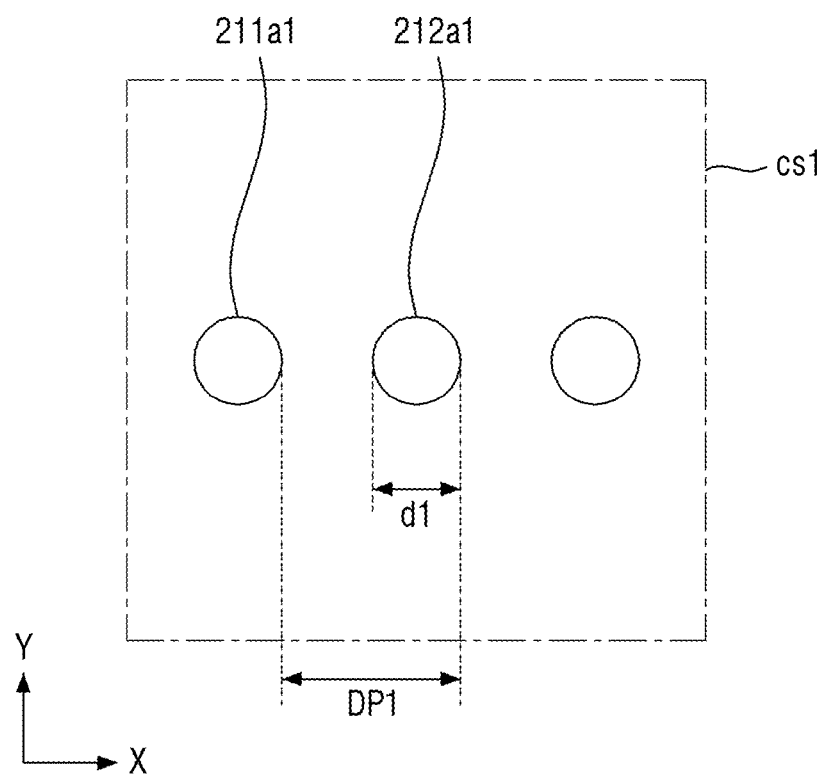
FIG. 7 is a cross-sectional view taken along a first imaginary line cl1 of FIG. 6.

FIG. 7 is a cross-sectional view taken along a first imaginary line of FIG. 6. Specifically, FIG. 7 shows a cross-sectional region cs1 taken along a first imaginary line cl1 of FIG. 6. The first imaginary line cl1 is a line passing through the midpoints of the diffraction patterns 210 in the direction of the first thickness $t_1$. Reference numeral 211a1 denotes a cross section of the first diffraction pattern 211a taken along the first imaginary line cl1. Reference numeral 212a1 denotes a cross section of the second diffraction pattern 212a taken along the first imaginary line cl1.

Referring to FIG. 7, the first period DP1 is defined as the distance between a side of the cross section 211a1 of the first diffraction pattern 211a that is adjacent to the cross section 212a1 of the second diffraction pattern 212a and a corresponding side of the cross section 212a1 of the second diffraction pattern 212a. The first length d1 refers to the width of, for example, the cross section 212a1 of the second diffraction pattern 212a.

That is, the first period DP1 and the first length d1 of the diffraction patterns 210 may be defined with respect to the cross sections of the diffraction patterns 210 taken along the first imaginary line cl1.

Referring again to FIGS. 4 and 5, in one exemplary embodiment, the period at which the diffraction patterns 210 are arranged along a first direction X and the period at which the diffraction patterns 210 are arranged along a second direction Y may both be the same as the first period DP1. The number of diffraction patterns 210 arranged along the first direction X and the number of diffraction patterns 210 arranged along the second direction Y may be the same. Referring to FIGS. 4 and 5, the first direction X is defined as a row direction, and the second direction Y is defined as a column direction. Specifically, referring to FIGS. 4 and 5, the second direction Y is defined as a column direction perpendicularly intersecting the first direction X.

If at least one of the first period DP1, the first length d1, and the first thickness $t_1$ of the diffraction patterns 210 changes, a first diffraction angle (θ1 of FIG. 8) of light emitted from the organic light-emitting elements 140, and a second diffraction angle (θ2 of FIG. 8), a first diffraction distance (β1 of FIG. 8) and the luminance of light transmitted through the diffraction pattern layer 200 may change. This will be described later.

Figure 8:
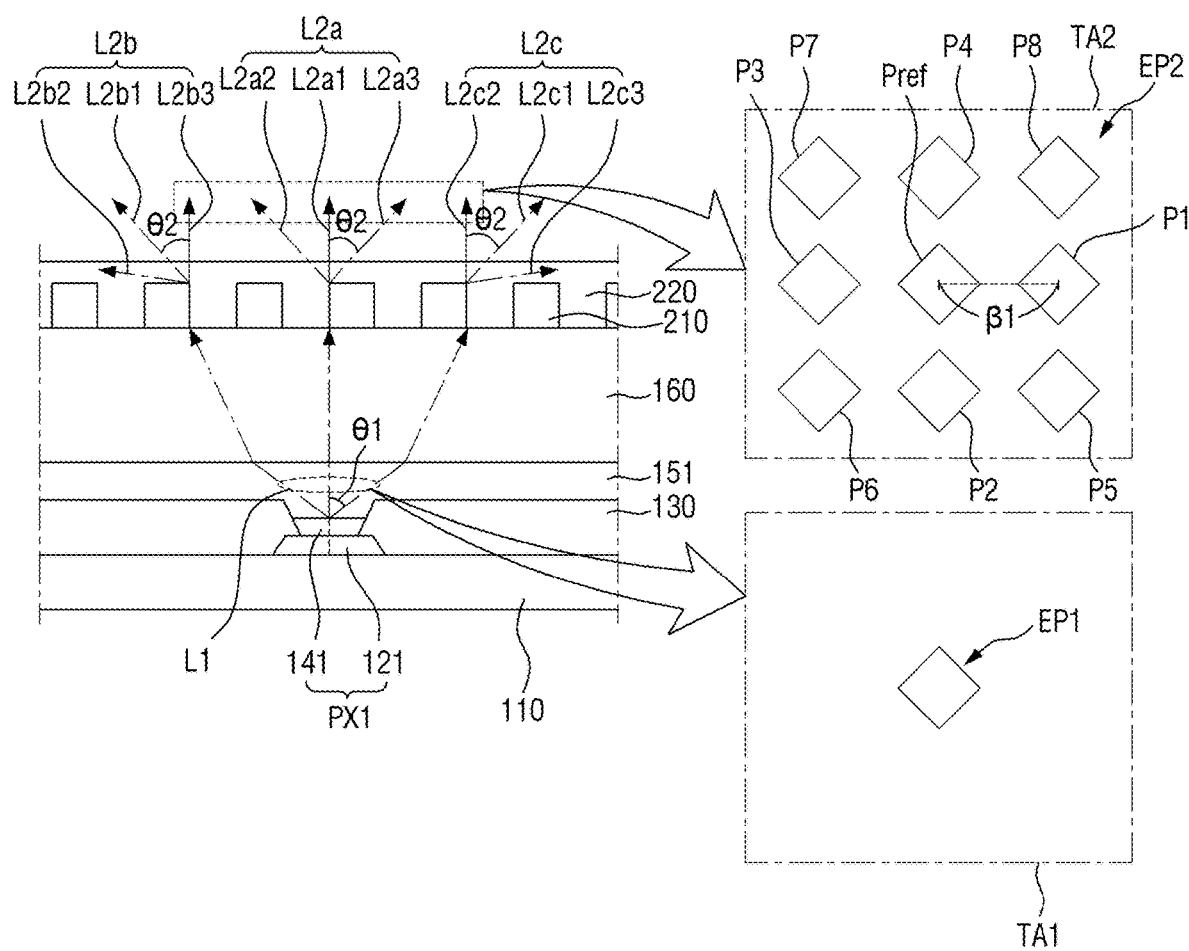
FIG. 8 shows how the light-emitting area of the display device of FIG. 1 can be expanded.

FIG. 8 shows how the light-emitting area of the display device of FIG. 1 can be expanded.

The expansion of a light-emitting area by the diffraction of light L1 emitted from the first organic light-emitting element 141 will hereinafter be described, taking the first pixel unit PX1. For convenience, some of the elements illustrated in FIG. 2 are omitted from FIG. 8.

An emission pattern formed in a first region TA1 by the light L1 emitted from the first organic light-emitting element 141 is defined as a first emission pattern EP1. An emission pattern formed in a second region TA2 by light (L2a, L2b, and L2c) transmitted through the diffraction pattern layer 200 is defined as a second emission pattern EP2. The light (L2a, L2b, and L2c) transmitted through the diffraction pattern layer 200 will hereinafter be referred to as diffracted light.

The light L1 emitted from the first organic light-emitting element 141 may be provided to the diffraction pattern layer 200 via the first encapsulation layer 160. The optical path of the light L1 emitted from the first organic light-emitting element 141 may change by a predetermined angle due to the refractive indexes of the first encapsulation layer 160 and the first buffer layer 151. The change of the optical path of light by the refractive indexes of the first encapsulation layer 160 and the first buffer layer 151 will be described later together with the first diffraction distance β1.

The diffraction pattern layer 200 may generate first diffracted light L2a, second diffracted light L2b, and third diffracted light L2c by diffracting the light L1 emitted from the first organic light-emitting element 141. In one exemplary embodiment, the first diffracted light L2a, the second diffracted light L2b, and the third diffracted light L2c may include zeroth-order diffracted light and first-order diffracted light. Zeroth-order diffracted light refers to light whose optical path is the same before and after being diffracted by the diffraction pattern layer 200. First-order diffracted light refers to light whose optical path is changed by the diffraction pattern layer 200 and thereby having the second diffraction angle θ2 with respect to the zeroth-order diffracted light.

Referring to FIG. 8, reference numerals L2b1, L2a1, and L2c1 represent zeroth-order diffracted light, and reference numerals L2b2, L2b3, L2a2, L2a3, L2c2, and L2c3 refer to first-order diffracted light. In another exemplary embodiment, the first diffracted light L2a, the second diffracted light L2b, and the third diffracted light L2c may further include second or higher-order diffracted light. The first diffracted light L2a, the second diffracted light L2b, and the third diffracted light L2c will hereinafter be described as including zeroth-order diffracted light and first-order diffracted light.

The first diffracted light L2a, the second diffracted light L2b, and the third diffracted light L2c may include first effective light L2a1, second effective light L2b3, and third effective light L2c2 all having an optical path perpendicular to the first substrate 110. The term "perpendicular", as used herein, encompasses not only a direction perfectly perpendicular to the first substrate 110, but also a direction substantially perpendicular to the first substrate 110. The order of diffracted light that the first effective light L2a1, the second effective light L2b3, and the third effective light L2c2 may include is not particularly limited as long as the optical path of the first effective light L2a1, the second effective light L2b3, and the third effective light L2c2 is perpendicular to the first substrate 110. That is, the first effective light L2a1, the second effective light L2b3, and the third effective light L2c2 may include both zeroth-order diffracted light and first-order diffracted light.

The diffraction pattern layer 200 may generate the first effective light L2a1, the second effective light L2b3, and the third effective light L2c2 by diffracting the light L1 emitted from the first organic light-emitting element 141. Accordingly, the second emission pattern EP2 may include a reference emission pattern Pref and a plurality of first through eighth duplicated emission patterns P1 through P8 obtained from the reference emission pattern Pref. However, the luminance of the reference emission pattern Pref and the luminance of the first duplicated emission pattern P1 may differ from each other. The first through eighth duplicated light emission patterns P1 through P8 will be described later, taking the first duplicated emission pattern P1.

The first and second regions TA1 and TA2 have the same area. On the other hand, the number of emission patterns included in the second region TA2 is greater than the number of emission patterns included in the first region TA1. This means that the light-emitting area of the second region TA2 is larger than the light-emitting area of the first region TA1. That is, the second region TA2 has a smaller non-light-emitting area than the first region TA1.

It can be said that the larger the light-emitting area, the larger the effective light-emitting area ratio. The effective light-emitting area ratio of a region is defined as the ratio of the area of emission patterns included in the region to the area of the entire region. Emission patterns that are needed for calculating the effective light-emitting area ratio of a region may include a reference emission pattern and one or more duplicated emission patterns obtained from the reference emission pattern. For example, the second region TA2 has a total of nine emission patterns including the reference emission pattern Pref and the first through eighth duplicated emission patterns P1 through P8, but the first region TA1 has only one emission pattern. Accordingly, the effective light-emitting area ratio of the second region TA2 is greater than the effective light-emitting area ratio of the first region TA1.

Duplicated emission patterns used to calculate the effective light-emitting area ratio of a region may be defined as duplicated emission patterns whose luminance is greater than or equal to about 3% of the luminance of their corresponding reference emission pattern. For example, if the luminance of the first through eighth duplicated emission patterns P1 through P8 is greater than or equal to about 3% of the luminance of the reference emission pattern Pref, the first through eighth duplicated emission patterns P1 through P8 may all be used to calculate the effective light-emitting area ratio of the second region TA2. A case where the luminance of duplicated emission patterns is greater than or equal to about 3% of the luminance of a reference emission pattern encompasses even a case where the luminance of the duplicated emission patterns is greater than the luminance of the reference emission pattern.

Figure 9A:
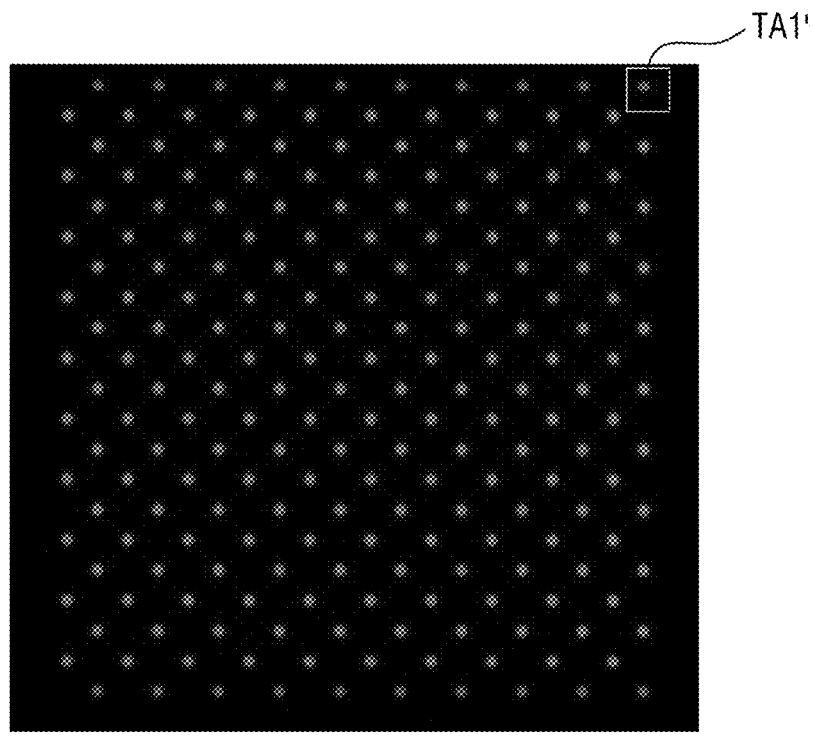
FIG. 9A and FIG. 9B show an increase in the effective light-emitting area ratio of the display device of FIG. 1.
Figure 9B:
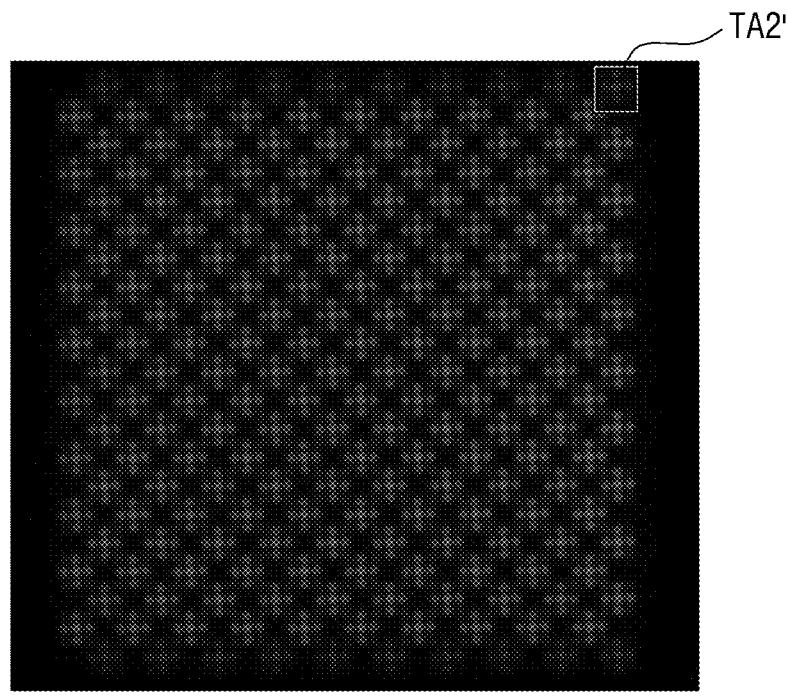

FIGS. 9A and 9B show an increase in the effective light-emitting area ratio of the display device of FIG. 1. Specifically, FIG. 9A shows a region with emission patterns that are encountered before passing through the diffraction pattern layer 200, and FIG. 9B shows a region with emission patterns that are encountered after passing through the diffraction pattern layer 200. Referring to FIG. 9A, reference character TA1' refers to an exemplary first region (TA1 of FIG. 8). Referring to FIG. 9B, reference character TA2' refers to an exemplary second region (TA2 of FIG. 8). The first and second regions TA1' and TA2' have the same area.

As shown in FIGS. 9A and 9B, the light-emitting area of the second region TA2' is larger than the light-emitting area of the first region TA1', which means an increase in effective light-emitting area ratio. That is, the display device of FIG. 1 can increase effective light-emitting area ratio by diffracting the light L1 emitted from the organic light-emitting elements 140. As a result, the emission efficiency of the light L1 emitted from the organic light-emitting elements 140 can be improved.

Conditions that should be met to allow the luminance of at least one of the first through eighth duplicated emission patterns P1 through P8 to be at least 3% of the luminance of the reference emission pattern Pref will hereinafter be described.

Figure 10A:
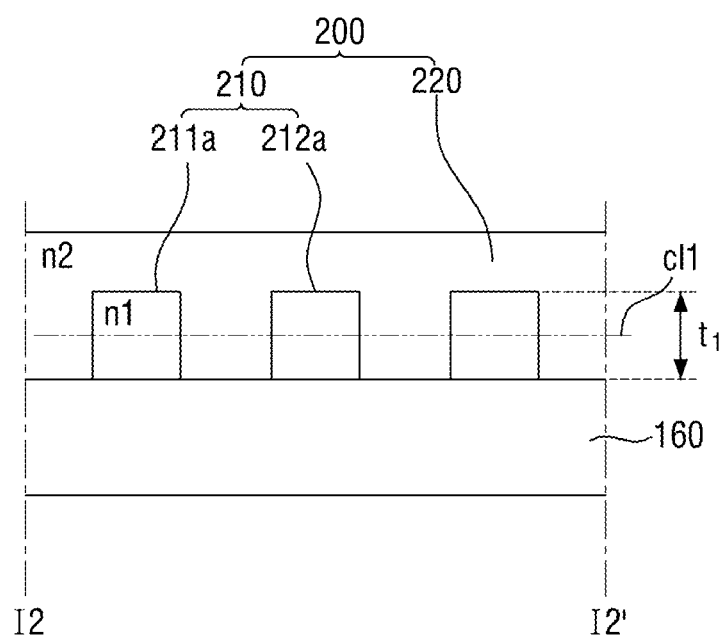
FIG. 10A and FIG. 10B show a cross-sectional region taken along line 12-12' of FIG. 5.
Figure 10B:
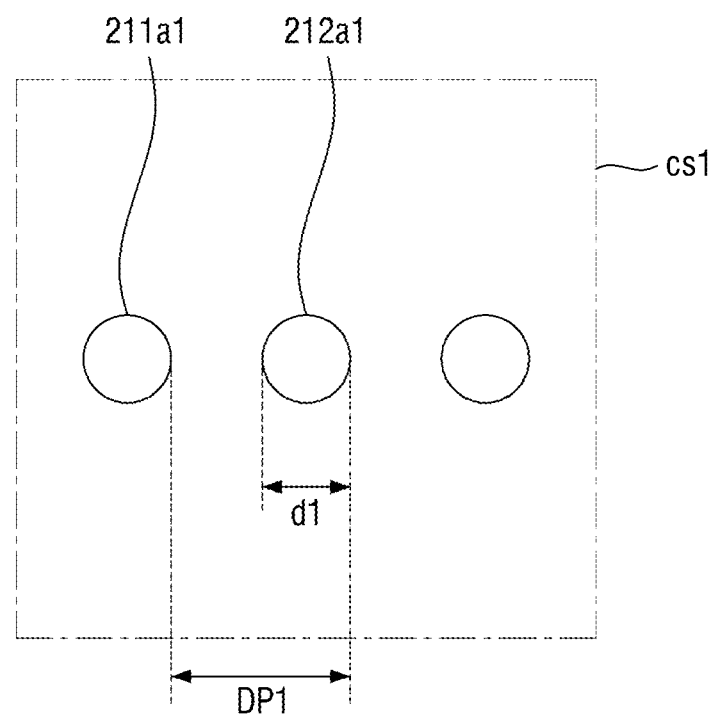
Figure 11A:
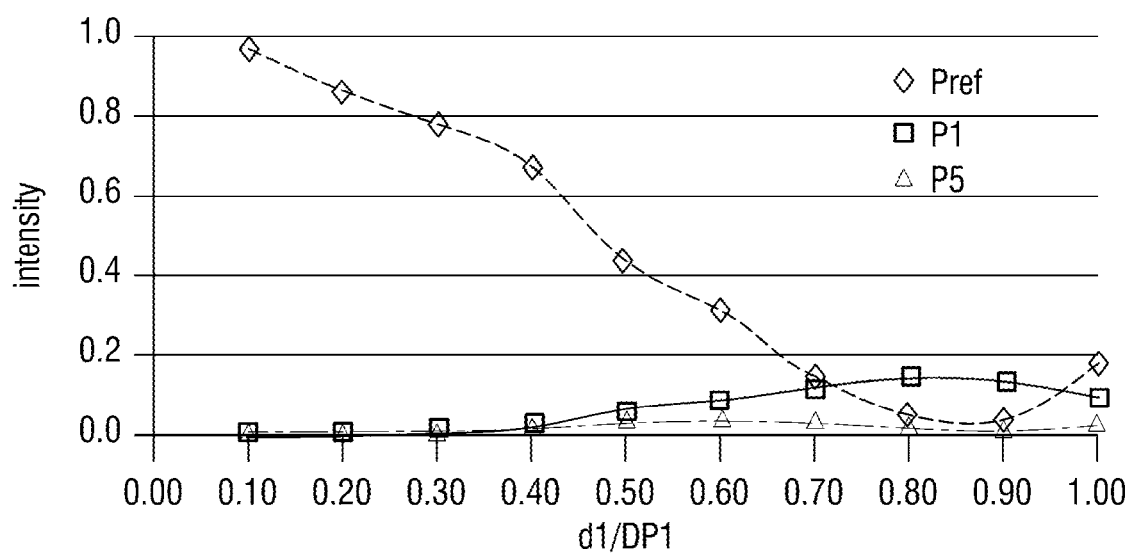
FIG. 11A, FIG. 11B, and FIG. 11C show graphs indicating the luminances of a reference emission pattern and first and fifth duplicated emission patterns of FIG. 8 for different colors.
Figure 11B:
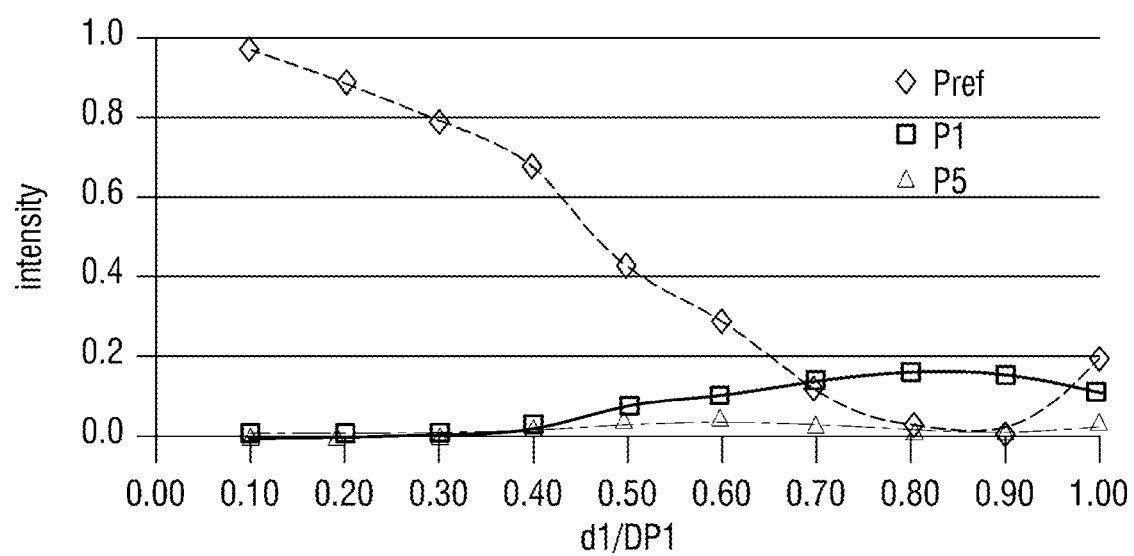
Figure 11C:
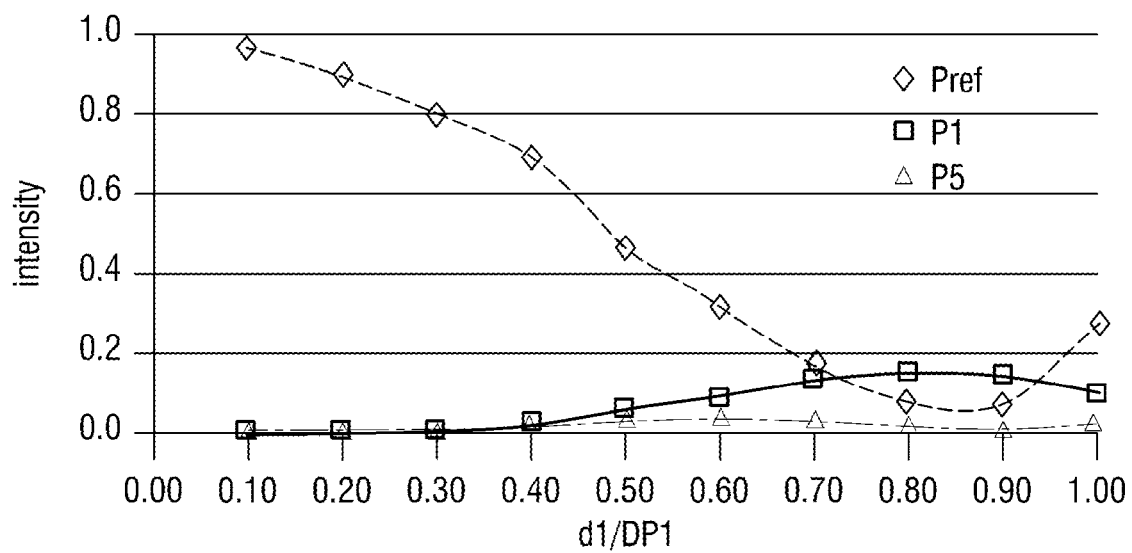
Figure 12A:
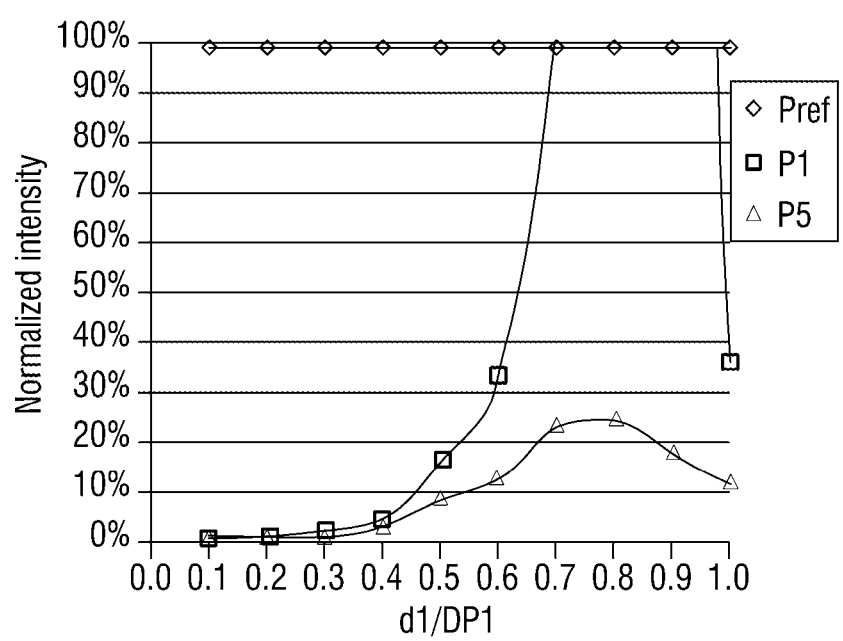
FIG. 12A, FIG. 12B, and FIG. 12C show graphs obtained by normalizing the luminances of the first and fifth duplicated emission patterns of FIG. 8 with respect to the luminance of the reference emission pattern of FIG. 8.
Figure 12B:
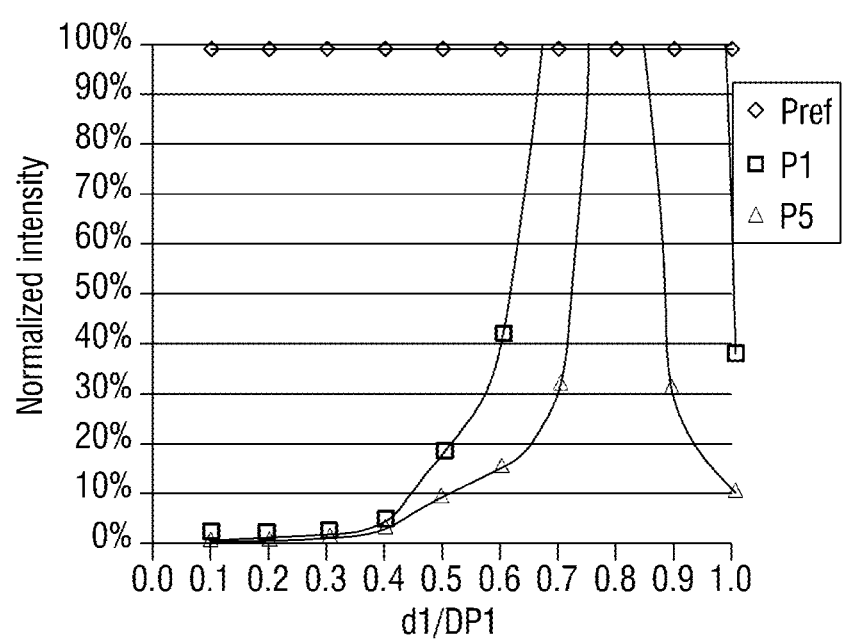
Figure 12C:
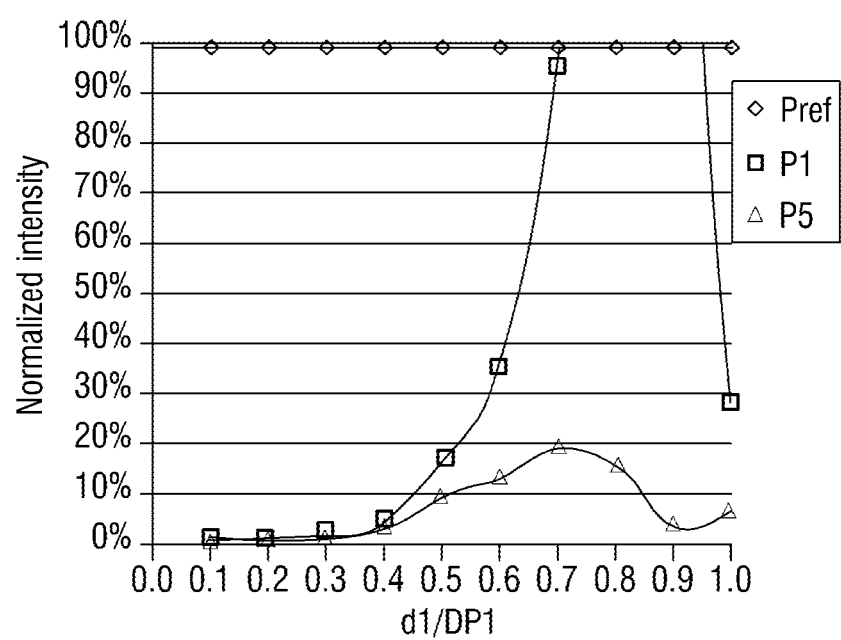

FIGS. 10A and 10B show the cross-sectional region taken along line 12-12' of FIG. 5. FIGS. 11A, 11B, and 11C show graphs indicating the luminances of the reference emission pattern and the first and fifth duplicated emission patterns of FIG. 8 for different colors. FIGS. 12A, 12B, and 12C show graphs obtained from the graphs of FIGS. 11A, 11B, and 11C, respectively, by normalizing the luminances of the first and fifth duplicated emission patterns of FIG. 8 with respect to the luminance of the reference emission pattern of FIG. 8.

The luminances of the reference emission pattern Pref and the first through eighth duplicated emission patterns P1 through P8 may be affected by the first period DP1, the first length d1, the first thickness $t_1$, and a refractive index n1 of the diffraction patterns 210, and a refractive index n2 of the first passivation layer 220.

If the relationship between the first period DP1 and the first length d1 satisfies Equation (1), which will be described later, and the relationship between the refractive index n1 of the diffraction patterns 210 and the refractive index n2 of the first passivation layer 220 satisfies Equation (2), which will also be described later, the luminance of at least one of the first through eighth duplicated emission patterns P1 through P8 may become greater than or equal to about 3% of the luminance of the reference emission pattern Pref.

In one exemplary embodiment, the first through fourth duplicated emission patterns P1 through P4, which are arranged in the same row or column as the reference emission pattern Pref, may all have the same luminance. In one exemplary embodiment, the fifth through eighth duplicated emission patterns P5 through P8, which are arranged diagonally with respect to the reference emission pattern Pref, may all have the same luminance. In one exemplary embodiment, the luminance of the first through fourth duplicated emission patterns P1 through P4 and the luminance of the fifth through eighth duplicated emission patterns P5 through P8 may differ from each other. The relationship between the first period DP1 and the first length d1 and the relationship between the refractive index n1 of the diffraction patterns 210 and the refractive index n2 of the first passivation layer 220 will hereinafter be described, taking the reference emission pattern Pref and the first and fifth duplicated emission patterns P1 and P5.

First, the relationship between the first period DP1 and the first length d1 will hereinafter be described. The first period DP1 and the first length d1, described above with reference to FIGS. 6 and 7, need to satisfy Equation (1):

$$0.4 \leq d1/DP1 \leq 1 \qquad \text{Equation (1)}$$

Equation (1) will hereinafter be described with reference to FIGS. 8, 11A-C, and 12A-C. The graph in FIG. 11A shows the variation of the luminances of the reference emission pattern Pref and the first and fifth duplicated emission patterns P1 and P5 in accordance with d1/DP1 when the first organic light-emitting element 141 emits blue light. The graph in FIG. 11B shows the variation of the luminances of the reference emission pattern Pref and the first and fifth duplicated emission patterns P1 and P5 in accordance with d1/DP1 when the first organic light-emitting element 141 emits green light. The graph in FIG. 11C shows the variation of the luminances of the reference emission pattern Pref and the first and fifth duplicated emission patterns P1 and P5 in accordance with d1/DP1 when the first organic light-emitting element 141 emits red light. The graphs in FIGS. 12A-12C are obtained from the graphs of FIGS. 11A-11C, respectively, by normalizing the luminances of the first and fifth duplicated emission patterns P1 and P5 with respect to the luminance of the reference emission pattern Pref. Referring to FIGS. 11A through 11C and FIGS. 12A through 12C, "intensity" refers to the intensity of luminance.

Referring to FIGS. 11A through 11C, as d1/DP1 increases, the luminance of the reference emission pattern Pref generally decreases, but the luminances of the first and fifth duplicated emission patterns P1 and P5 generally increase.

Referring to FIGS. 12A through 12C, which are graphs obtained by normalizing the luminances of the first and fifth duplicated emission patterns P1 and P5 with respect to the luminance of the reference emission pattern Pref, when d1/DP1 is about 0.4 or greater, the luminance of the first duplicated emission pattern P1 is greater than or equal to about 3% of the luminance of the reference emission pattern Pref. When d1/DP1 is about 0.7 to 0.9, the luminance of the first duplicated emission pattern P1 is higher than the luminance of the reference emission pattern Pref.

When d1/DP1 is 1, the first period DP1 and the first length d1 are equal to each other. However, since the diffraction patterns 210 have a circular cross-sectional shape, d1/DP1 may be allowed to be 1 because the cross sections of a pair of adjacent diffraction patterns 210 do not overlap with each other.

The first thickness $t_1$ and the refractive index n1 of the diffraction patterns 210 and the refractive index n2 of the first passivation layer 220 need to satisfy Equation (2) below. If an additional element is provided on the diffraction patterns 210 to replace the first passivation layer 220, the refractive index n2 may be replaced with the refractive index of the additional element. Equation (2) is as follows:

$$(m*\lambda)-60 \text{ (nm)} \leq A \leq (m*\lambda)+60 \text{ (nm)}$$

$$A \neq \Delta n \, t_1 \qquad \text{Equation (2)}$$

where the unit of measurement of $\Delta n \, t_1$ and A is nm, $\Delta n = |n1-n2|$, m is an integer not less than 0.

Equation (2) will hereinafter be described with reference to FIGS. 8, 10, 13A-C, and 14A-C.

Figure 13A:
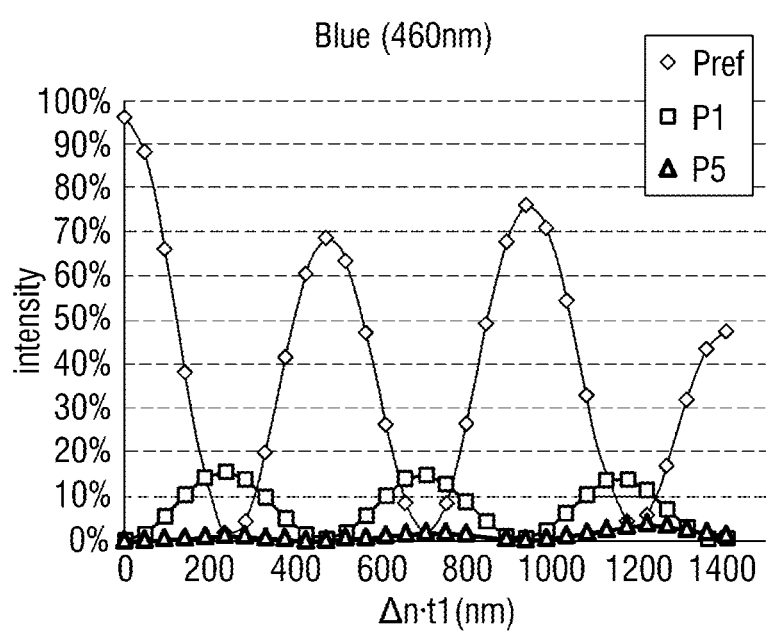
FIG. 13A is a graph showing the variation of luminance in accordance with Δn t1 when a first organic light-emitting element emits blue light.
Figure 13B:
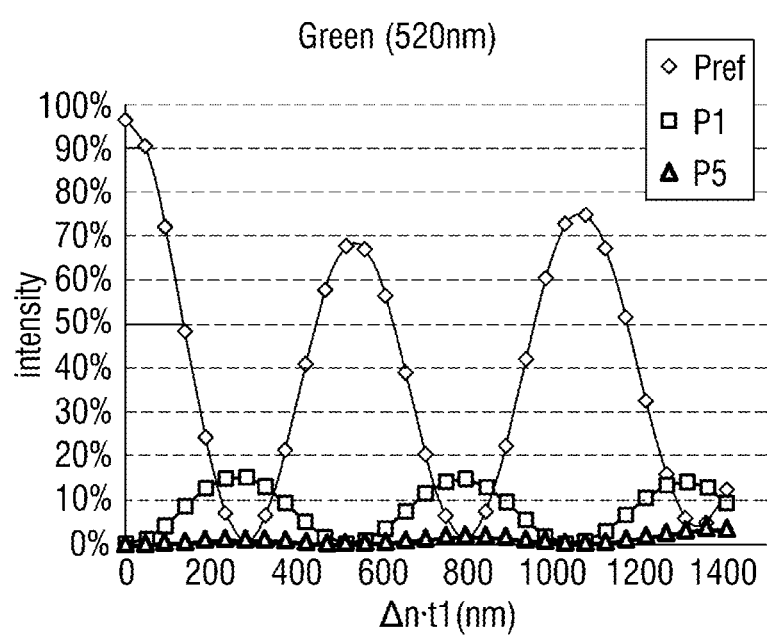
FIG. 13B is a graph showing the variation of luminance in accordance with Δn $t_1$ when the first organic light-emitting element emits green light.
Figure 13C:
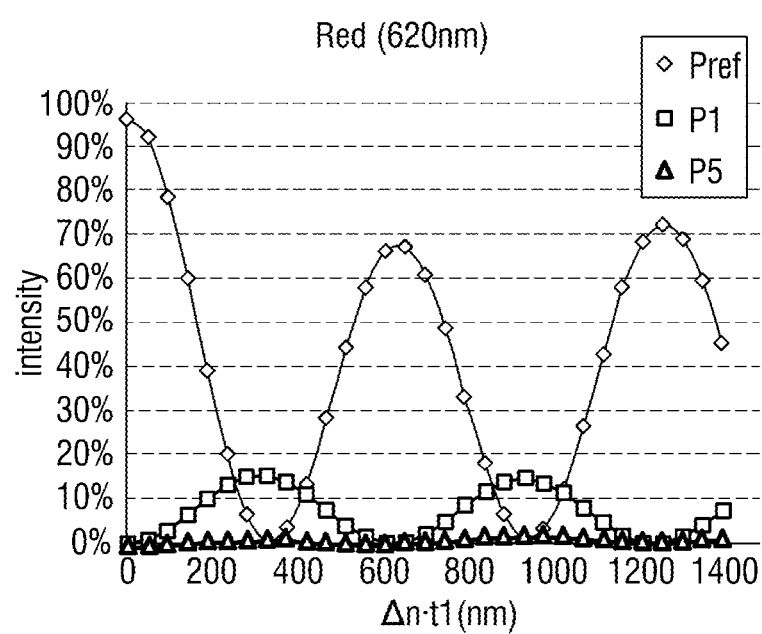
FIG. 13C is a graph showing the variation of luminance in accordance with Δn $t_1$ when the first organic light-emitting element emits red light.
Figure 14A:
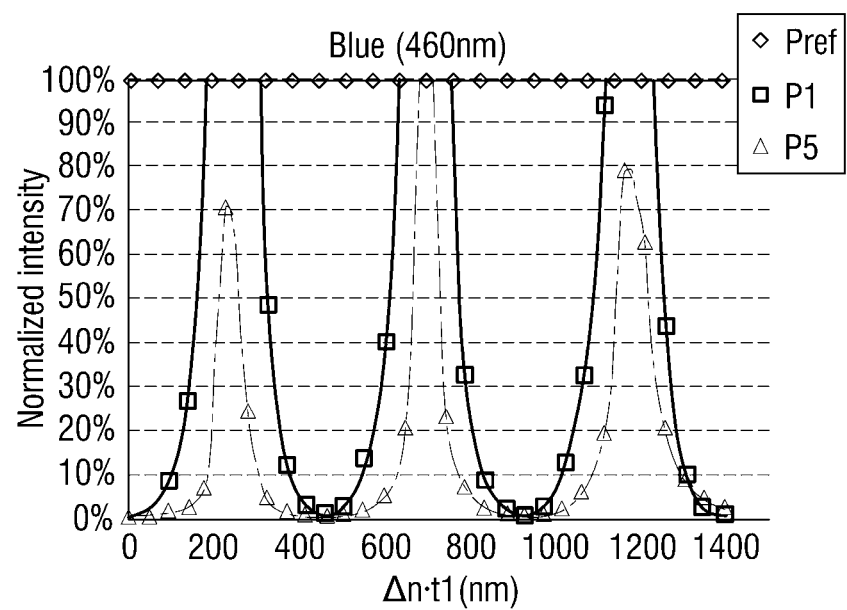
FIG. 14A is a graph showing normalized luminance in accordance with Δn t1 when a first organic light-emitting element emits blue light.
Figure 14B:
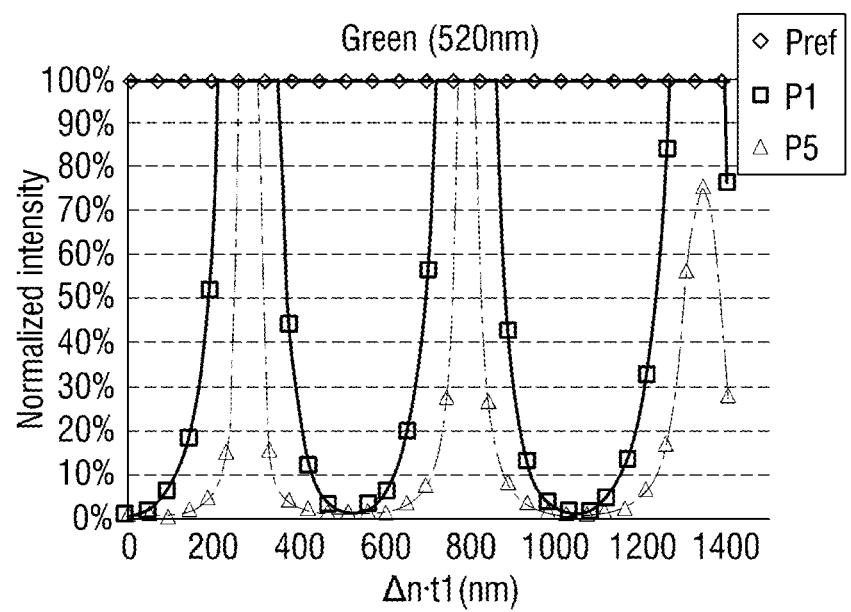
FIG. 14B is a graph showing the normalized luminance in accordance with Δn $t_1$ when the first organic light-emitting element emits green light.
Figure 14C:
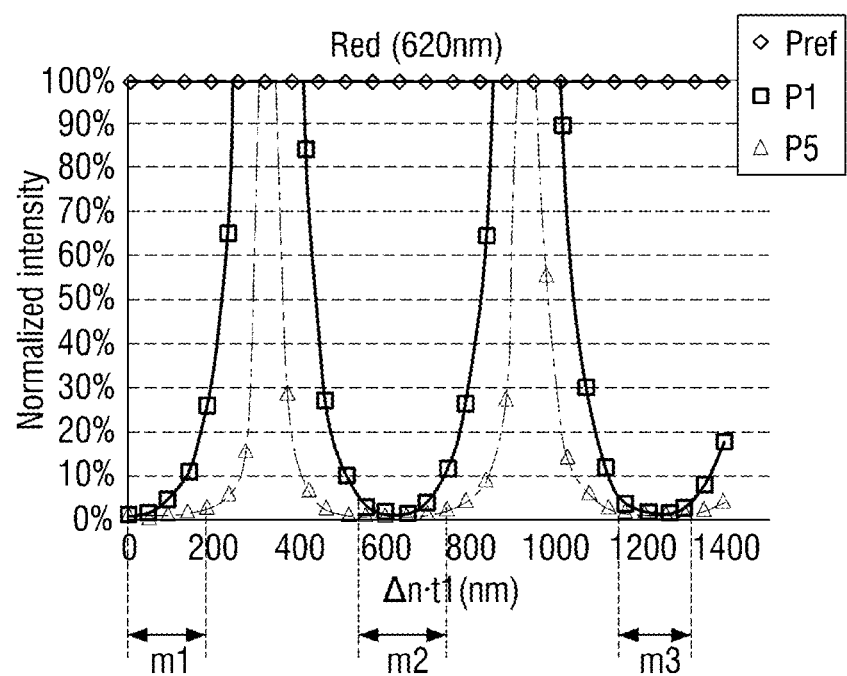
FIG. 14C is a graph showing the normalized luminance in accordance with Δn $t_1$ when the first organic light-emitting element emits red light.

FIG. 13A is a graph showing the variation of the luminances of the reference emission pattern Pref and the first and fifth duplicated emission patterns P1 and P5 in accordance with $\Delta n \, t_1$ when the first organic light-emitting element 141 emits blue light. FIG. 13B is a graph showing the variation of the luminances of the reference emission pattern Pref and the first and fifth duplicated emission patterns P1 and P5 in accordance with $\Delta n \, t_1$ when the first organic light-emitting element 141 emits green light. FIG. 13C is a graph showing the variation of the luminances of the reference emission pattern Pref and the first and fifth duplicated emission patterns P1 and P5 in accordance with $\Delta n \, t_1$ when the first organic light-emitting element 141 emits red light. FIGS. 14A through 14C are graphs obtained from the graphs of FIGS. 12A through 12C, respectively, by normalizing the luminances of the first and fifth duplicated emission patterns P1 and P5 with respect to the luminance of the reference emission pattern Pref.

Referring to FIGS. 13A through 13C, as $\Delta n \, t_1$ increases, the luminance of the reference emission pattern Pref repeatedly increases and decreases. The variation of the luminance of the reference emission pattern Pref in accordance with $\Delta n \, t_1$ may generally form a sine curve.

Referring to FIGS. 14A through 14C, which are graphs obtained by normalizing the luminances of the first and fifth duplicated emission patterns P1 and P5 with respect to the luminance of the reference emission pattern Pref, as $\Delta n \, t_1$ increases, the luminances of the first and fifth duplicated emission patterns P1 and P5 repeatedly increase and decrease. That is, the variation of the luminances of the first and fifth duplicated emission patterns P1 and P5 in accordance with $\Delta n \, t_1$ may generally form a sine curve.

Referring to FIG. 14C, in sections m1 through m3, the luminances of the first and fifth duplicated emission patterns P1 and P5 are both less than or equal to about 3% of the luminance of the reference emission pattern Pref. That is, the sections m1 through m3 fall within the range of A of Equation (2). Accordingly, $\Delta n \, t_1$ falls within an entire range except for the range of A of Equation (2).

For example, the section m2 of FIG. 14C shows the range of A when m=1. Since $\lambda=620$ (nm), Equation (2) may be represented as follows:

$$(1*620 \text{ nm})-60 \text{ (nm)} \leq A \leq (1*620 \text{ nm})+60 \text{ (nm)} => 560 \text{ nm} \leq A \leq 680 \text{ nm} \qquad \text{Equation (2)}$$

Referring to FIG. 14C, in the above range of A, i.e., in the range of 560 nm to 680 nm, the luminances of the first and fifth duplicated emission patterns P1 and P5 are both less than or equal to about 3% of the luminance of the reference emission pattern Pref.

Accordingly, when $\Delta n\ t_1$ falls beyond the range of A of Equation (2), the luminance of at least one of the first and fifth duplicated emission patterns P1 and P5 may become greater than or equal to about 3% of the luminance of the reference emission pattern Pref.

That is, the first period DP1 and the first length d1 of the diffraction patterns 210 may satisfy Equation (1), and the first thickness $t_1$ and the refractive index of the diffraction patterns 210 and the refractive index of the first passivation layer 220 may satisfy Equation (2).

As a result, the luminance of at least one of the first through eighth duplicated emission patterns P1 through P8 may become greater than or equal to about 3% of the luminance of the reference emission pattern Pref.

The first period DP1 and the first length d1 are not particularly limited as long as they satisfy Equation (1). In one exemplary embodiment, the first period DP1 may be about 3.5 um to 20 um. In this exemplary embodiment, the first length d1 may be about 1.4 um to 20 um.

Also, the first thickness $t_1$, the refractive index n1, and the refractive index n2 are not particularly limited as long as they satisfy Equation (2). In one exemplary embodiment, $\Delta n$ may be about 0.4, and the first thickness $t_1$ may be about 500 nm to 650 nm.

Referring to FIGS. 11A through 11C, when d1/DP1 is about 0.45 to 1, the luminances of the first and fifth duplicated emission patterns P1 and P5 are both greater than or equal to about 3% of the luminance of the reference emission pattern Pref.

That is, if d1/DP1 falls within the range of 0.45 to 1 and $\Delta n\ t_1$ falls beyond the range of A of Equation (2), the luminances of the first and fifth duplicated emission patterns P1 and P5 may both be greater than or equal to about 3% of the luminance of the reference emission pattern Pref, which means that the luminances of the first through eighth duplicated emission patterns P1 through P8 may all be greater than or equal to about 3% of the luminance of the reference emission pattern Pref.

The relationship between effective light-emitting area ratio and the first diffraction distance β1 will hereinafter be described.

Table 1 below shows that as the first diffraction distance β1 increases, effective light-emitting area ratio generally increases. The first diffraction distance β1 is defined as the shortest distance between the reference emission pattern Pref and the first through eighth duplicated emission patterns P1 through P8 of FIG. 8. For example, the first diffraction distance β1 may be defined as the distance between the reference emission pattern Pref and the first duplicated emission pattern P1.

TABLE 1

| β1 (um) | Effective Light-Emitting Area Ratio (%) | | |
|---|---|---|---|
| | Red (R) | Green (G) | Blue (B) |
| 0.0 | 5.8 | 6.6 | 6.9 |
| 2.4 | 13.4 | 19.1 | 14.8 |
| 4.8 | 19.5 | 32.1 | 27.7 |
| 7.2 | 24.7 | 48.6 | 39.0 |
| 9.6 | 47.8 | 82.6 | 61.1 |
| 12.1 | 74.4 | 93.9 | 83.8 |
| 14.5 | 77.1 | 86.6 | 89.0 |

TABLE 1-continued

| β1 (um) | Effective Light-Emitting Area Ratio (%) | | |
|---|---|---|---|
| | Red (R) | Green (G) | Blue (B) |
| 16.9 | 79.5 | 97.9 | 93.8 |
| 19.3 | 89.1 | 85.6 | 96.5 |

That is, effective light-emitting area ratio may be affected by the first diffraction distance β1. Factors that affect the first diffraction distance β1 will hereinafter be described with reference to FIG. 15.

Figure 15:
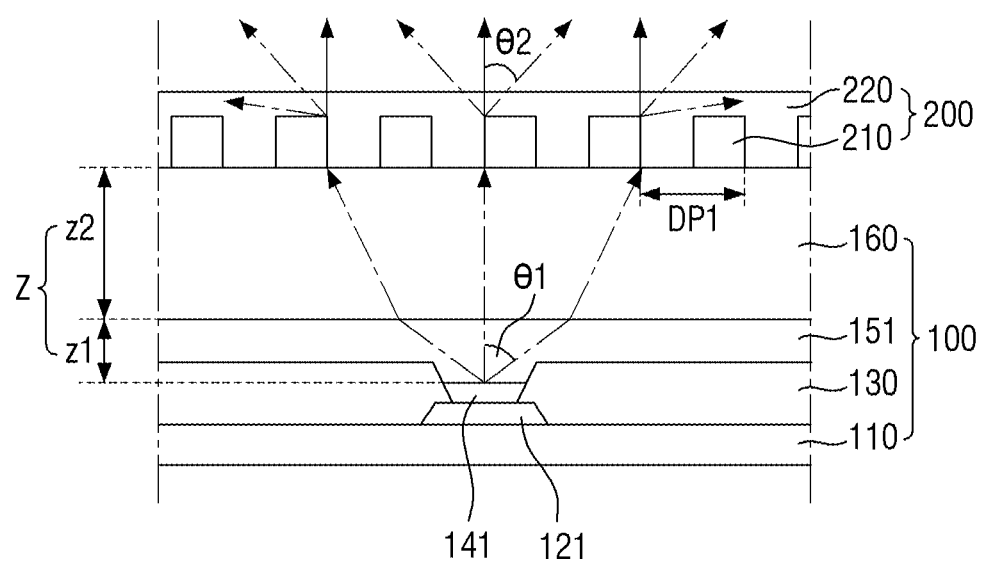
FIG. 15 is a cross-sectional view showing factors that affect a first diffraction distance.

FIG. 15 is a cross-sectional view showing factors that affect a first diffraction distance.

Referring to FIG. 15, the first diffraction distance β1 may be determined by the color of light emitted from the first organic light-emitting element 141, a distance Z between the diffraction pattern layer 200 and the organic light-emitting elements 140, the refractive indexes of elements disposed between the diffraction pattern layer 200 and the first organic light-emitting element 141, i.e., a refractive index nEN of the first encapsulation layer 160 and a refractive index n151 of the first buffer layer 151, the first period DP1 of the diffraction patterns 210, and the first and second diffraction angles θ1 and θ2. As mentioned above, if the first buffer layer 151 is an air layer, the refractive index n151 of the first buffer layer 151 may be the same as the refractive index of an air layer (i.e., about 1).

Specifically, the first diffraction distance β1 may be represented by Equation (3):

$$\beta1 = z1 \cdot \tan\theta1 + z2 \cdot \tan\theta2 \quad \text{(Equation 3)}$$

Referring to Equation (3), the distance Z between the first organic light-emitting element 141 and the diffraction pattern layer 200 is defined as the sum of distances z1 and z2. The distance z1 denotes the shortest distance between the first organic light-emitting element 141 and the first encapsulation layer 160, and the distance z2 denotes the shortest distance between the first buffer layer 151 and the diffraction pattern layer 200. That is, the distance z2 may be defined as the thickness of the first encapsulation layer 160. As mentioned above, referring to Equation (3), θ1 and θ2 denote the first and second diffraction angles, respectively.

The first diffraction angle θ1 may be represented by Equation (4):

$$\theta1 = \sin^{-1}\left(\frac{\lambda}{DP1} \cdot \frac{1}{n151}\right) \quad \text{Equation (4)}$$

where λ denotes the wavelength of light emitted from the first organic light-emitting element 141.

The second diffraction angle θ2 may be represented by Equation (5):

$$\theta2 = \sin^{-1}\left(\frac{\lambda}{DP1} \cdot \frac{1}{nEN}\right) \quad \text{Equation (5)}$$

where λ denotes the wavelength of light emitted from the first organic light-emitting element 141.

That is, the first diffraction angle θ1 may be determined by the first period DP1 and the refractive index n151 of the first buffer layer 151, and the second diffraction angle θ2 may be determined by the first period DP1 and the refractive index nEN of the first encapsulation layer 160.

The first diffraction distance β1 may be represented by Equation (6), which is obtained by substituting Equations (4) and (5) into Equation (3):

$$\beta1 = z1 \cdot \tan\left[\sin^{-1}\left(\frac{\lambda}{DP1} \cdot \frac{1}{n151}\right)\right] + z2 \cdot \tan\left[\sin^{-1}\left(\frac{\lambda}{DP1} \cdot \frac{1}{nEN}\right)\right] \quad \text{Equation (6)}$$

In one exemplary embodiment, if an additional element is provided between the first encapsulation layer 160 and the first organic light-emitting element 141 to replace the first buffer layer 151, the refractive index n151 of Equation (6) may be replaced with the refractive index of the additional element. In another exemplary embodiment, if the first buffer layer 151 is not provided and instead, there exists an air layer between the first encapsulation layer 160 and the first organic light-emitting element 141, the refractive index n151 of Equation (6) may be replaced with the refractive index of an air layer (i.e., about 1).

In still another exemplary embodiment, if the first buffer layer 151 is negligibly thin, the distance Z between the first organic light-emitting element 141 and the diffraction pattern layer 200 may be defined as the thickness of the first encapsulation layer 160. In this exemplary embodiment, a diffraction distance β' may be represented by Equation (7):

$$\beta' = z2 \cdot \tan\left[\sin^{-1}\left(\frac{\lambda}{DP1} \cdot \frac{1}{nEN}\right)\right] \quad \text{Equation (7)}$$

That is, the first diffraction distance β1 may be controlled by controlling the color of light emitted from the first organic light-emitting element 141, the distance Z between the diffraction pattern layer 200 and the first organic light-emitting element 141, the refractive index nEN of the first encapsulation layer 160, the first period DP1 of the diffraction patterns 210, and the first and second diffraction angles θ1 and θ2.

As mentioned above, effective light-emitting area ratio generally increases in accordance with the first diffraction distance β1. However, if the first diffraction distance β1 increases by an excessive amount, blurring may occur. Blurring refers to a phenomenon in which an image becomes blurry due to the colors of adjacent pixels overlapping with one another. Accordingly, in order to strike a balance between an increase in effective light-emitting area ratio and the degree of blurring, the first diffraction distance β1 needs to be determined appropriately.

Effective light-emitting area ratio and the degree of blurring may also be affected by the distance between pixels.

For example, in a case where two organic light-emitting display devices having different pixel arrangements have the same diffraction distance, the two organic light-emitting display devices may differ from each other in terms of the distance between pixels because of their different pixel arrangements. As a result, the two organic light-emitting display devices may have different effective light-emitting area ratios and different degrees of blurring.

That is, for the balance between effective light-emitting area ratio and the degree of blurring, not only the first diffraction distance β1, but also the distance between pixels, needs to be considered.

The distance between pixels will hereinafter be described with reference to FIG. 16.

Figure 16:
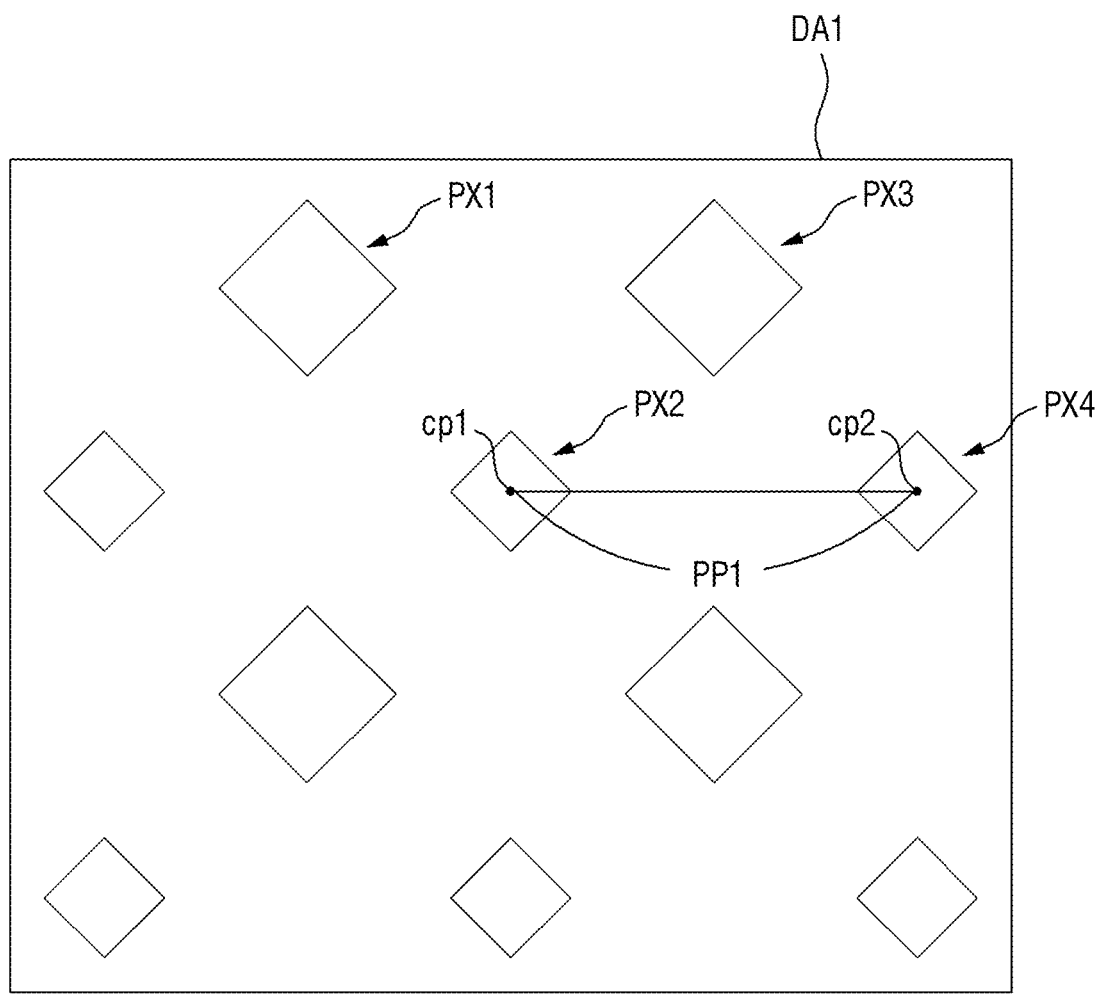
FIG. 16 is a plan view illustrating the arrangement of pixel units included in the display panel of FIG. 2.

FIG. 16 is a plan view illustrating the arrangement of pixel units included in the display panel of FIG. 2. FIG. 16 illustrates first through fourth pixel units PX1 through PX4, but the first pixel unit PX1 of FIG. 16 is not necessarily the same as the first pixel unit PX1 of FIG. 2.

The arrangement of the first through fourth pixel units PX1 through PX4 will hereinafter be described with reference to FIG. 16. Referring to FIG. 16, the first pixel unit PX1 may be disposed to be adjacent to the third pixel unit PX3 in a first direction X. The second pixel unit PX2 may be disposed to be adjacent to the fourth pixel unit PX4 in the first direction X. The first pixel unit PX1 may be disposed to be adjacent to the second pixel unit PX2 in a diagonal direction with respect to the first direction X or a second direction Y. The third pixel unit PX3 may be disposed to be adjacent to the fourth pixel unit PX4 in the second direction Y. That is, the first through fourth pixel units PX1 through PX4 may be arranged in a parallelogram shape. The expression "first and second elements are adjacent to each other", as used herein, means that there are no intervening elements of the same kind as the first and second elements between the first and second elements.

The first through fourth pixel units PX1 through PX4 are illustrated in FIG. 16 as being rhombic, but the shape and the size of the first through fourth pixel units PX1 through PX4 are not particularly limited.

The first pixel unit PX1 may display, for example, a red color. That is, the first pixel PX1 may include a red organic light-emitting layer, which emits red light. The second and fourth pixel units PX2 and PX4 may display, for example, a green color. That is, the second and fourth pixels PX2 and PX4 may include a green organic light-emitting layer, which emits green light. The third pixel unit PX3 may display, for example, a blue color. That is, the third pixel PX3 may include a blue organic light-emitting layer, which emits blue light.

The first through fourth pixel units PX1 through PX4 may form a single pixel unit together. That is, the first through fourth pixel units PX1 through PX4 may be arranged in a pixel area DA1 in an RGBG PenTile™ configuration. However, the arrangement of a plurality of pixel units in a pixel area DA is not particularly limited. That is, the arrangement of the plurality of pixel units in the pixel area DA may vary depending on the colors displayed by the plurality of pixel units and the resolution and the aperture ratio of an organic light-emitting display to which the plurality of pixel units are applied.

A distance PP1 between pixels is defined as the distance between pixel units displaying the same color. Specifically, the distance PP1 is defined as the distance between the centers of pixel electrodes included in pixel units displaying the same color. The distance PP1 will hereinafter be described, taking the second and fourth pixel units PX2 and PX4.

The distance PP1 may be defined as the shortest distance between a first central point cp1 within the second pixel unit PX2 and a second central point cp2 within the fourth pixel unit PX4. In one exemplary embodiment, the first and second central points cp1 and cp2 may be the centers of pixel electrodes included in the second and fourth pixel units PX2 and PX4.

The relationship between the first diffraction distance β1, the distance PP1, and effective light-emitting area ratio will hereinafter be described. Table 2 below shows effective light-emitting area ratios for different values of β1/PP1.

TABLE 2

| β1/PP1 | Effective Light-Emitting Area Ratio (%) | | |
|---|---|---|---|
| | Red (R) | Green (G) | Blue (B) |
| 0.00 | 5.8 | 6.6 | 6.9 |
| 0.05 | 13.4 | 19.1 | 14.8 |
| 0.10 | 19.5 | 32.1 | 27.7 |
| 0.15 | 24.7 | 48.6 | 39.0 |
| 0.21 | 47.8 | 82.6 | 61.1 |
| 0.26 | 74.4 | 93.9 | 83.8 |
| 0.31 | 77.1 | 86.6 | 89.0 |
| 0.36 | 79.5 | 97.9 | 93.8 |
| 0.41 | 89.1 | 85.6 | 96.5 |

Referring to Table 2, effective light-emitting area ratio generally increases in accordance with β1/PP1.

The relationship between the first diffraction distance β1, the distance PP1, and blurring will hereinafter be described with reference to Table 3. Table 3 below shows blurring recognition scores for different β1/PP1 values. Blurring recognition scores are average scores obtained by testing multiple users' recognition of blurring while changing β1/PP1. A blurring recognition score of 5 or higher corresponds to a case where users feel uncomfortable watching a screen due to blurring.

TABLE 3

| β1/PP1 | Blurring Recognition Score (out of 10) |
|---|---|
| 0.2 | 1.3 |
| 0.45 | 1.2 |
| 0.89 | 2.4 |
| 1.33 | 4.0 |
| 1.89 | 5.1 |
| 2.26 | 6.4 |

Referring to Table 3, when β1/PP1 is about 1.89 or greater, the blurring recognition score becomes 5 or higher. This means that when β1/PP1 is about 1.89 or greater, most users recognize blurring and thus feel uncomfortable.

According to Tables 2 and 3 above, β1/PP1 may satisfy Equation (8):

$$0.1 \leq \beta1/PP1 \leq 1.9 \qquad \text{Equation (8)}$$

That is, β1/PP1 may be within the range of 0.1 to 1.9 for the balance between effective light-emitting area ratio and the visibility of blurring. As a result, emission efficiency can be improved by increasing effective light-emitting area ratio without causing inconvenience in connection with blurring.

The first diffraction distance β1 and the distance PP1 are not particularly limited as long as β1/PP1 falls within the range of 0.1 to 1.9. In one exemplary embodiment, the shortest distance z2 between the first buffer layer 151 and the diffraction pattern layer 200, i.e., the thickness of the first encapsulation layer 160, and the first period DP1 may have values as shown in Table 4 below.

TABLE 4

| case | z2 (mm) | DP1 (um) |
|---|---|---|
| 1 | 0.2 | 0.88-15.3 |
| 2 | 0.3 | 1.24-22.7 |
| 3 | 0.5 | 2-37.4 |

The input sensing layer 300, which is disposed on the diffraction pattern layer 200, will hereinafter be described with reference to FIGS. 17 through 28. FIGS. 17 through 28 illustrate only the display panel 100, the diffraction pattern layer 200, and the input sensing layer 300 to better focus on the relationship between the diffraction pattern layer 200 and the input sensing layer 300, but actually, the anti-reflection panel 400 or an additional passivation layer may be disposed between the display panel 100, the diffraction pattern layer 200, and the input sensing layer 300. This will be described later in detail.

Figure 17:
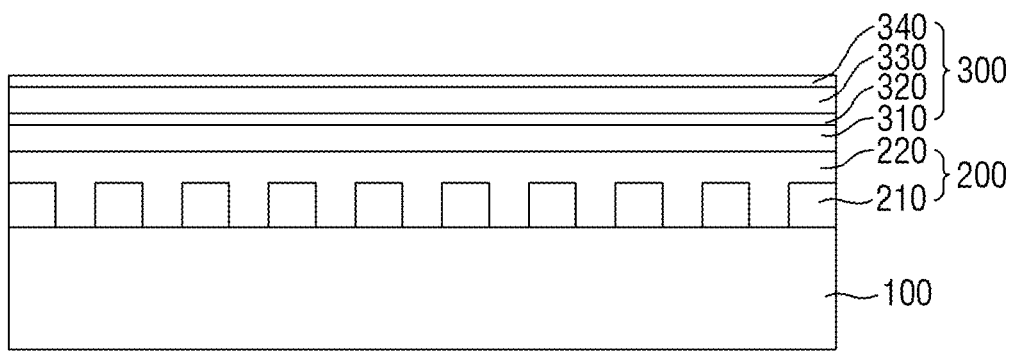
FIG. 17 is a cross-sectional view illustrating an input sensing layer according to an exemplary embodiment of the inventive concept.

FIG. 17 is a cross-sectional view of an input sensing layer according to an exemplary embodiment of the inventive concept. As already mentioned above, an input sensing layer 300 is disposed on the diffraction pattern layer 200 in the form of a "layer", and thus, the thickness of the display device of FIG. 1 can be reduced due to the omission of a base layer.

Referring to FIG. 17, the input sensing layer 300 may include a first conductive layer 310, a first insulating layer 320, a second conductive layer 330, and a second insulating layer 340. In one exemplary embodiment, the first and second conductive layers 310 and 330 may have a single-layer structure. In one exemplary embodiment, each of the first and second conductive layers 310 and 330 may include a metal layer or a transparent conductive layer. The metal layer may comprise molybdenum (Mo), Ag, titanium (Ti), Cu, Al, or an alloy thereof. The transparent conductive layer may comprise a transparent conductive oxide such as ITO, IZO, ZnO, or ITZO. Alternatively, the transparent conductive layer may comprise a conductive polymer such as poly(3,4-ethylenedioxythiophene) (PEDOT), metal nanowires, or graphene.

In another exemplary embodiment, referring to FIG. 17, the first and second conductive layers 310 and 330 may have a multiple layer structure along a vertical direction. In this exemplary embodiment, each of the first and second conductive layers 310 and 330 may include a multilayer metal layer. In one exemplary embodiment, the multilayer metal layer may have a three-layer structure of Ti/Al/Ti. The multilayer metal layer may include at least one metal layer and at least one transparent conductive layer.

Each of the first and second conductive layers 310 and 330 includes a plurality of patterns. The first conductive layer 310 will hereinafter be described as including a plurality of first conductive patterns, and the second conductive layer 330 will hereinafter be described as including a plurality of second conductive patterns. Each of the first conductive patterns and the second conductive patterns may include a plurality of sensing electrodes and a plurality of signal lines.

The first and second insulating layers 320 and 340 may have a single- or multilayer structure. Each of the first and second insulating layers 320 and 340 may comprise an inorganic material, an organic material, or a composite material. In one exemplary embodiment, at least one of the first and second insulating layers 320 and 340 may include an inorganic film. The inorganic film may comprise at least one of aluminum oxide, titanium oxide, silicon oxide silicon oxynitride, zirconium oxide, and hafnium oxide.

In another exemplary embodiment, at least one of the first and second insulating layers 320 and 340 may include an organic film. The organic film may comprise at least one of an acrylic resin, a methacrylic resin, polyisoprene, a vinyl resin, an epoxy resin, a urethane resin, a cellulose resin, a siloxane resin, a PI resin, a polyamide (PA) resin, and a perylene resin.

Figure 18:
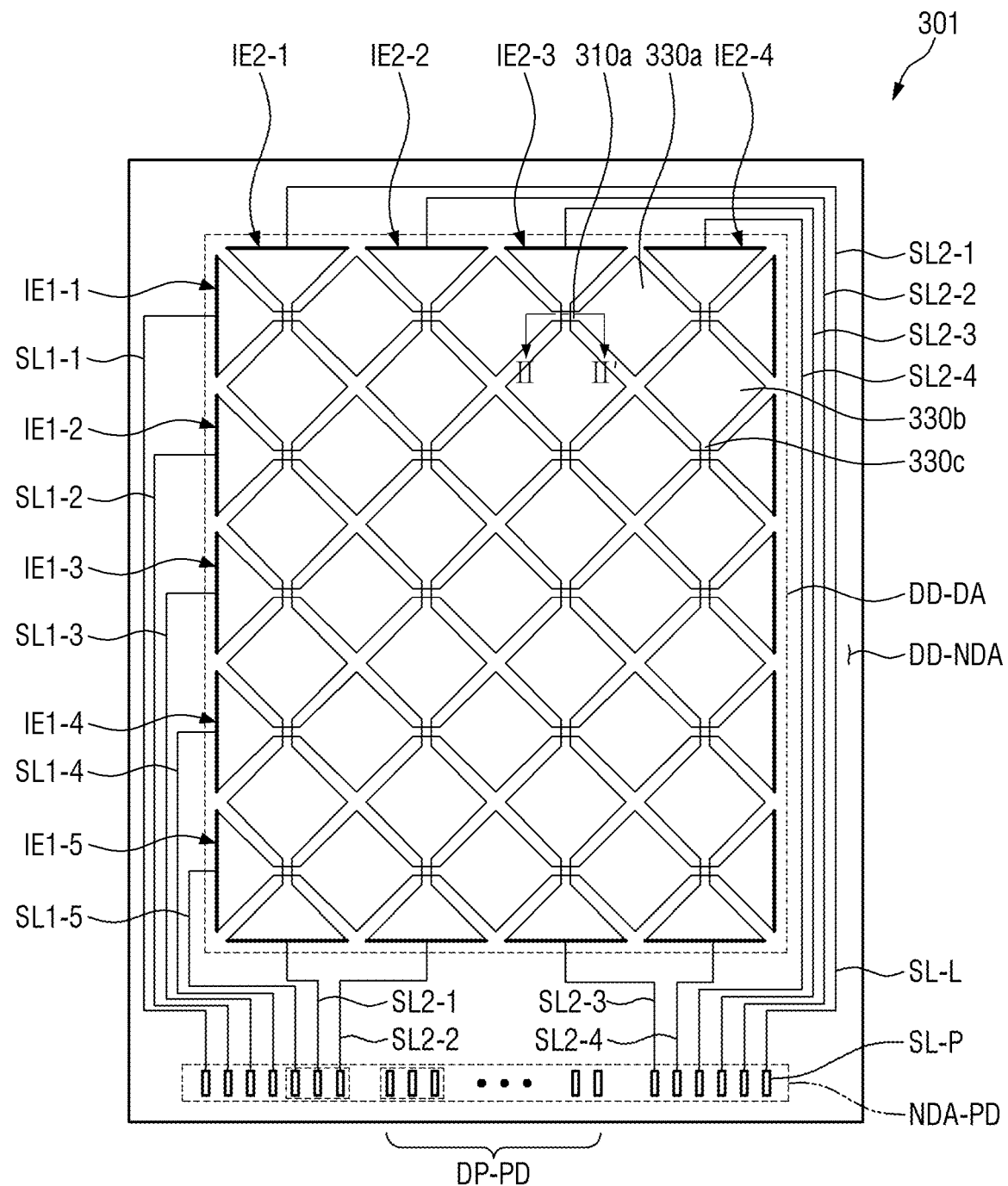
FIG. 18 is a plan view of the input sensing layer of FIG. 17.

FIG. 18 is a plan view of the input sensing layer of FIG. 17. The input sensing layer of FIG. 18 will hereinafter be described as a first input sensing layer 301.

Referring to FIG. 18, the first input sensing layer 301 may include a plurality of first sensing electrodes IE1-1 through IE1-5, a plurality of first signal lines SL1-1 through SL1-5, a plurality of second sensing electrodes IE2-1 through IE2-4, and a plurality of second signal lines SL2-1 through SL2-4.

The first sensing electrodes IE1-1 through IE1-5 and the second sensing electrodes IE2-1 through IE2-4 may be disposed on a display area DD-DA. The first signal lines SL1-1 through SL1-5 and the second signal lines SL2-1 through SL2-4 may be disposed on a non-display area DD-NDA. The display area DD-DA is defined as an area in which an image is displayed. The non-display area DD-NDA is provided on the outside of the display area DD-DA and is defined as an area in which no image is displayed.

The stack structures and the materials of the first sensing electrodes IE1-1 through IE1-5 and the second sensing electrodes IE2-1 through IE2-4 may be determined in consideration of sensing sensitivity. Sensing sensitivity may be affected by a resistive-capacitive (RC) delay.

For example, a plurality of sensing electrodes including a metal layer have a lower resistance than a transparent conductive layer and thus have a smaller RC value. Accordingly, the amount of time that it takes to charge a capacitor defined between the plurality of sensing electrodes including the metal layer can be reduced. On the other hand, a plurality of sensing electrodes including a transparent conductive layer have a relatively large RC value. Accordingly, the plurality of sensing electrodes including the transparent conductive layer are less likely to be viewed by a user and are capable of increasing an input area and thereby increasing capacitance. The plurality of sensing electrodes including the metal layer may be formed to have, for example, a mesh shape, in order not to be viewable to a user.

The first sensing electrodes 1E1-1 through 1E1-5 and the second sensing electrodes 1E2-1 through 1E2-4 may intersect each other. In one exemplary embodiment, the first sensing electrodes IE1-1 through 1E1-5 and the second sensing electrodes 1E2-1 through 1E2-4 may sense an external input in a mutual cap manner and/or a self-cap manner. In another exemplary embodiment, the first sensing electrodes 1E1-1 through 1E1-5 and the second sensing electrodes 1E2-1 through 1E2-4 may calculate the coordinates of an external input in the mutual cap manner and may recalculate the coordinates of the external input in the self-cap manner.

Each of the first sensing electrodes 1E1-1 through 1E1-5 may include a plurality of first connecting portions 310a and a plurality of first sensing portions 330a. Each of the second sensing electrodes IE2-1 through IE2-5 may include a plurality of second sensing portions 330b and a plurality of second connecting portions 330c.

In one exemplary embodiment, the first sensing electrodes 1E1-1 through 1E1-5 and the second sensing electrodes IE2-1 through IE2-4 may be rhombic, but the inventive concept is not limited thereto. In another exemplary embodiment, the first sensing electrodes 1E1-1 through 1E1-5 and the second sensing electrodes IE2-1 through IE2-4 may be polygonal or may be in a shape (for example, a bar shape) having no distinction between sensing portions and connecting portions.

Each of the first connecting portions 310a may connect a pair of adjacent first sensing portions 330a. Each of the second connecting portions 330c may connect a pair of adjacent second sensing portions 330b.

In one exemplary embodiment, the first signal lines SL1-1 through SL1-5 may be connected to first ends of the first sensing electrodes 1E1-1 through 1E1-5. In another exemplary embodiments, the first signal lines SL1-1 through SL1-5 may be connected to both the first ends and second ends of the first sensing electrodes IE1-1 through IE1-5.

In one exemplary embodiment, the second signal lines SL2-1 through SL2-5 may be connected to first ends and second ends of the second sensing electrodes IE2-1 through IE2-5. Accordingly, the display device of FIG. 1 can have an improved sensing sensitivity, as compared to a display device having a first input sensing layer in which a plurality of second signal lines are connected to only first ends of a plurality of second sensing electrodes. Specifically, since the second sensing electrodes IE2-1 through IE2-4 are longer than the first sensing electrodes IE1-1 through IE1-5, a voltage drop in a detection signal (or a transmission signal) may occur, and as a result, sensing sensitivity may decrease. On the other hand, in the display device of FIG. 1, a detection signal (or a transmission signal) is provided via the second signal lines SL2-1 through SL2-4, which are connected to both the first ends and the second ends of the second sensing electrodes IE2-1 through IE2-4, a voltage drop in the detection signal (or the transmission signal) can be prevented, and as a result, a decrease in sensing sensitivity can be prevented.

In another exemplary embodiment, the second signal lines SL2-1 through SL2-4 may be connected only to the first ends of the second sensing electrodes IE2-1 through IE2-4.

Each of the first signal lines SL1-1 through SL1-5 and the second signal lines SL2-1 through SL2-4 may include a line portion SL-L and a pad portion SL-P. The pad portions SL-P of the first signal lines SL1-1 through SL1-5 and the second signal lines SL2-1 through SL2-4 may be aligned in a pad area NDA-PD. The first input sensing layer 301 may include a plurality of signal pads DP-PD. In one exemplary embodiment, the signal pads DP-PD may be aligned in the pad area NDA-PD.

The first signal lines SL1-1 through SL1-5 and the second signal lines SL2-1 through SL2-4 may be replaced with a circuit board that is fabricated separately and is then coupled to the display device of FIG. 1.

Although not specifically illustrated in FIG. 18, the first input sensing layer 301 may further include an optical dummy electrode disposed in a boundary region between the first sensing electrodes IE1-1 through IE1-5 and the second sensing electrodes IE2-1 through IE2-4.

The cross-sectional arrangement of the first input sensing layer 301 will hereinafter be described with reference to FIGS. 19A, 19B, and 20.

Figure 19A:
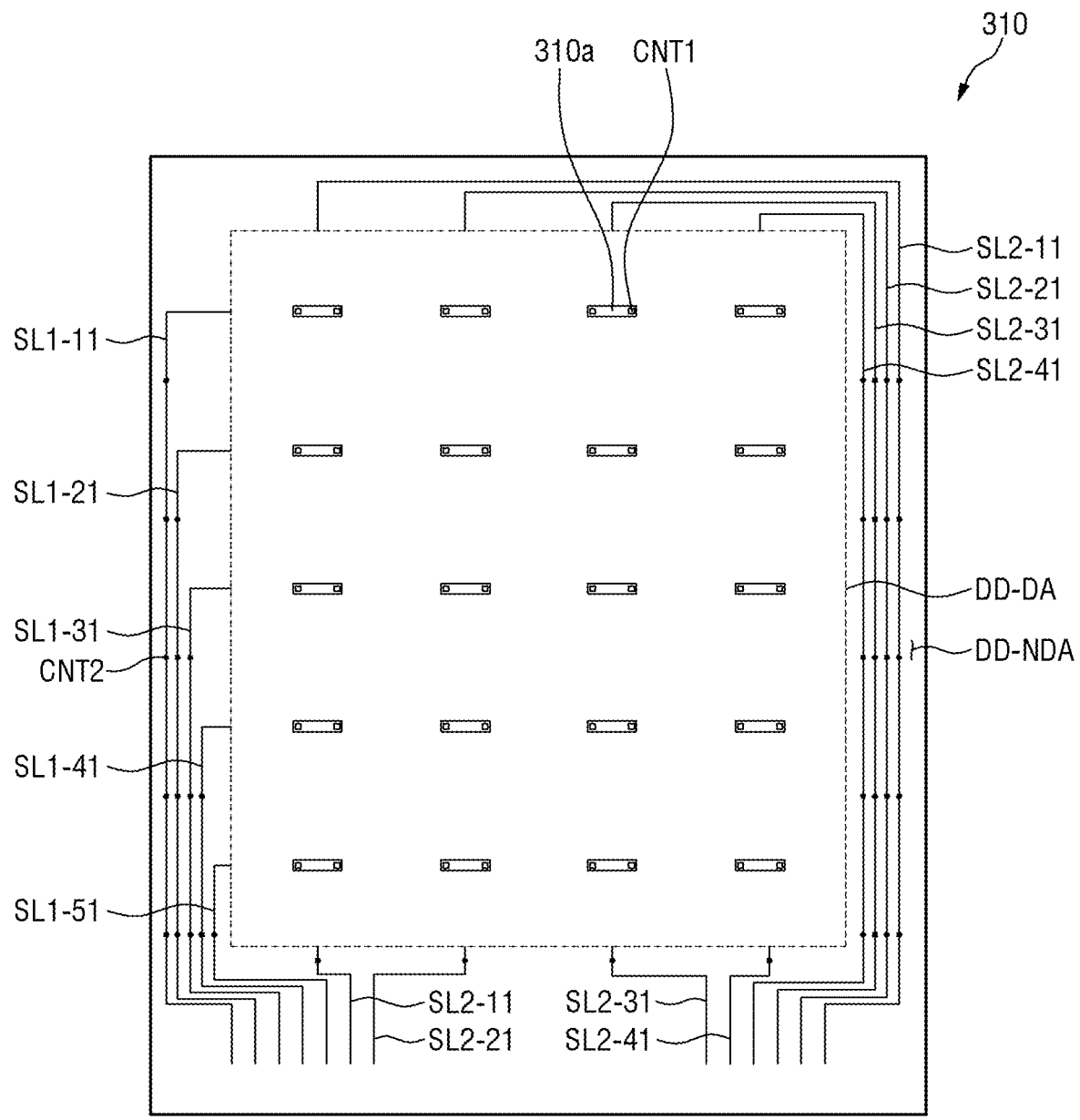
FIG. 19A is a plan view of a first conductive layer of FIG. 17.

FIG. 19A is a plan view of the first conductive layer of FIG. 17. FIG. 19B is a plan view of the second conductive layer of FIG. 17. FIG. 20 is an exemplary cross-sectional view taken along line II-II' of FIG. 18.

Figure 20:
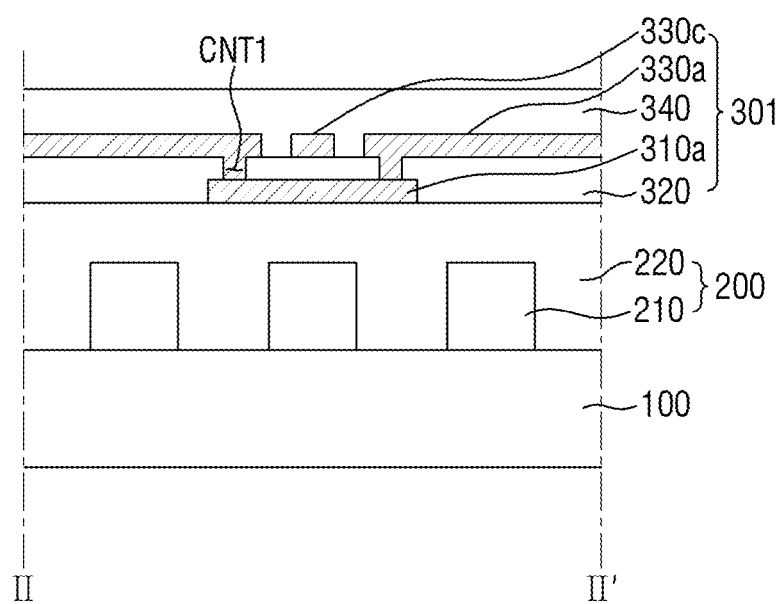
FIG. 20 is an exemplary cross-sectional view taken along line II-II' of FIG. 18.

Referring to FIGS. 19A and 20, the first conductive layer 310 includes the first connecting portions 310a. The first conductive layer 310 may further include first line portions SL1-11 through SL1-51 of the first signal lines SL1-1 through SL1-5 and first line portions SL2-11 through SL2-41 of the second signal lines SL2-1 through SL2-4.

The first connecting portions 310a, the first line portions SL1-11 through SL1-51 of the first signal lines SL1-1 through SL1-5, and the first line portions SL2-11 through SL2-41 of the second signal lines SL2-1 through SL2-4 may be formed by the same process. The first connecting portions 310a, the first line portions SL1-11 through SL1-51 of the first signal lines SL1-1 through SL1-5, and the first line portions SL2-11 through SL2-41 of the second signal lines SL2-1 through SL2-4 may comprise the same material or may have the same stack structure.

The first connecting portions 310a may be formed by a different process from the first line portions SL1-11 through SL1-51 of the first signal lines SL1-1 through SL1-5 and the first line portions SL2-11 through SL2-41 of the second signal lines SL2-1 through SL2-4. The first line portions SL1-11 through SL1-51 of the first signal lines SL1-1 through SL1-5 and the first line portions SL2-11 through SL2-41 of the second signal lines SL2-1 through SL2-4 may have the same stack structure.

In one exemplary embodiment, the first connecting portions 310a may have a different stack structure from the first line portions SL1-11 through SL1-51 of the first signal lines SL1-1 through SL1-5 and the first line portions SL2-11 through SL2-41 of the second signal lines SL2-1 through SL2-4.

In another exemplary embodiment, the first conductive layer 310 may include the second connecting portions 330c. In this exemplary embodiment, the first connecting portions 310a may be formed from the first conductive layer 310. Accordingly, each of the first sensing electrodes IE1-1 through IE1-5 may have one integral body.

The first insulating layer 320 may be formed to cover at least one of the first connecting portions 310a. In one exemplary embodiment, the first insulating layer 320 may at least partially overlap with the display area DD-DA and the non-display area DD-NDA. The first insulating layer 320 may be formed to cover the first line portions SL1-11 through SL1-51 of the first signal lines SL1-1 through SL1-5 and the first line portions SL2-11 through SL2-41 of the second signal lines SL2-1 through SL2-4.

A plurality of first connecting contact holes CNT1 may be formed in the first insulating layer 320 to at least partially expose the first connecting portions 310a. A plurality of second connecting contact holes CNT2 may also be formed in the first insulating layer 320 to at least partially expose the first line portions SL1-11 through SL1-51 of the first signal lines SL1-1 through SL1-5 and the first line portions SL2-11 through SL2-41 of the second signal lines SL2-1 through SL2-4.

Figure 19B:
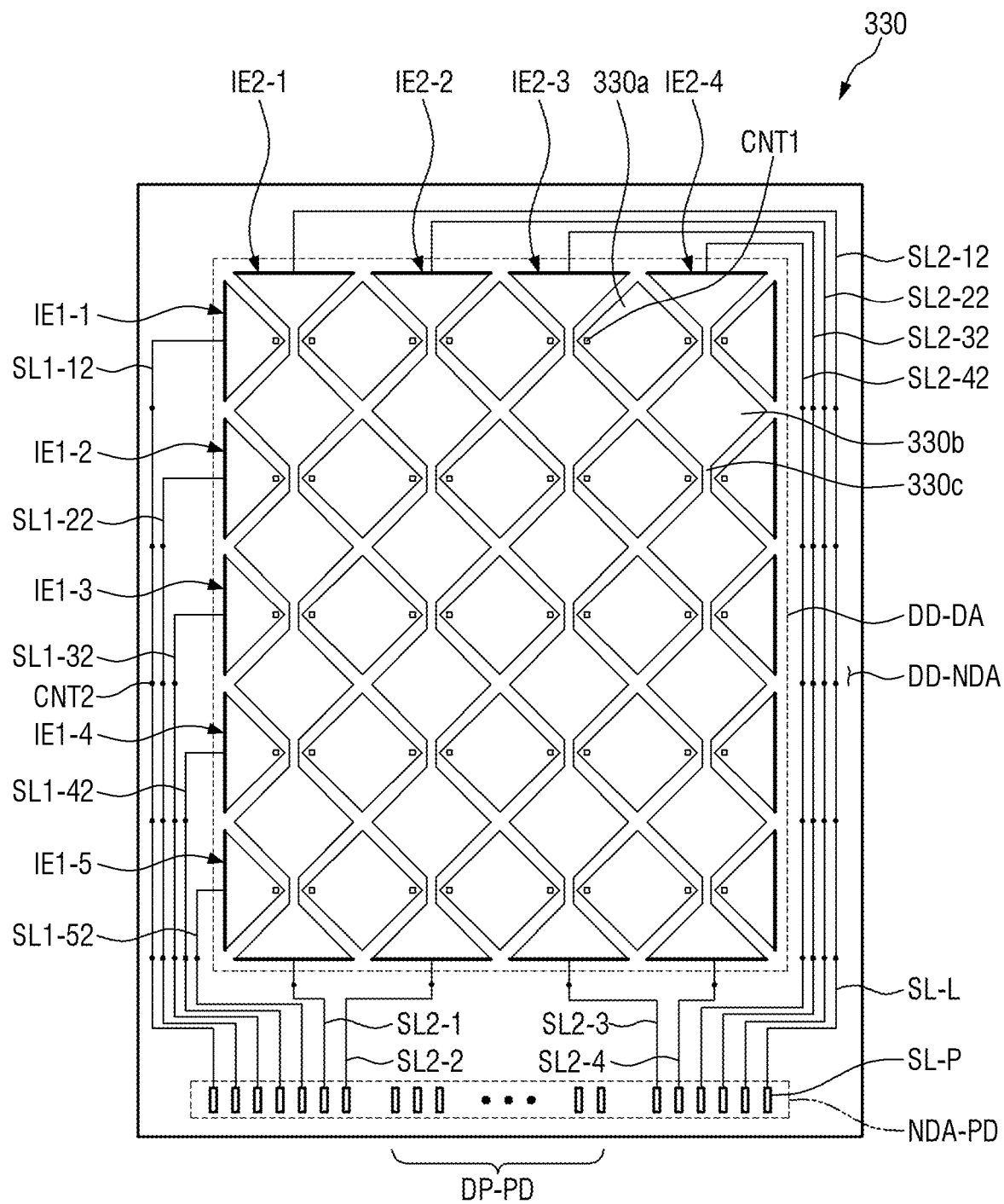
FIG. 19B is a plan view of a second conductive layer of FIG. 17.

Referring to FIGS. 19B and 20, the second conductive layer 330 may include the first sensing portions 330a, the second sensing portions 330b, and the second connecting portions 330c. In one exemplary embodiment, each of the second sensing electrodes IE2-1 through IE2-4 may have one integral body. The first sensing portions 330a are spaced apart from the second sensing electrodes IE2-1 through IE2-4.

The second conductive layer 330 may include second line portions SL1-12 through SL1-52 of the first signal lines SL1-1 through SL1-5, the pad portions SL-P of the first signal lines SL1-1 through SL1-5, second line portions SL2-12 through SL2-42 of the second signal lines SL2-1 through SL2-4, and the pad portions SL-P of the second signal lines SL2-1 through SL2-4. The second conductive layer 330 may further include the signal pads DP-PD.

In one exemplary embodiment, the first sensing portions 330a, the second sensing portions 330b, and the second connecting portions 330c may be formed by the same process. That is, the first sensing portions 330a, the second sensing portions 330b, and the second connecting portions 330c may comprise the same material or may have the same stack structure.

The second line portions SL1-12 through SL1-52 of the first signal lines SL1-1 through SL1-5, the pad portions SL-P of the first signal lines SL1-1 through SL1-5, the second line portions SL2-12 through SL2-42 of the second signal lines SL2-1 through SL2-4, the pad portions SL-P of the second signal lines SL2-1 through SL2-4, and the signal pads DP-PD may be formed by the same process as, or a different process from, the first sensing portions 330a, the second connecting portions 330c, and the second sensing portions 330b.

The second insulating layer 340 may at least partially overlap with the display area DD-DA and the non-display area DD-NDA. The second insulating layer 340 may expose the pad area NDA-PD.

Referring to FIG. 20, the first sensing portions 330a may be electrically connected to the first connecting portions 310a via the first connecting contact holes CNT1. In one exemplary embodiment, the first connecting portions 310a may comprise a material having a lower resistance than the first sensing portions 330a.

The first connecting portions 310a may intersect the second connecting portions 330c. The influence of parasitic capacitance can be reduced by minimizing the width of the first connecting portions 310a (in a plan view). The first connecting portions 310a may comprise a material having low resistance in order to improve sensing sensitivity. In one exemplary embodiment, the first connecting portions 310a may comprise the same metal material as the first line portions SL1-11 through SL1-51 of the first signal lines SL1-1 through SL1-5.

The first insulating layer 320 may be a polymer layer such as, for example, an acrylic polymer layer. The second insulating layer 340 may also be a polymer layer such as, for example, an acrylic polymer layer. Accordingly, even if the first input sensing layer 301 is disposed on the display panel 100, the flexibility of the display device of FIG. 1 can be improved. The first sensing portions 330a and the second sensing portions 330b may be formed to have a mesh shape and may comprise a metal. As a result, the flexibility of the display device of FIG. 1 can be further improved. The first sensing portions 330a and the second sensing portions 330b may be referred to as metal mesh patterns.

Figure 21:
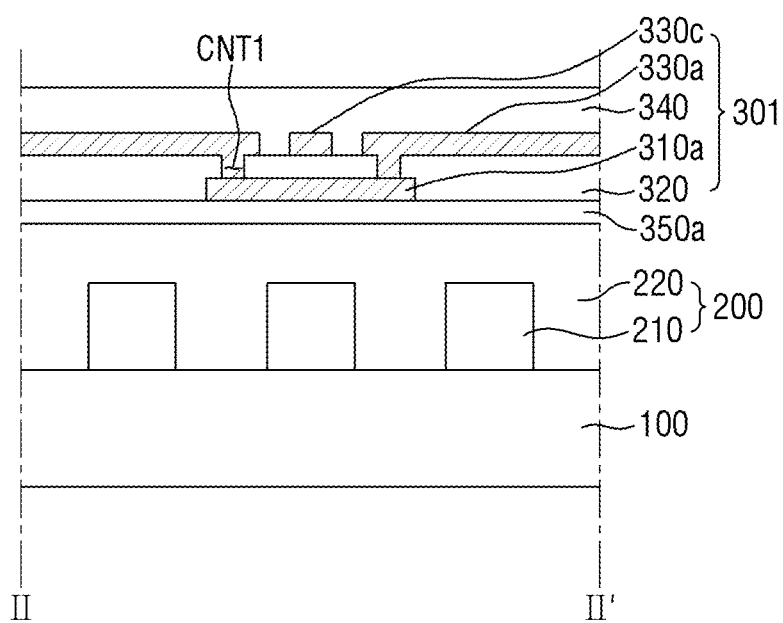
FIG. 21 is another exemplary cross-sectional view taken along line II-II' of FIG. 18.

FIG. 21 is another exemplary cross-sectional view taken along line II-II' of FIG. 18. Descriptions of elements that have already been described above with reference to FIGS. 17 through 20 will be omitted.

Referring to FIG. 21, a second passivation layer 350a may be disposed between the first input sensing layer 301 and the diffraction pattern layer 200. That is, the second passivation layer 350a may be disposed between the diffraction pattern layer 200 and the first input sensing layer 301 to protect the diffraction pattern layer 200. In one exemplary embodiment, the second passivation layer 350a may be formed of an organic film or an inorganic film.

Figure 22:
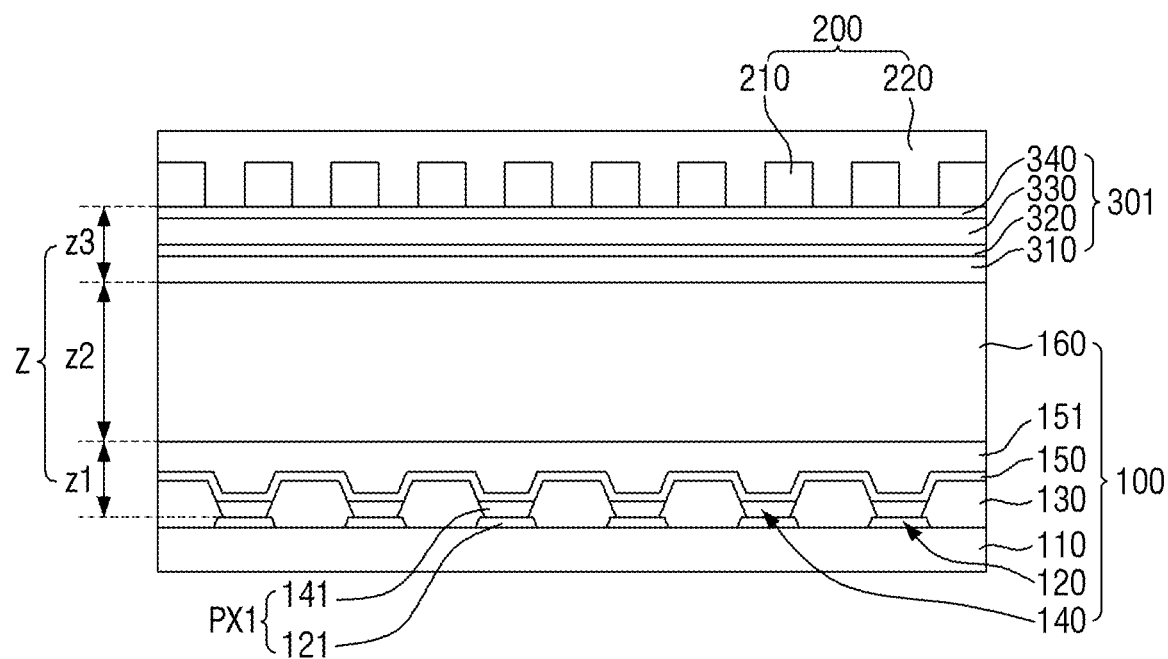
FIG. 22 is a cross-sectional view of a display device including an input sensing layer according to another exemplary embodiment of the inventive concept and a diffraction pattern layer according to another exemplary embodiment of the inventive concept.
Figure 23:
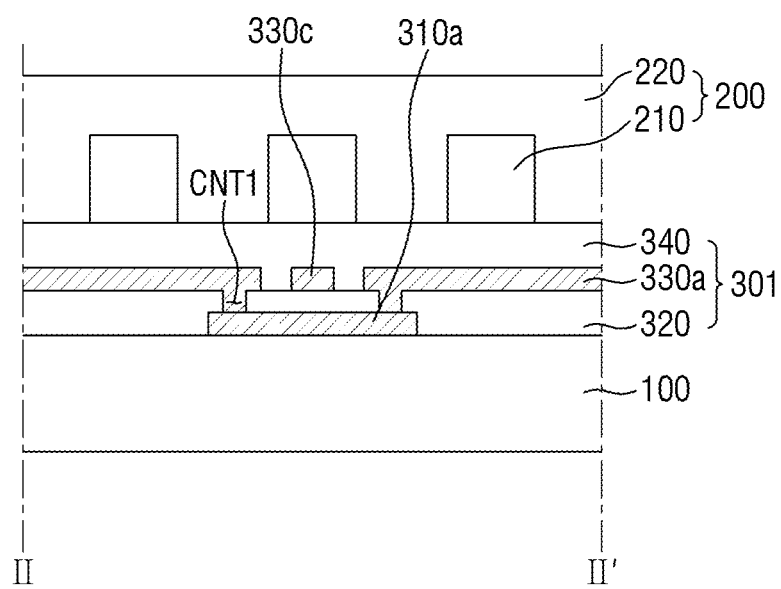
FIG. 23 is a cross-sectional view of the input sensing layer of FIG. 22.

FIG. 22 is a cross-sectional view of a display device including an input sensing layer and a diffraction pattern layer according to another exemplary embodiment of the inventive concept. FIG. 23 is a cross-sectional view of the input sensing layer of FIG. 22. FIG. 23 shows a cross section taken along line II-II' of FIG. 18. Descriptions of elements that have already been described above with reference to FIGS. 17 through 21 will be omitted.

Referring to FIGS. 22 and 23, a first input sensing layer 301 may be disposed on a display panel 100. Also, a diffraction pattern layer 200 may be disposed on the first input sensing layer 301. Specifically, a first conductive layer 310 may be disposed directly on the display panel 100. As described above with reference to FIG. 2, the display panel 100 includes a first encapsulation layer 160. In one exemplary embodiment, the first encapsulation layer 160 may be a transparent insulating substrate. Thus, the input sensing layer 300 may be disposed directly on a transparent insulating substrate.

The diffraction pattern layer 200 may be disposed on the first input sensing layer 301. Specifically, a plurality of diffraction patterns 210 may be disposed on a second insulating layer 340. In one exemplary embodiment, the second insulating layer 340 may perform a planarization function.

As described above with reference to FIG. 8, a first diffraction distance β1 is affected by a distance Z between a first organic light-emitting element 141 and the diffraction patterns 210. When the distance Z between the first organic light-emitting element 141 and the diffraction patterns 210 decreases, a first period DP1 of the diffraction patterns 210 needs to be reduced in order to achieve a predetermined first diffraction distance β1. Since the first period DP1 denotes the distance between the diffraction patterns 210, the shorter the first period DP1, the smaller the distance between the diffraction patterns 210, and as a result, the diffraction patterns 210 may not be able to be properly formed because of too short a distance therebetween.

Accordingly, the distance Z between the first organic light-emitting element 141 and the diffraction patterns 210 needs to be sufficiently secured. Also, in a case where there are additional elements provided between the first organic light-emitting element 141 and the diffraction patterns 210, the thicknesses and the refractive indexes of the additional elements need to be considered.

Referring to FIG. 22, since the diffraction pattern layer 200 is disposed on the first input sensing layer 301, the distance Z between the first organic light-emitting element 141 and the diffraction pattern layer 200 increases, as compared to the display device of FIG. 2. As a result, the first diffraction distance β1 may be varied. The varied first diffraction distance may be defined as a second diffraction distance β2.

The second diffraction distance β2 may be represented by Equation (9):

$$\beta 2 = z1 \cdot \tan\left[\sin^{-1}\left(\frac{\lambda}{DP1} \cdot \frac{1}{n151}\right)\right] + \qquad \text{Equation (9)}$$
$$z2 \cdot \tan\left[\sin^{-1}\left(\frac{\lambda}{DP1} \cdot \frac{1}{nEN}\right)\right] + z3 \cdot \tan\left[\sin^{-1}\left(\frac{\lambda}{DP1} \cdot \frac{1}{n301}\right)\right]$$

Referring to Equation (9), the distance Z between the first organic light-emitting element 141 and the diffraction pattern layer 200 is defined as the sum of distances z1, z2, and z3. The distance z3 may be defined as the thickness of the first input sensing layer 301. Referring to Equation (9), n301 denotes the refractive index of the first input sensing layer 301.

That is, the second diffraction distance β2 may be controlled by controlling the color of light emitted from the first organic light-emitting element 141, the distance Z between the diffraction pattern layer 200 and the first organic light-emitting element 141, a refractive index nEN of the first encapsulation layer 160, and the first period DP1 of the diffraction patterns 210.

The thickness of the first encapsulation layer 160, i.e., the distance z2, may be reduced due to the presence of the first input sensing layer 301 between the first organic light-emitting element 141 and the diffraction pattern layer 200. Accordingly, the thickness of the display panel 100 including the first encapsulation layer 160 may be reduced.

Other examples of the first input sensing layer 301 will hereinafter be described with reference to FIGS. 24 through 29. FIGS. 24 through 29 are cross-sectional views illustrating input sensing layers according to other exemplary embodiments of the inventive concept. Descriptions of elements that have already been described above with reference to FIGS. 1 through 24 will be omitted. FIGS. 24 through 29 are cross-sectional views taken along line II-II' of FIG. 18.

Figure 24:
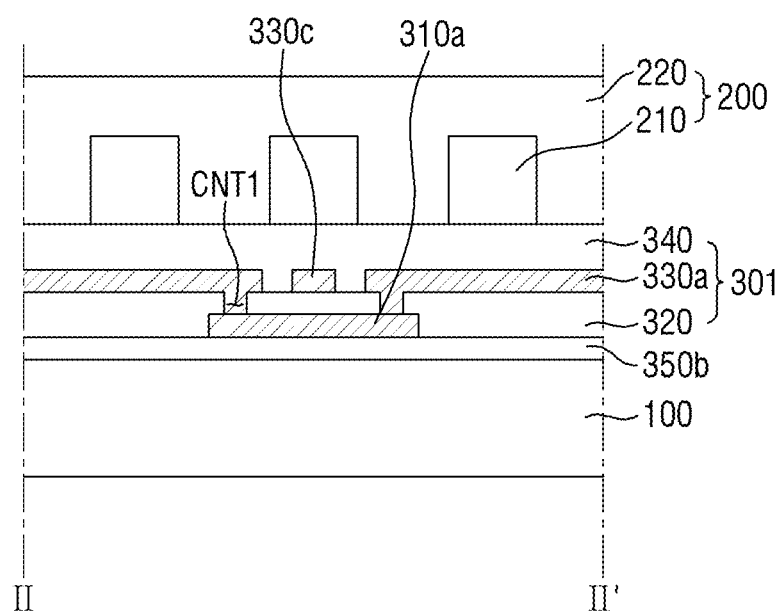
FIG. 24, FIG. 25, FIG. 26, FIG. 27, FIG. 28, and FIG. 29 are cross-sectional views illustrating input sensing layers according to other exemplary embodiments of the inventive concept.

Referring to FIG. 24, a third passivation layer 350b may be disposed between a first input sensing layer 301 and the display panel 100. In one exemplary embodiment, the third passivation layer 350b may be formed of an organic film or an inorganic film.

Although not specifically illustrated in FIGS. 23 and 24, the second passivation layer 350a of FIG. 21 may be additionally provided between the first input sensing layer 301 and the diffraction pattern layer 200.

Figure 25:
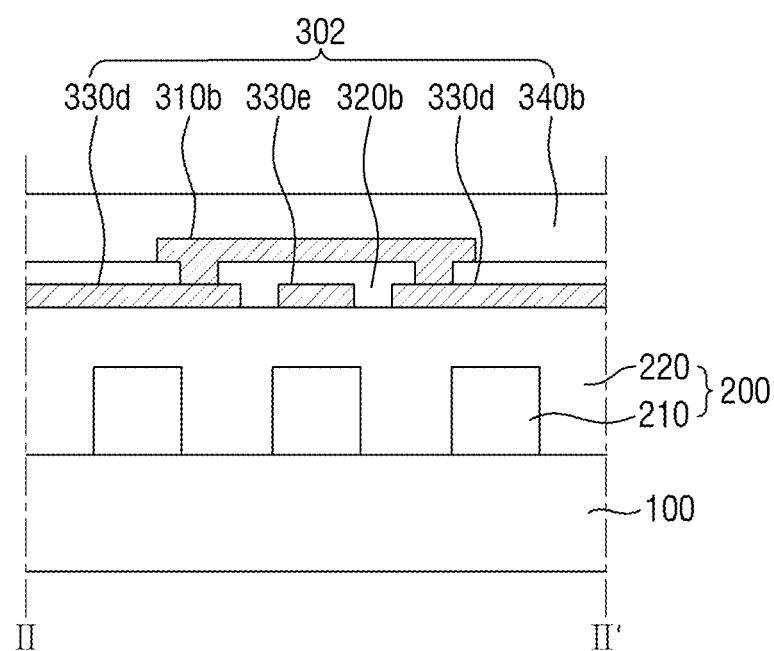

Referring to FIG. 25, a second input sensing layer 302 may include a plurality of first sensing portions 330d and a plurality of second connecting portions 330e, and the first sensing portions 330d and the second connecting portions may be disposed on the same layer. The second input sensing layer 302 may be disposed on a diffraction pattern layer 200.

A first insulating layer 320b may be formed to cover the first sensing portions 330d and the second connecting portions 330e. First connecting portions 310b may be electrically connected to the first sensing portions 330d via contact holes.

That is, the second input sensing layer 302 differs from the first input sensing layer 301 of FIG. 20 in the order in which first and second conductive layers 310 and 330 are stacked. That is, the first sensing portions 330d and the second connecting portions 330e may be disposed below the first connecting portions 310b. A plurality of pad portions SL-P of a plurality of first signal lines SL1-1 through SL1-5 and a plurality of pad portions SL-P of a plurality of second signal lines SL2-1 through SL2-4 may be formed from the first conductive layer 310 disposed above the second conductive layer 330.

Figure 26:
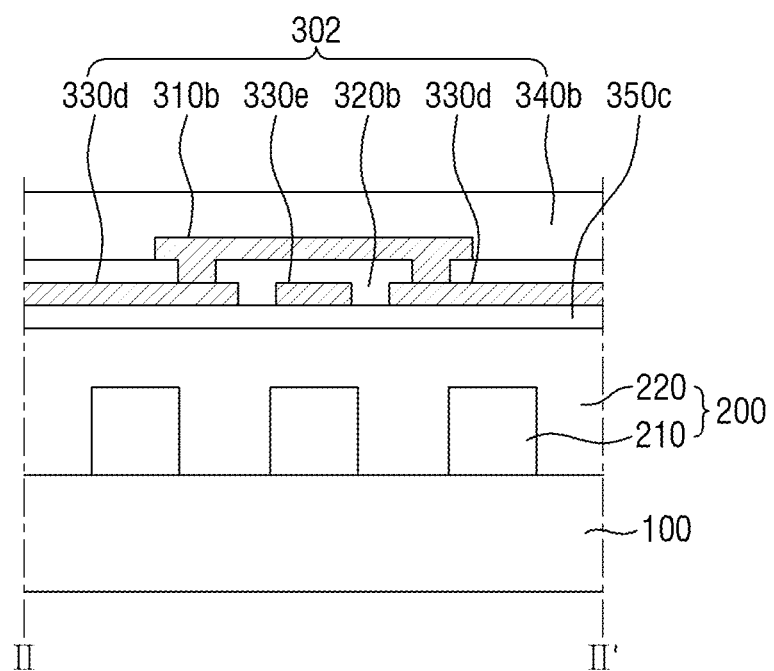

Referring to FIG. 26, a third passivation layer 350c may be disposed between a diffraction pattern layer 200 and first sensing portions 330d of a second input sensing layer 302. In one exemplary embodiment, the third passivation layer 350c may be disposed directly on a first passivation layer 220. In one exemplary embodiment, the third passivation layer 350c may comprise an inorganic material. The inorganic material may be a silicon nitride layer.

Figure 27:
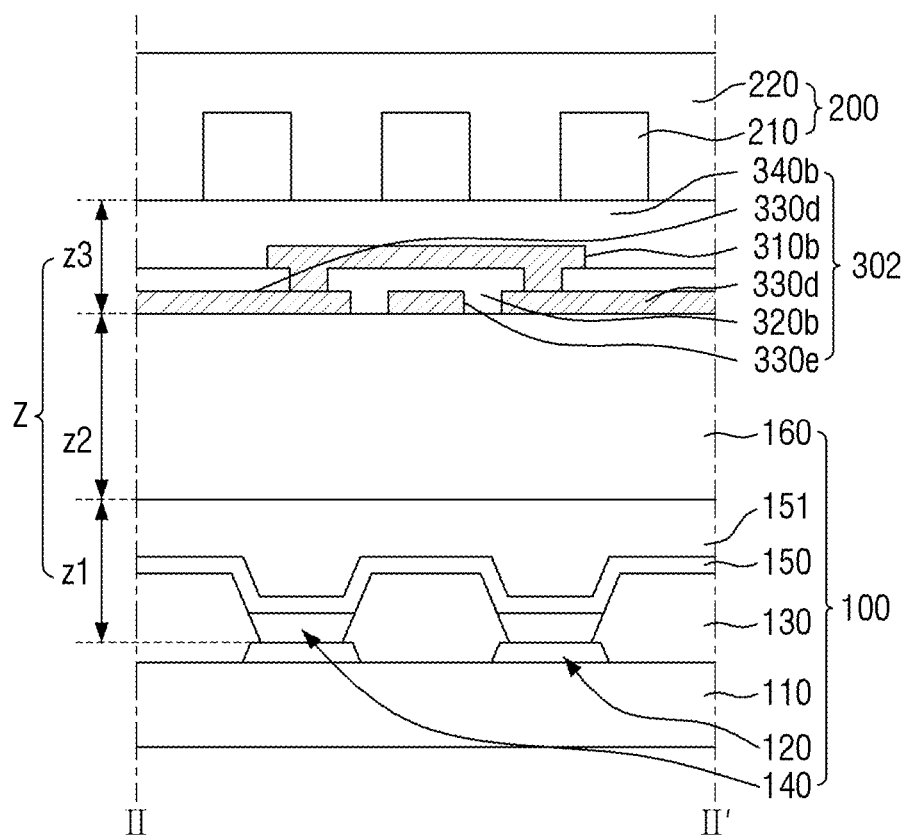

Referring to FIG. 27, a second input sensing layer 302 may be disposed on a display panel 100. A diffraction pattern layer 200 may be disposed on the second input sensing layer 302. The display device of FIG. 27 differs from the display device of FIG. 25 in the order in which the second input sensing layer 302 and the diffraction pattern layer 200 are stacked. That is, the second input sensing layer 302 may be disposed directly on a transparent insulating substrate.

The diffraction pattern layer 200 may be disposed on the second input sensing layer 302. In one exemplary embodiment, the second insulating layer 340 may perform a planarization function. Since the diffraction pattern layer 200 is disposed on the second input sensing layer 302, a distance Z between a first organic light-emitting element 141 and the diffraction pattern layer 200 increases, as compared to the display device of FIG. 2. As a result, a first diffraction distance β1 may be varied. The varied first diffraction distance may be defined as a third diffraction distance β3.

The third diffraction distance β3 may be represented by Equation (10):

$$\beta 3 = z1 \cdot \tan\left[\sin^{-1}\left(\frac{\lambda}{DP1} \cdot \frac{1}{n151}\right)\right] + \\ z2 \cdot \tan\left[\sin^{-1}\left(\frac{\lambda}{DP1} \cdot \frac{1}{nEN}\right)\right] + z3 \cdot \tan\left[\sin^{-1}\left(\frac{\lambda}{DP1} \cdot \frac{1}{n302}\right)\right]$$

Equation (10)

where z3 may be defined as the thickness of the second input sensing layer 302 and n302 denotes the refractive index of the second input sensing layer 302.

Figure 28:
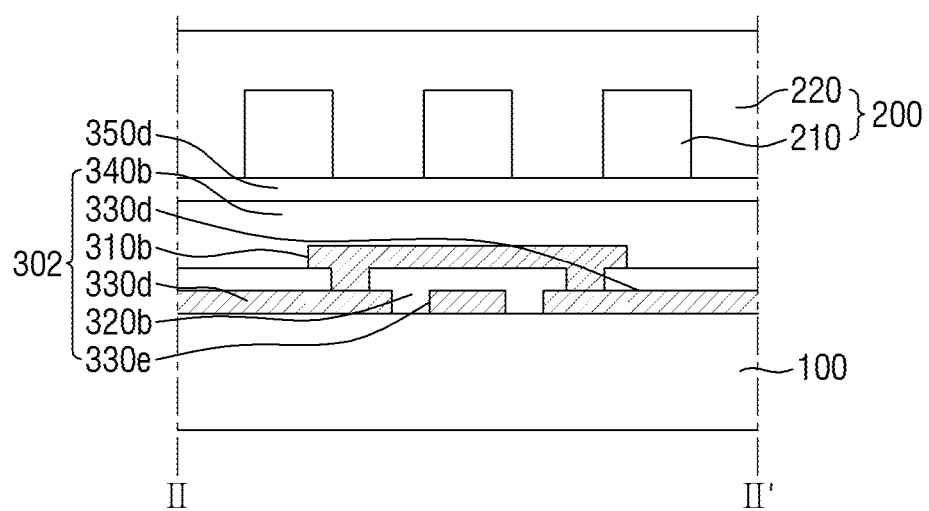

Referring to FIG. 28, a fourth passivation layer 350d may be disposed between a second input sensing layer 302 and a diffraction pattern layer 200. That is, the fourth passivation layer 350d may be disposed between the diffraction pattern layer 200 and the second input sensing layer 302 to protect the diffraction pattern layer 200. The fourth passivation layer 350d may planarize the diffraction pattern layer 200. In one exemplary embodiment, the fourth passivation layer 350d may be formed of an organic film or an inorganic film.

Although not specifically illustrated in FIG. 28, an additional passivation layer or a buffer layer may be disposed between the second input sensing layer 302 and the display panel 100.

Figure 29:
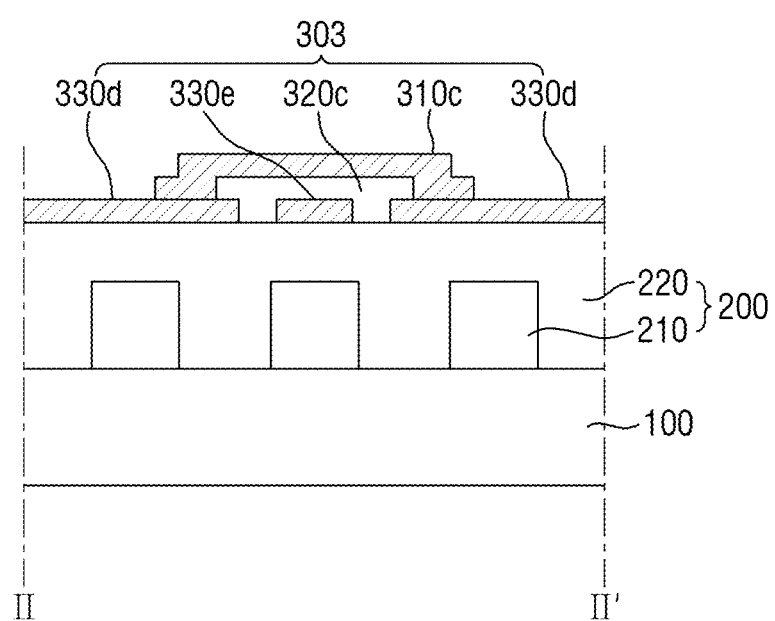

Referring to FIG. 29, a third input sensing layer 303 may include a plurality of insulating patterns 320c. That is, the first insulating layer 320b of FIG. 25 may be replaced with the insulating patterns 320c of FIG. 29. First connecting portions 310c may be disposed on the insulating patterns 320c. The first connecting portions 310c may electrically connect a plurality of sensing portions 330d, which are separated by the insulating patterns 320c, over the insulating patterns 320c.

The insulating patterns 320c may include a material selected from among a photosensitive material, silicon dioxide, titanium dioxide, zinc oxide, silicon nitride, aluminum nitride, and tantalum oxide, but the inventive concept is not limited thereto. The insulating patterns 320c may comprise various organic or inorganic materials other than those set forth herein.

Figure 30:
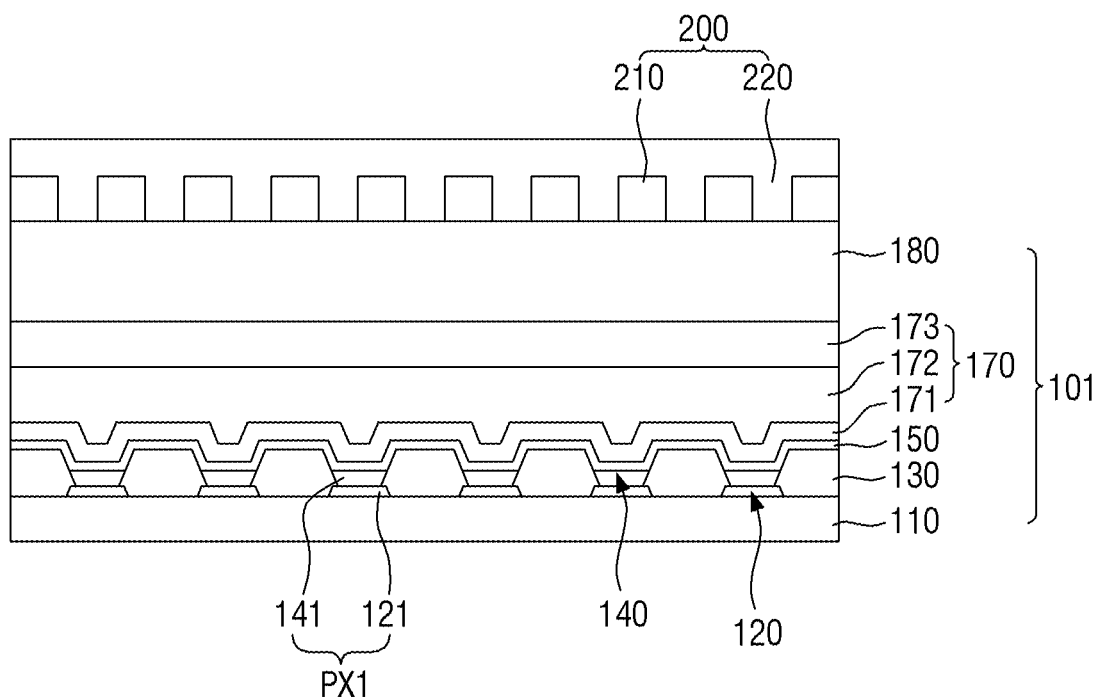
FIG. 30 is a cross-sectional view of a display device including a display panel according to another exemplary embodiment of the inventive concept.
Figure 31:
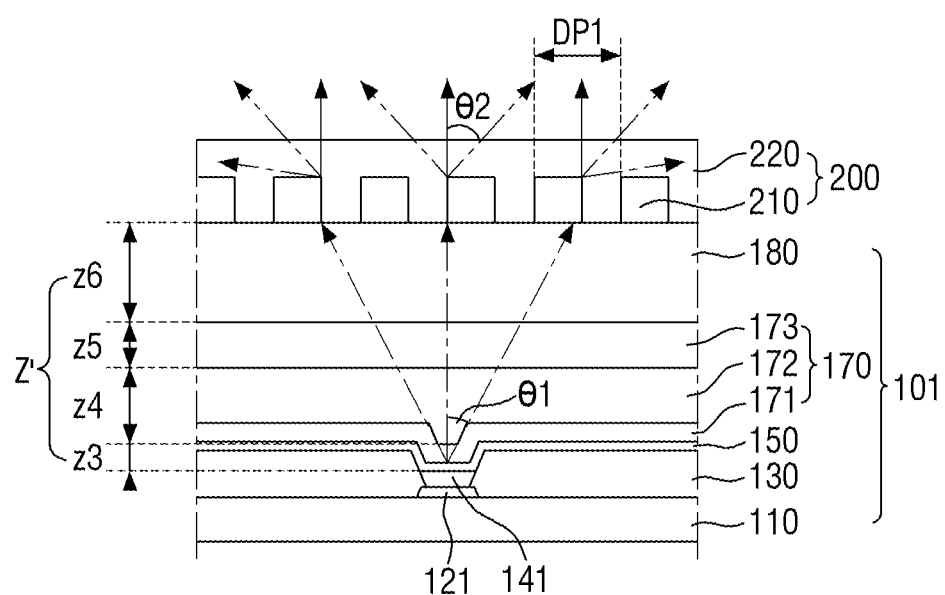
FIG. 31 is a cross-sectional view showing factors in the display device of FIG. 30 that determine a diffraction distance.

FIG. 30 is a cross-sectional view of a display device including a display panel according to another exemplary embodiment of the inventive concept. FIG. 31 is a cross-sectional view showing factors in the display device of FIG. 30 that determine a diffraction distance. Descriptions of elements that have already been described above with reference to FIGS. 1 through 29 will be omitted.

Referring to FIGS. 30 and 31, a display panel 101 may include a second encapsulation layer 170 and a second buffer layer 180.

In one exemplary embodiment, the second encapsulation layer 170 may have a stack structure in which at least one single- or multilayer organic layer and at least one single- or multilayer inorganic layer are stacked. Specifically, the second encapsulation layer 170 may include a first inorganic layer 171, an organic layer 172, and a second inorganic layer 173.

The first inorganic layer 171 may be disposed on a common electrode 150. The first inorganic layer 171 may be formed of at least one selected from the group consisting of silicon oxide ($SiO_x$), silicon nitride ($SiN_x$), and silicon oxynitride ($SiON_x$).

The organic layer 172 may be disposed on the first inorganic layer 171. The organic layer 172 may comprise at least one selected from the group consisting of epoxy, acrylate, and urethane acrylate. The organic layer 172 may planarize height differences formed by a pixel defining film 130.

The second inorganic layer 173 may be disposed on the organic layer 172. The second inorganic layer 173 may be formed of at least one selected from the group consisting of silicon oxide ($SiO_x$), silicon nitride ($SiN_x$), and silicon oxynitride ($SiON_x$).

The first inorganic layer 171, the organic layer 172, and the second inorganic layer 173 are illustrated in FIG. 31 as all being single layers, but the inventive concept is not limited thereto. That is, the first inorganic layer 171, the organic layer 172, and the second inorganic layer 173 may be multilayers.

In a case where at least one of the first and second inorganic layers 171 and 173 is formed as a multilayer, at least one layer that forms the multilayer may be a hexamethyldisiloxane (HMDSO) layer. Since the HMDSO layer can absorb stress, the second encapsulation layer 170 may become more flexible.

The second buffer layer 180 may be disposed on the second inorganic layer 173. The material of the second buffer layer 180 is not particularly limited. For example, the second buffer layer 180 may comprise an inorganic material or an organic material. In another example, the second buffer layer 180 may have a stack structure in which at least one single- or multilayer organic layer and at least one single- or multilayer inorganic layer are stacked. The second buffer layer 180 may have a predetermined thickness and may thus allow a plurality of organic light-emitting elements 140 and a diffraction pattern layer 200 to be a predetermined distance apart from each other. That is, by controlling the thickness of the second buffer layer 180, a distance Z' between the organic light-emitting elements 140 and the diffraction pattern layer 200 can be controlled, and this means that a diffraction distance can also be controlled. In one exemplary embodiment, the thickness of the second buffer layer 180 may be about 200 um or less.

The second buffer layer 180 may not be provided, in which case, the distance Z' between the organic light-emitting elements 140 and the diffraction pattern layer 200 may not be able to be sufficiently secured. If the distance Z' between the organic light-emitting elements 140 and the diffraction pattern layer 200 is not sufficient, a desired diffraction distance may not be able to be secured, and as a result, an effective light-emitting area may not be able to be fully expanded. Thus, in a case where the second buffer layer 180 is not provided, the arrangement order of the diffraction pattern layer 200 is changed such that the distance Z' between the organic light-emitting elements 140 and the diffraction pattern layer 200 can be sufficiently secured.

The diffraction pattern layer 200 is illustrated in FIGS. 30 and 31 as being formed on the second encapsulation layer 170, but the inventive concept is not limited thereto. That is, the diffraction pattern layer 200 may comprise the same material as the second encapsulation layer 170 and may be formed on the top surface of an organic layer or an inorganic layer included in the second encapsulation layer 170. For example, the diffraction pattern layer 200 may be formed by etching the top surface of the second inorganic layer 173.

Referring to FIG. 31, the distance Z' between the organic light-emitting elements 140 and the diffraction pattern layer 200 may be defined as the sum of distances z3, z4, z5, and z6. The distance Z' between the organic light-emitting elements 140 and the diffraction pattern layer 200 will hereinafter be described, taking a case where the second encapsulation layer 170 has a stack structure in which the first inorganic layer 171, the organic layer 172, and the second inorganic layer 173 are sequentially stacked.

The distance z3 is defined as the shortest distance from a first organic light-emitting element 141 to a lowest bottom surface of the organic layer 172. The lowest bottom surface of the organic layer 172 is the surface where the distance between the organic layer 172 and the first organic light-emitting element 141 reaches its minimum. The distance z4 is defined as the shortest distance from the lowest bottom surface to the top surface of the organic layer 172. The top surface of the organic layer 172 is the surface where the organic layer 172 is placed in direct contact with the second organic layer 173. The distance z5 is defined as the shortest distance from the top surface of the organic layer 172 to the second buffer layer 180. The distance z6 may be defined as the thickness of the second inorganic layer 173. The distance z6 may also be defined as the shortest distance from the top surface of the second inorganic layer 173 to the diffraction pattern layer 200. The distance z6 may also be defined as the thickness of the second buffer layer 180.

A fourth diffraction distance β4 may be represented by Equation (11):

$$\beta 4 = z3 \cdot \tan\left[\sin^{-1}\left(\frac{\lambda}{DP1} \cdot \frac{1}{n171}\right)\right] +$$
$$z4 \cdot \tan\left[\sin^{-1}\left(\frac{\lambda}{DP1} \cdot \frac{1}{n172}\right)\right] +$$
$$z5 \cdot \tan\left[\sin^{-1}\left(\frac{\lambda}{DP1} \cdot \frac{1}{n173}\right)\right]$$
$$z6 \cdot \tan\left[\sin^{-1}\left(\frac{\lambda}{DP1} \cdot \frac{1}{n180}\right)\right]$$

Equation (11)

where n171, n172, n173, and n180 denote the refractive indexes of the first inorganic layer 171, the organic layer 172, the second inorganic layer 173, and the second buffer layer 180, respectively.

In one exemplary embodiment, in a case where there are additional elements provided between the diffraction pattern layer 200 and the first organic light-emitting element 141, the fourth diffraction distance β4 may be varied in consideration of the refractive indexes and thicknesses of the additional elements. In another exemplary embodiment, in a case where the second encapsulation layer 170 and the second buffer layer 180 have the same refractive index, a diffraction distance β" between the first organic light-emitting element 141 and the diffraction pattern layer 200 may be represented by Equation (12):

$$\beta'' = Z' \cdot \tan\left[\sin^{-1}\left(\frac{\lambda}{DP1} \cdot \frac{1}{n170}\right)\right]$$

Equation (12)

where n170 denotes the refractive index of the second encapsulation layer 170.

Figure 32:
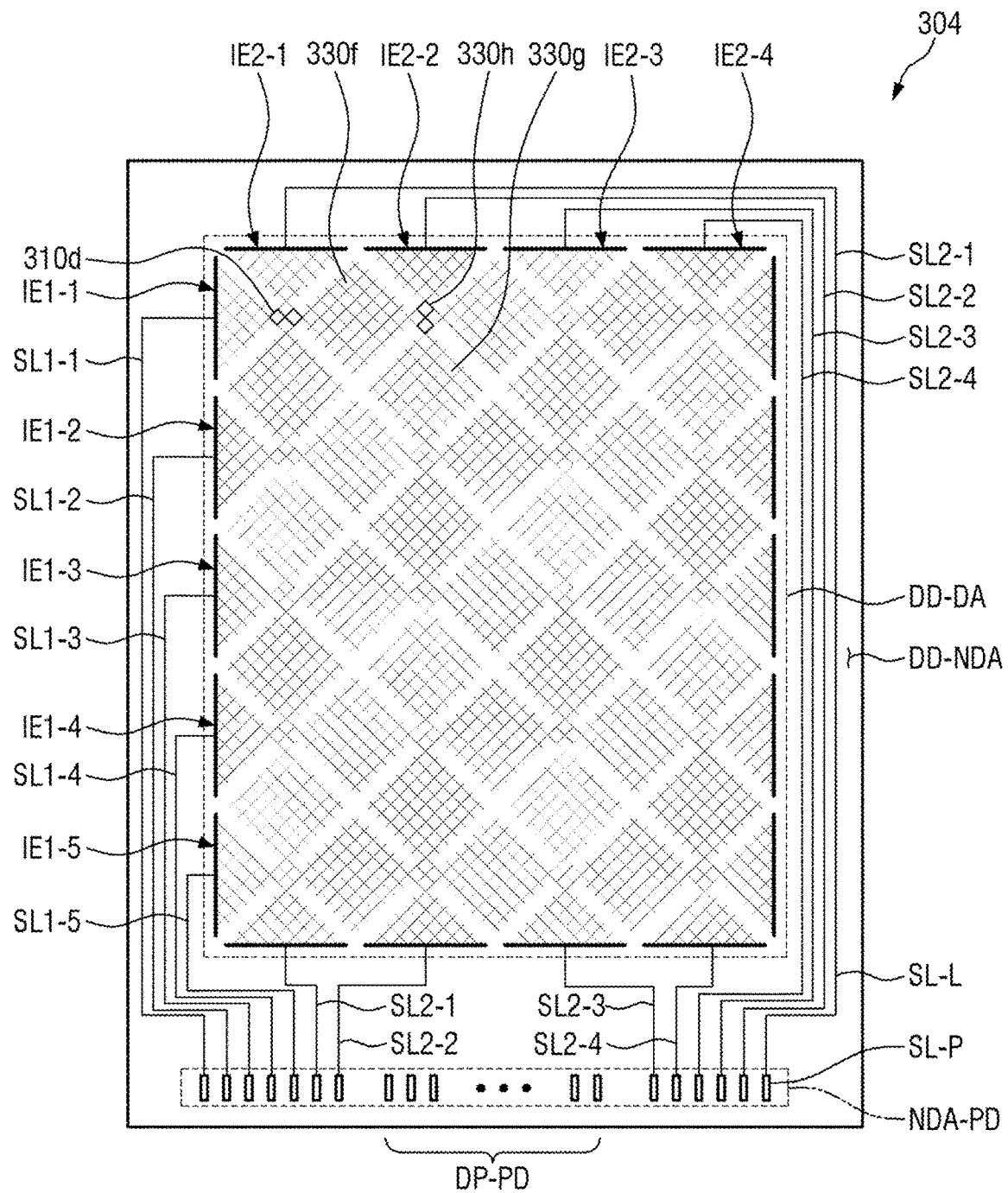
FIG. 32 is a plan view of an input sensing layer according to another exemplary embodiment of the inventive concept.
Figure 33:
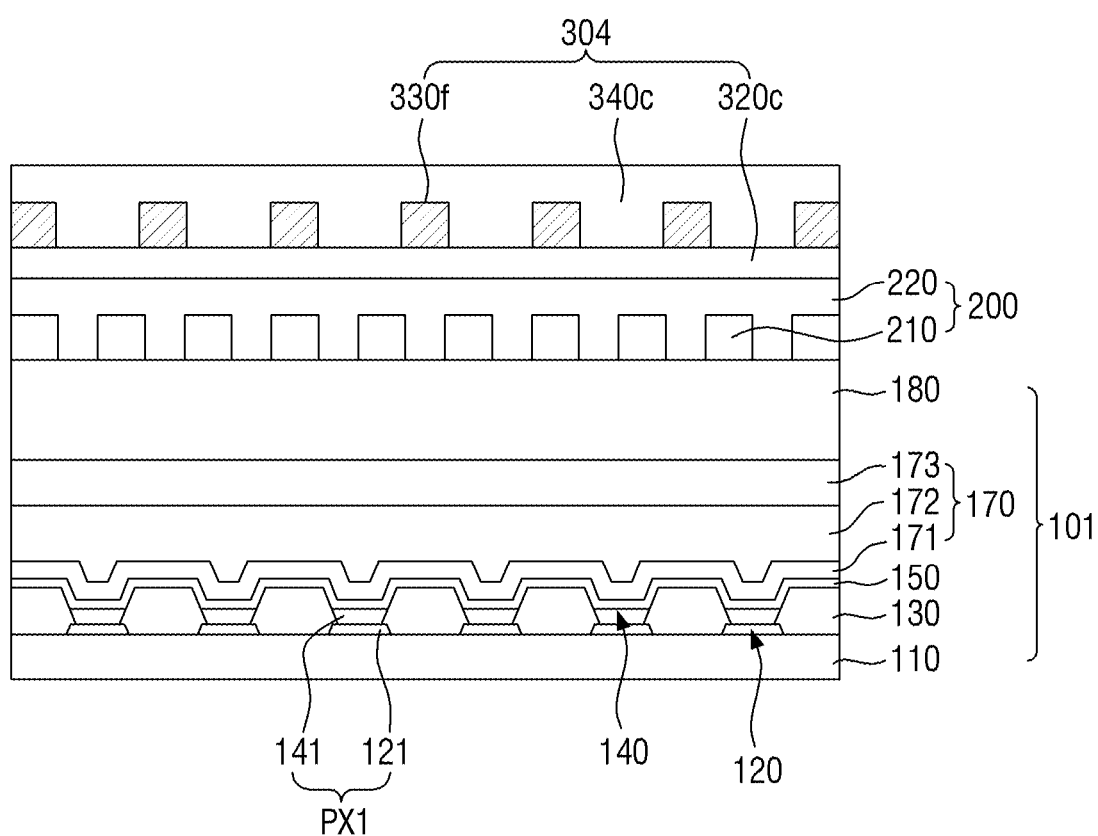
FIG. 33 is a cross-sectional view of the input sensing layer of FIG. 32.

FIG. 32 is a plan view of an input sensing layer according to another exemplary embodiment of the inventive concept. FIG. 33 is a cross-sectional view of the input sensing layer of FIG. 32.

Referring to FIGS. 32 and 33, a fourth input sensing layer 304 may include a plurality of first sensing electrodes IE1-1 through IE1-5 and a plurality of second sensing electrodes IE2-1 through IE2-4, and the first sensing electrodes IE1-1 through IE1-5 and the second sensing electrodes IE2-1 through IE2-4 may be arranged in a mesh shape. Accordingly, parasitic capacitance can be reduced. In one exemplary embodiment, the first sensing electrodes IE1-1 through IE1-5 and the second sensing electrodes IE2-1 through IE2-4 may comprise a metal such as, for example, Ag, Al, Cu, Cr, Ni, or Ti, that can be processed at low temperature. The first sensing electrodes IE1-1 through IE1-5 and the second sensing electrodes IE2-1 through IE2-4 overlap with a pixel defining film 130 and are thus not viewable to a user.

A plurality of mesh wires of the first sensing portions 330f may define a plurality of mesh holes. In one exemplary embodiment, the mesh wires may have a three-layer structure of Ti/Al/Ti. The mesh holes may have the same size or may have different sizes. In one exemplary embodiment, in a plan view, the mesh holes may have a rhombic or polygonal shape or a shape with rounded corners.

Figure 34:
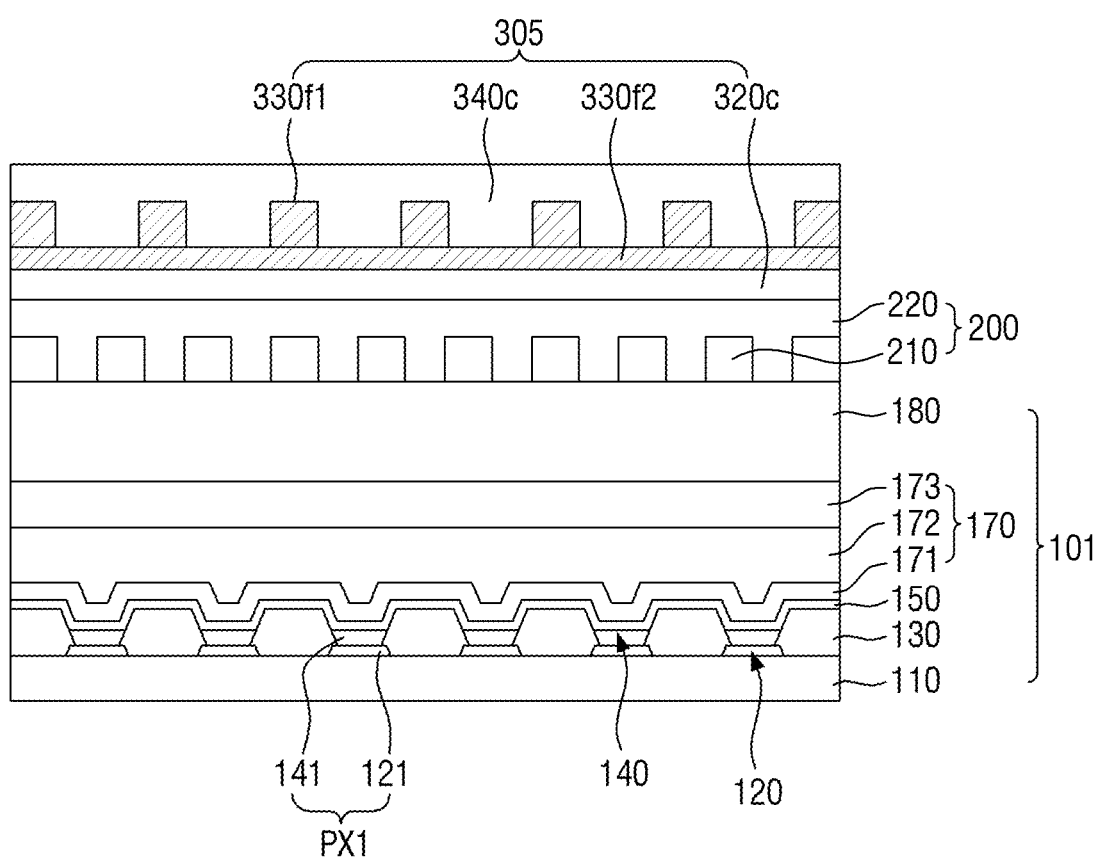
FIG. 34 is a cross-sectional view of an input sensing layer according to another exemplary embodiment of the inventive concept.

FIG. 34 is a cross-sectional view of an input sensing layer according to another exemplary embodiment of the inventive concept.

Referring to FIG. 34, a fifth input sensing layer 305 may include a first sensing portion (330f1 and 330f2) having a multilayer structure. Specifically, the first sensing portion (330f1 and 330f2) may include a mesh wiring layer 330f1 and a transparent conductive oxide layer 330f2 stacked on the mesh wiring layer 330f1. However, the order in which the mesh wiring layer 330f1 and the transparent conductive oxide layer 330f2 are stacked is not particularly limited. That is, the transparent conductive oxide layer 330f2 may be disposed on the mesh wiring layer 330f1.

Figure 35:
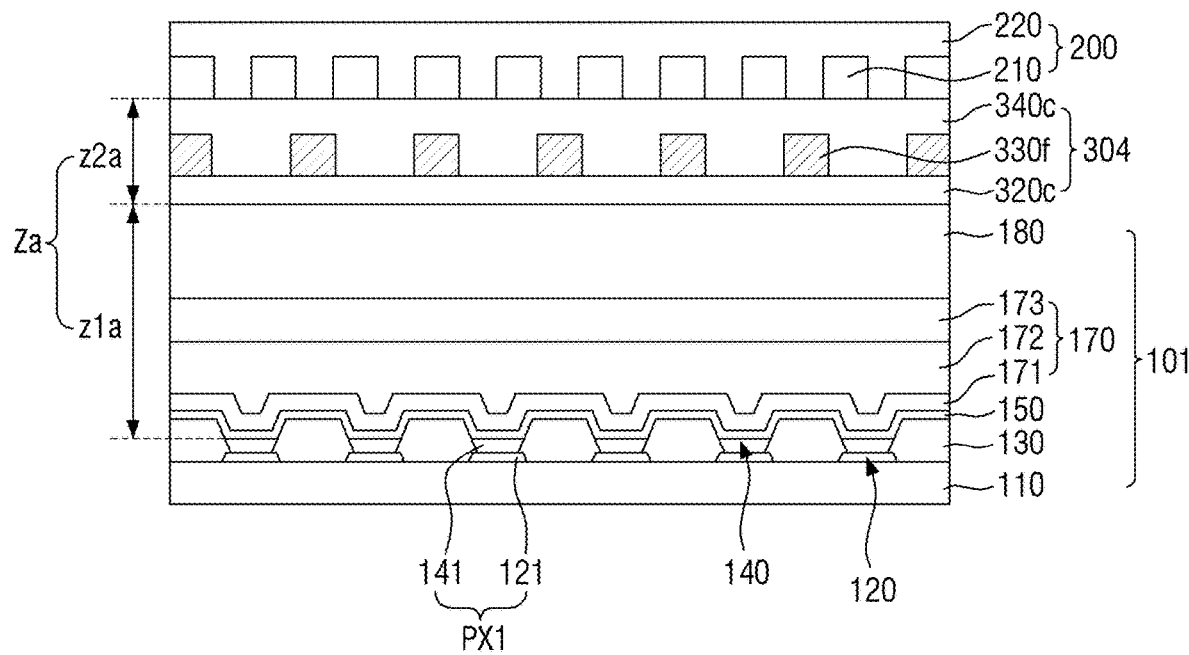
FIG. 35 is a cross-sectional view of a display device including an input sensing layer according to another exemplary embodiment of the inventive concept and a diffraction pattern layer according to another exemplary embodiment of the inventive concept.

FIG. 35 is a cross-sectional view of a display device including an input sensing layer according to another exemplary embodiment of the inventive concept and a diffraction pattern layer according to another exemplary embodiment of the inventive concept.

Referring to FIG. 35, a fourth input sensing layer 304 may be disposed on a display panel 101. A diffraction pattern layer 200 may be disposed on the fourth input sensing layer 304. Specifically, a first insulating layer 320c of the fourth input sensing layer 304 may be disposed on a second buffer layer 180. A plurality of diffraction patterns 210 may be disposed on a second insulating layer 340c. In one exemplary embodiment, the second insulating layer 340c may perform a planarization function.

Since the diffraction pattern layer 200 is disposed on the fourth input sensing layer 304, a distance Za between a first organic light-emitting element 141 and the diffraction pattern layer 200 increases, as compared to the display device of FIG. 2. As a result, a first diffraction distance β1 may be varied. The varied first diffraction distance may be defined as a fifth diffraction distance β5.

For convenience, when calculating the fifth diffraction distance β5, the refractive indexes of the elements included in the display panel 101 may be collectively considered a single factor and represented by the refractive index of the display panel 101. The fifth diffraction distance β5 may be represented by Equation (13):

$$\beta 5 = z1a \cdot \tan\left[\sin^{-1}\left(\frac{\lambda}{DP1} \cdot \frac{1}{n101}\right)\right] +$$
$$z2a \cdot \tan\left[\sin^{-1}\left(\frac{\lambda}{DP1} \cdot \frac{1}{n304}\right)\right]$$

Equation (13)

where n101 denotes the refractive index of the display panel 101 and n304 denotes the refractive index of the fourth input sensing layer 304.

In a case where the thickness of the fourth input sensing layer 304 (i.e., a distance z2a) is large enough to meet a required fifth diffraction distance β5, the second buffer layer 180 may not be provided, or the thickness of the second buffer layer 180 may be reduced. Accordingly, the thickness of the display panel 101 may be reduced.

Figure 36:
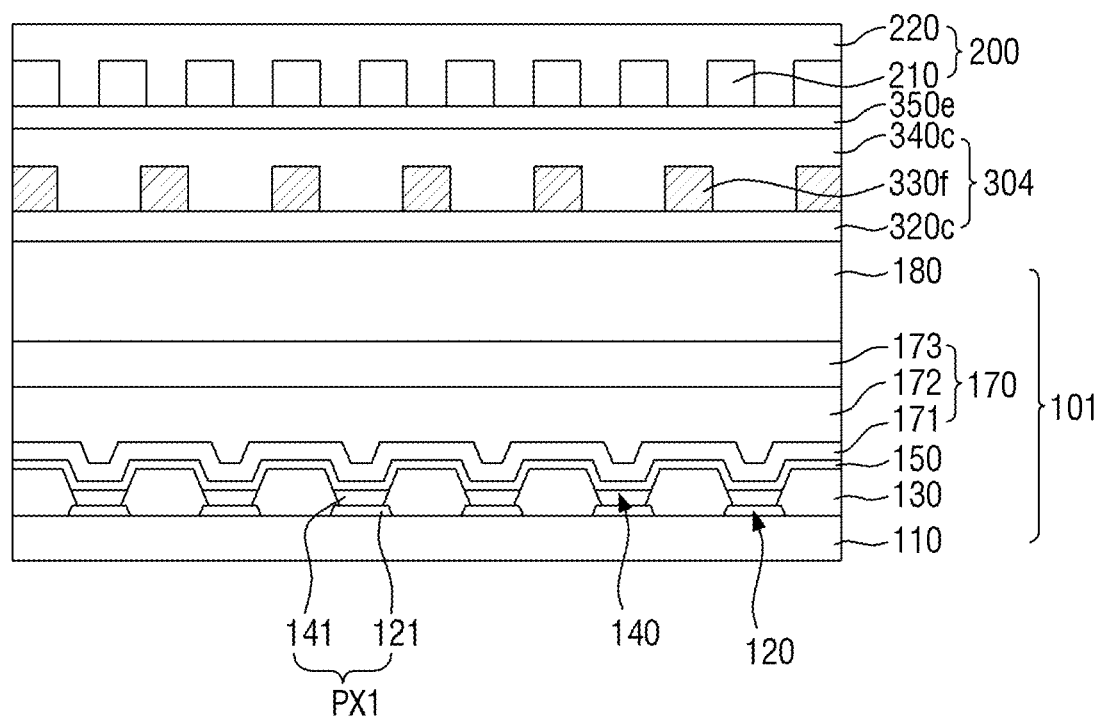
FIG. 36 is a cross-sectional view of a display device including an input sensing layer according to another exemplary embodiment of the inventive concept and a diffraction pattern layer according to another exemplary embodiment of the inventive concept.

FIG. 36 is a cross-sectional view of a display device including an input sensing layer according to another exemplary embodiment of the inventive concept and a diffraction pattern layer according to another exemplary embodiment of the inventive concept.

Referring to FIG. 36, a fifth passivation layer 350e may be disposed between a fourth input sensing layer 304 and a diffraction pattern layer 200. That is, the fifth passivation layer 350e may be disposed between the diffraction pattern layer 200 and the fourth input sensing layer 304 to protect the diffraction pattern layer 200. The fifth passivation layer 350e may planarize the diffraction pattern layer 200. In one exemplary embodiment, the fifth passivation layer 350e may be formed of an organic film or an inorganic film.

Figure 37:
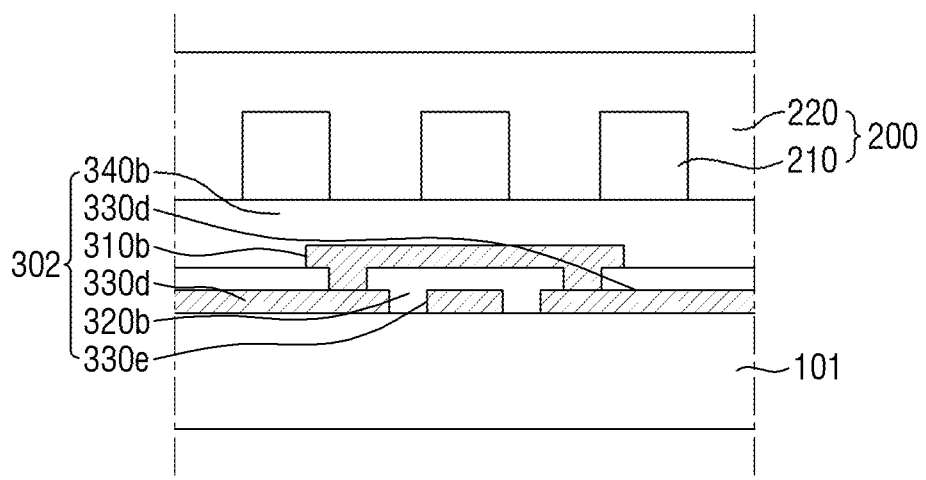
FIG. 37 is a cross-sectional view of a display device including a display panel according to another exemplary embodiment of the inventive concept.

FIG. 37 is a cross-sectional view of a display device including a display panel according to another exemplary embodiment of the inventive concept. Descriptions of elements that have already been described above with reference to FIG. 25 will be omitted.

Referring to FIG. 37, a second input sensing layer 302 may include a plurality of first sensing portions 330d and a plurality of second connecting portions 330e, and the first sensing portions 330d and the second connecting portions 330e may be disposed on the same layer. The second input sensing layer 302 may be disposed directly on a display panel 101.

That is, the display device of FIG. 37 differs from the display device of FIG. 25 in that the second input sensing layer 302 is disposed on the display panel 101 including a second encapsulation layer 170, which has a stack of organic and inorganic layers.

Figure 38:
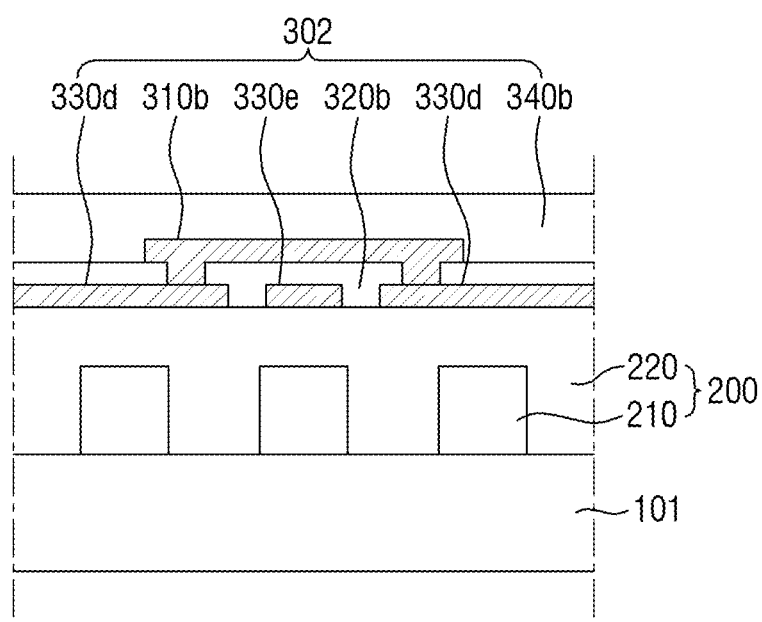
FIG. 38 is a cross-sectional view of a display device including an input sensing layer according to another exemplary embodiment of the inventive concept and a diffraction pattern layer according to another exemplary embodiment of the inventive concept.

FIG. 38 is a cross-sectional view of a display device including an input sensing layer according to another exemplary embodiment of the inventive concept and a diffraction pattern layer according to another exemplary embodiment of the inventive concept.

Referring to FIG. 38, a second input sensing layer 302 may be disposed directly on a display panel 101. A diffraction pattern layer 200 may be disposed on the second input sensing layer 302. That is, the display device of FIG. 38 differs from the display device of FIG. 37 in the order in which the second input sensing layer 302 and the diffraction pattern layer 200 are stacked.

Although not specifically illustrated in FIGS. 37 and 38, each of the display devices of FIGS. 37 and 38 may further include a passivation layer disposed between the diffraction pattern layer 200 and the second input sensing layer 302. In one exemplary embodiment, the passivation layer may be formed of an organic film or an inorganic film.

Figure 39:
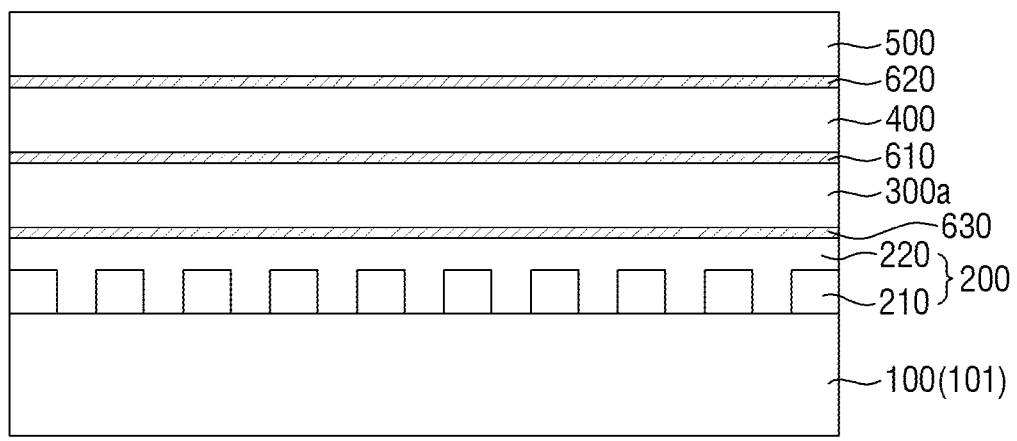
FIG. 39 and FIG. 40 are cross-sectional views of display devices according to other exemplary embodiments of the inventive concept.
Figure 40:
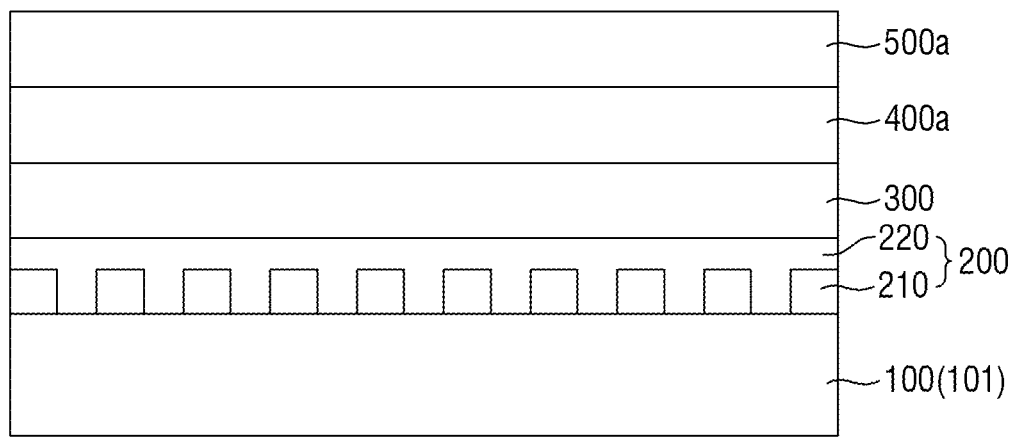

FIGS. 39 and 40 are cross-sectional views of display devices according to other exemplary embodiments of the inventive concept. Descriptions of elements that have already been described above with reference to FIGS. 1 through 38 will be omitted.

Referring to FIG. 39, the display device may include a display panel 100 or 101, a diffraction pattern layer 200, an input sensing panel 300a, an anti-reflection panel 400, and a window panel 500.

In one exemplary embodiment, the input sensing panel 300a may be coupled to a diffraction pattern layer 200 via a third adhesive member 630. That is, the input sensing panel 300a, unlike the input sensing layer 300 of FIG. 1, is coupled to the diffraction pattern layer 200 via the third adhesive member 630. The elements of the input sensing panel 300a will be described later. The material of the third adhesive member 630 is not particularly limited. In one exemplary embodiment, the third adhesive member 630 may be an OCA or OCR member or a PSA member.

The display panel 100 or 101, the input sensing panel 300a, the anti-reflection panel 400, and the window panel 500 may all include a base layer. The order in which the diffraction pattern layer 200, the input sensing panel 300a, and the anti-reflection panel 400 are stacked may vary.

In one exemplary embodiment, the display panel 100 or 101 may be the display panel 100 of FIG. 1, including the first encapsulation layer 160, or the display panel 101 of FIG. 30, including the second encapsulation layer 170. The input sensing layer 300 may be disposed directly on the first or second encapsulation layer 160 and 170. That is, the type of the encapsulation layer included in the display panel 100 or 101 is not particularly limited.

Referring to FIG. 40, the display device may include a display panel 100 or 101, a diffraction pattern layer 200, an input sensing layer 300, an anti-reflection layer 400a, and a window layer 500a.

That is, no particular adhesive member is provided to couple the input sensing layer 300, the anti-reflection layer 400a, and the window layer 500a. Accordingly, the diffraction pattern layer 200, the input sensing layer 300, the anti-reflection layer 400a, and the window layer 500a may be formed on a base surface provided by the display panel 100 (or 101) by a continuous process.

The order in which the diffraction pattern layer 200, the input sensing layer 300, the anti-reflection panel 400, and the window panel 500 are stacked may vary depending on the type of the display panel 100 (or 101) and the type of the input sensing layer 300. The order in which the diffraction pattern layer 200, the input sensing layer 300 (or the input sensing panel 300a), the anti-reflection panel 400, and the window panel 500 are stacked will hereinafter be described with reference to FIGS. 41A through 41F, 42, 43, and 44.

FIGS. 41A through 41F are cross-sectional views of display devices according to other exemplary embodiments of the inventive concept. The display devices of FIGS. 41A through 41F include the same elements, but differ from one another in the order in which those elements are stacked. Descriptions of elements that have already been described above with reference to FIGS. 1 through 40 will be omitted. Referring to FIGS. 41A through 41F, a display panel 100 may include a first encapsulation layer 160. In one exemplary embodiment, the first encapsulation layer 160 may be a glass insulating substrate. That is, the display devices of FIGS. 41A through 41F have a glass insulating substrate as the first encapsulation layer 160.

Figure 41A:
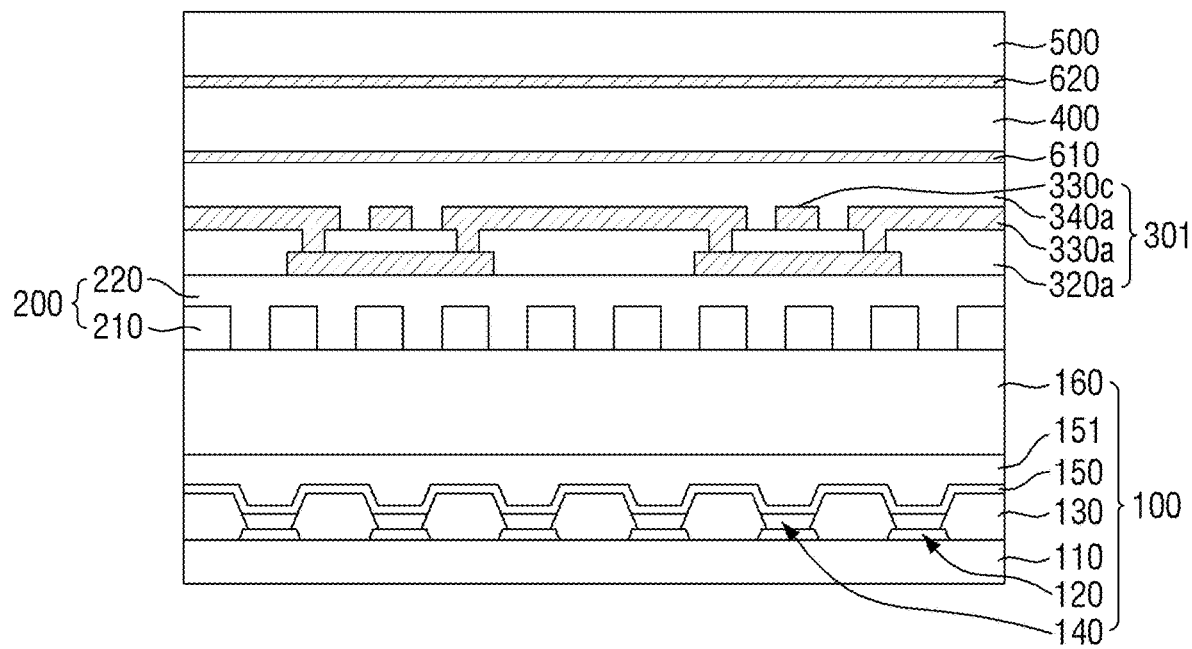
FIG. 41A, FIG. 41B, FIG. 41C, FIG. 41D, FIG. 41E, and FIG. 41F are cross-sectional views of display devices according to other exemplary embodiments of the inventive concept.

Referring to FIG. 41A, a diffraction pattern layer 200 may be disposed on a first encapsulation layer 160. A first input sensing layer 301 may be disposed on the diffraction pattern layer 200. Although not specifically illustrated, an additional passivation layer may be disposed between the first input sensing layer 301 and the diffraction pattern layer 200. In one exemplary embodiment, a display panel 100, the diffraction pattern layer 200, and the first input sensing layer 301 may be formed by a continuous process. The expression "first and second elements are formed by a continuous process", as used herein, means that the first and second elements form a single entity together.

An anti-reflection panel 400 may be coupled to the first input sensing layer 301 via a first adhesive member 610. A window panel 500 may be coupled to the anti-reflection panel 400 via a second adhesive member 620.

Figure 41B:
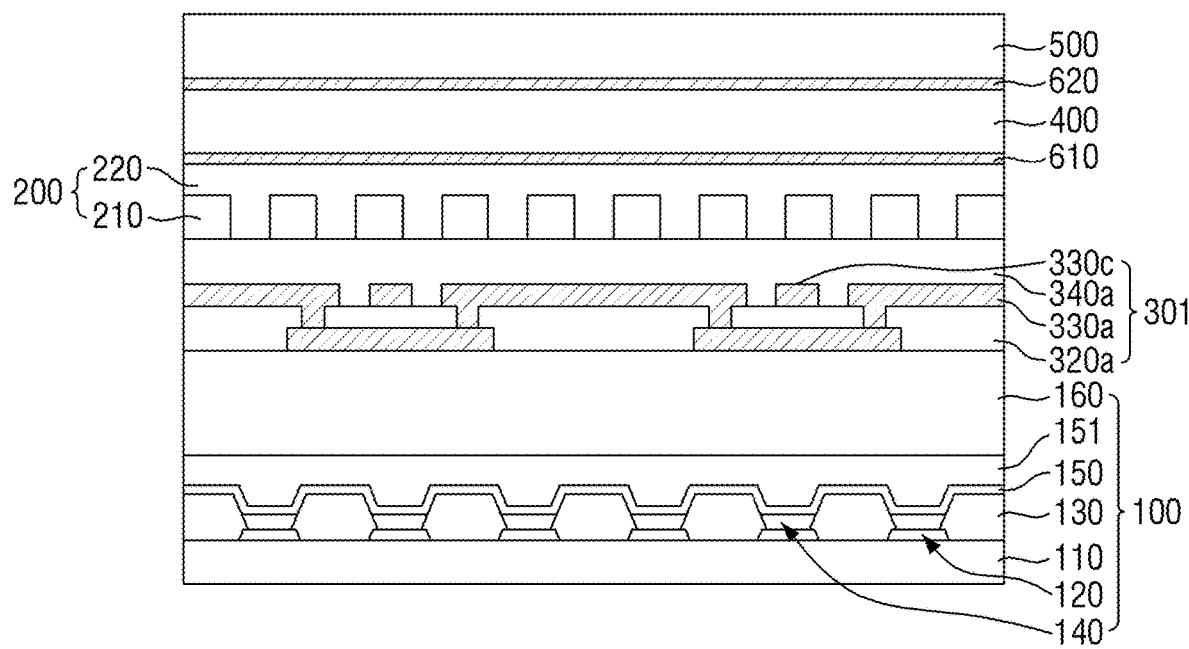

Referring to FIG. 41B, a diffraction pattern layer 200 may be disposed on a first input sensing layer 301. That is, the first input sensing layer 301 may be disposed directly on a first encapsulation layer 160. Although not specifically illustrated, an additional passivation layer may be disposed between an anti-reflection panel 400 and the diffraction pattern layer 200.

In one exemplary embodiment, the diffraction pattern layer 200, a display panel 100, and the first input sensing layer 301 may be formed by a continuous process. In another exemplary embodiment, the diffraction pattern layer 200 and the anti-reflection panel 400 may be formed by a continuous process.

Figure 41C:
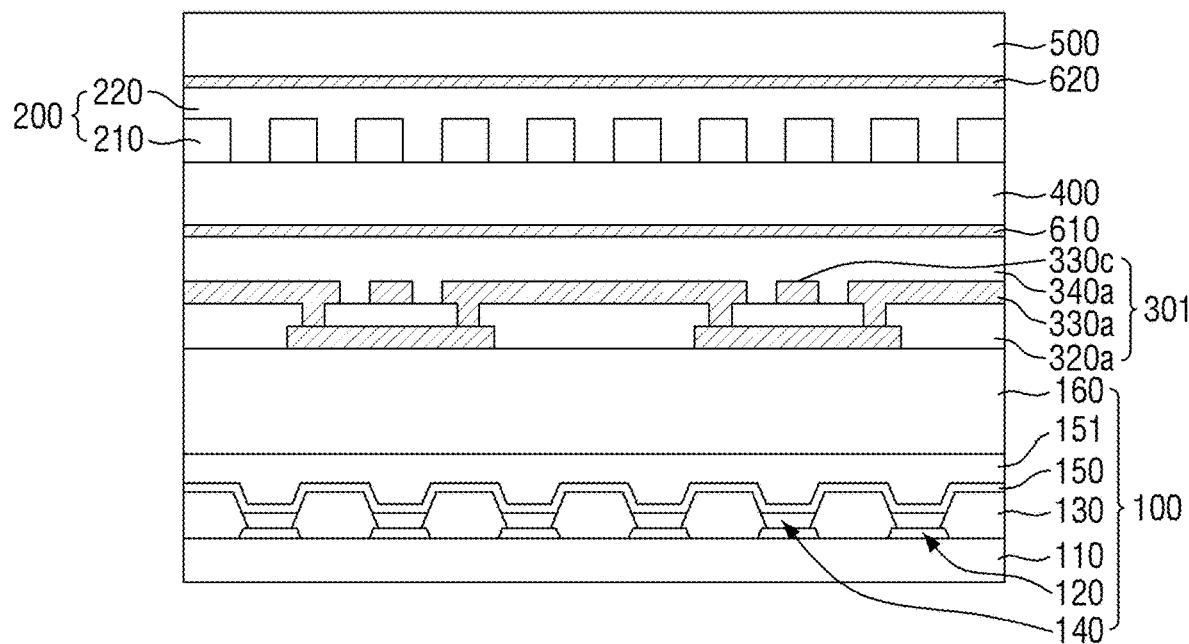

Referring to FIG. 41C, a diffraction pattern layer 200 may be disposed on an anti-reflection panel 400. Although not specifically illustrated, an additional passivation layer may be disposed between an anti-reflection panel 400 and the diffraction pattern layer 200. In one exemplary embodiment, the diffraction pattern layer 200 and the anti-reflection panel 400 may be formed by a continuous process.

Figure 41D:
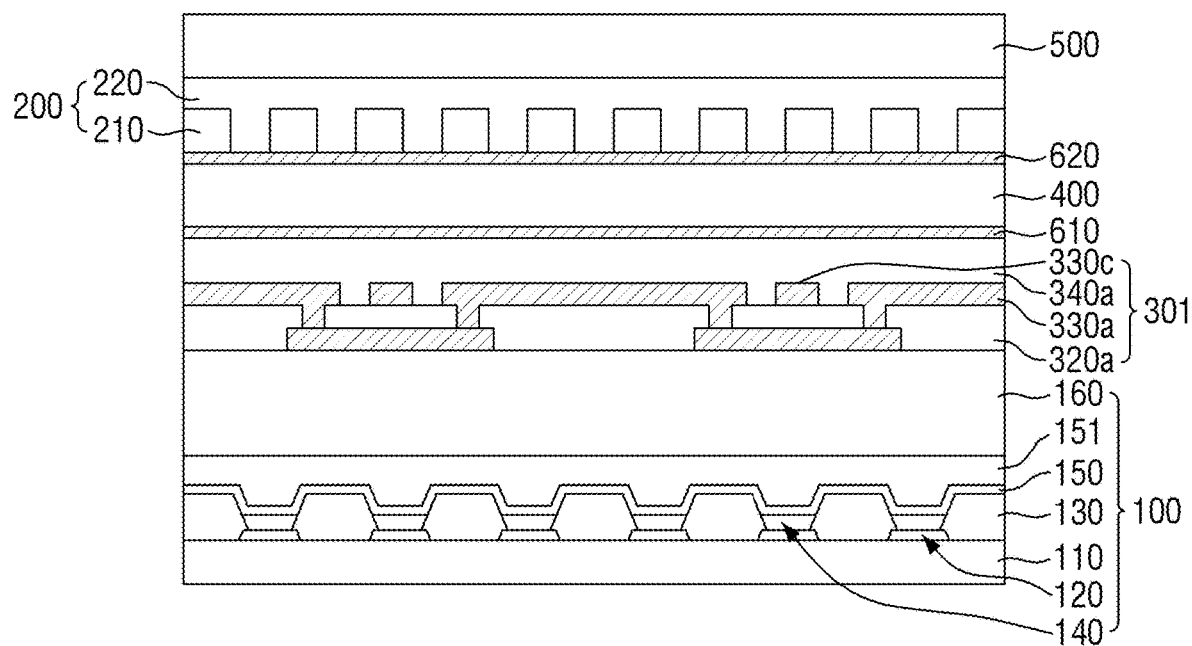

Referring to FIG. 41D, a diffraction pattern layer 200 may be disposed between a second adhesive member 620 and a window panel 500. In one exemplary embodiment, the diffraction pattern layer 200 and the window panel 500 may be formed by a continuous process.

Figure 41E:
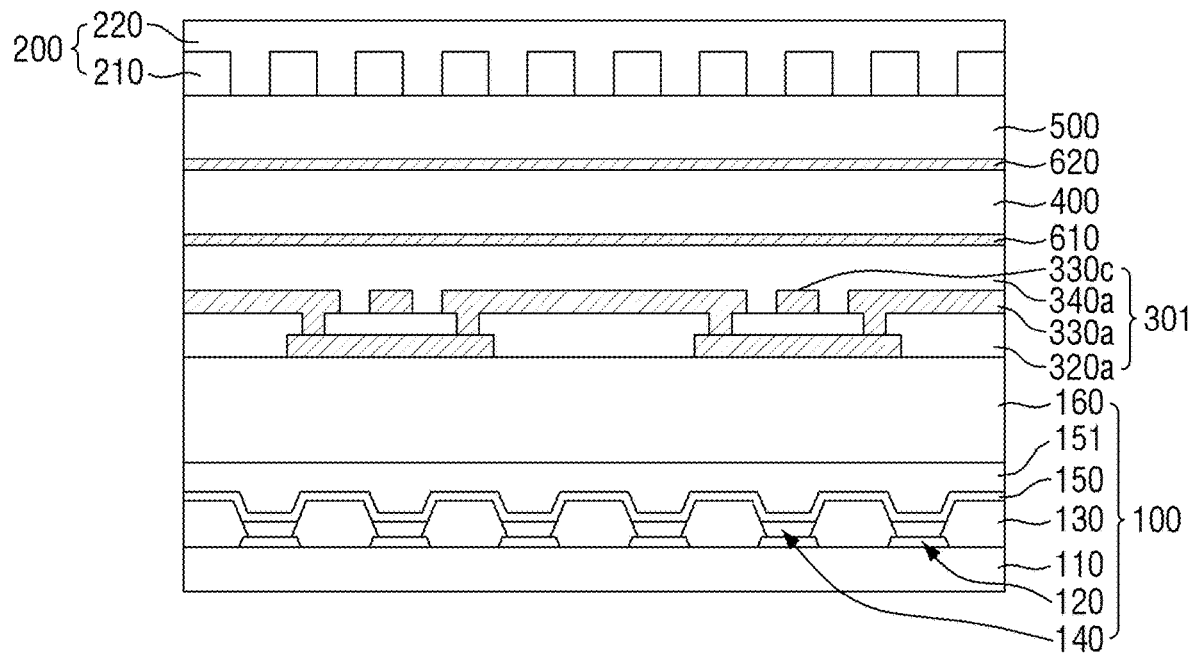

Referring to FIG. 41E, a diffraction pattern layer 200 may be disposed on a window panel 500. In one exemplary embodiment, the diffraction pattern layer 200 may be attached on the window panel 500 in the form of a film. In another exemplary embodiment, a plurality of diffraction patterns 210 may be formed by depositing an inorganic film on the window panel 500 and etching the inorganic film. In another exemplary embodiment, the diffraction patterns 210 may be formed by etching the window panel 500, in which case, the diffraction patterns 210 and the window panel 500 may comprise the same material.

Figure 41F:
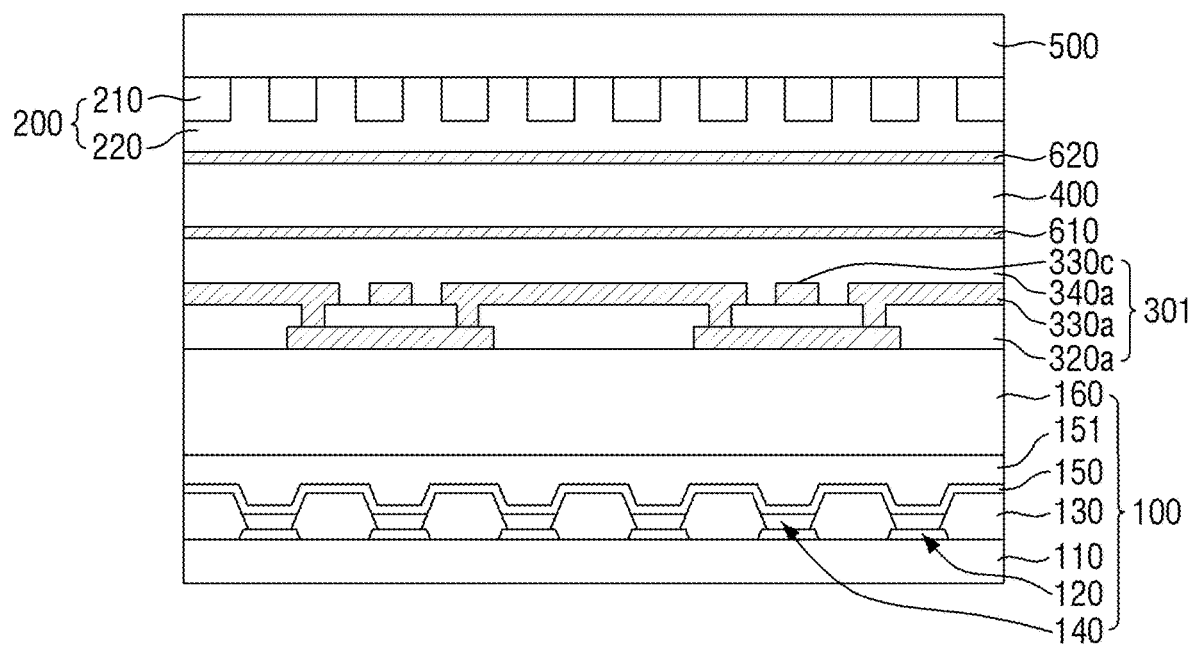

Referring to FIG. 41F, a diffraction pattern layer 200 may be disposed below a window panel 500, and a plurality of diffraction patterns 210 may protrude from the bottom surface of the window panel 500. A method to form the diffraction pattern layer 200 is not particularly limited. In one exemplary embodiment, the diffraction pattern layer 200 may be attached on the bottom of the window panel 500 in the form of a film. In another exemplary embodiment, the diffraction patterns 210 may be formed by depositing an inorganic film at the bottom of the window panel 500 and etching the inorganic film. In another exemplary embodiment, the diffraction patterns 210 may be formed by etching the window panel 500, in which case, the diffraction patterns 210 and the window panel 500 may comprise the same material.

If the location of the diffraction pattern layer 200 changes, the distance between the diffraction pattern layer 200 and a plurality of organic light-emitting elements 140 may also change. A diffraction distance may be controlled by reflecting a first period DP1 of the diffraction patterns 210 and the thicknesses and refractive indexes of elements between the diffraction pattern layer 200 and the organic light-emitting elements 140.

Although not specifically illustrated, the display devices of FIGS. 41A through 41F may include a display panel 101 having a second encapsulation layer 170, instead of the display panel 100 having the first encapsulation layer 160. Also, the display devices of FIGS. 41A through 41F may include a display panel 102 having a second encapsulation layer 170, but having no second buffer layer 180, instead of the display panel 100 having the first encapsulation layer 160.

Although not specifically illustrated, the diffraction pattern layer 200 may include a plurality of diffraction patterns 210 extending from the bottom of a particular element toward the display panel 100, as illustrated in FIG. 41A. That is, the diffraction patterns 210 may be formed to extend from the anti-reflection panel 400, the input sensing layer 300, or another element (for example, an adhesive member or a base layer) toward the display panel 100.

FIGS. 42A through 42G are cross-sectional views of display devices according to other exemplary embodiments of the inventive concept. The display devices of FIGS. 42B through 42G include the same elements, but differ from one another in the order in which those elements are stacked. The display device of FIG. 42A includes a display panel 101 having a second buffer layer 180, whereas the display devices of FIGS. 42B through 42G include a display panel 102 having no second buffer layer 180. However, the inventive concept is not limited to this. That is, the second buffer layer 180 may not be omitted even from the display device of FIG. 42A. Also, the second buffer layer 180 may be included in the display devices of FIGS. 42B through 42G.

Referring to FIGS. 42A through 42G, a display panel 101 (or 102) may include a second encapsulation layer 170. In one exemplary embodiment, the second encapsulation layer 170 may include a first inorganic layer 171, an organic layer 172, and a second inorganic layer 173.

Figure 42A:
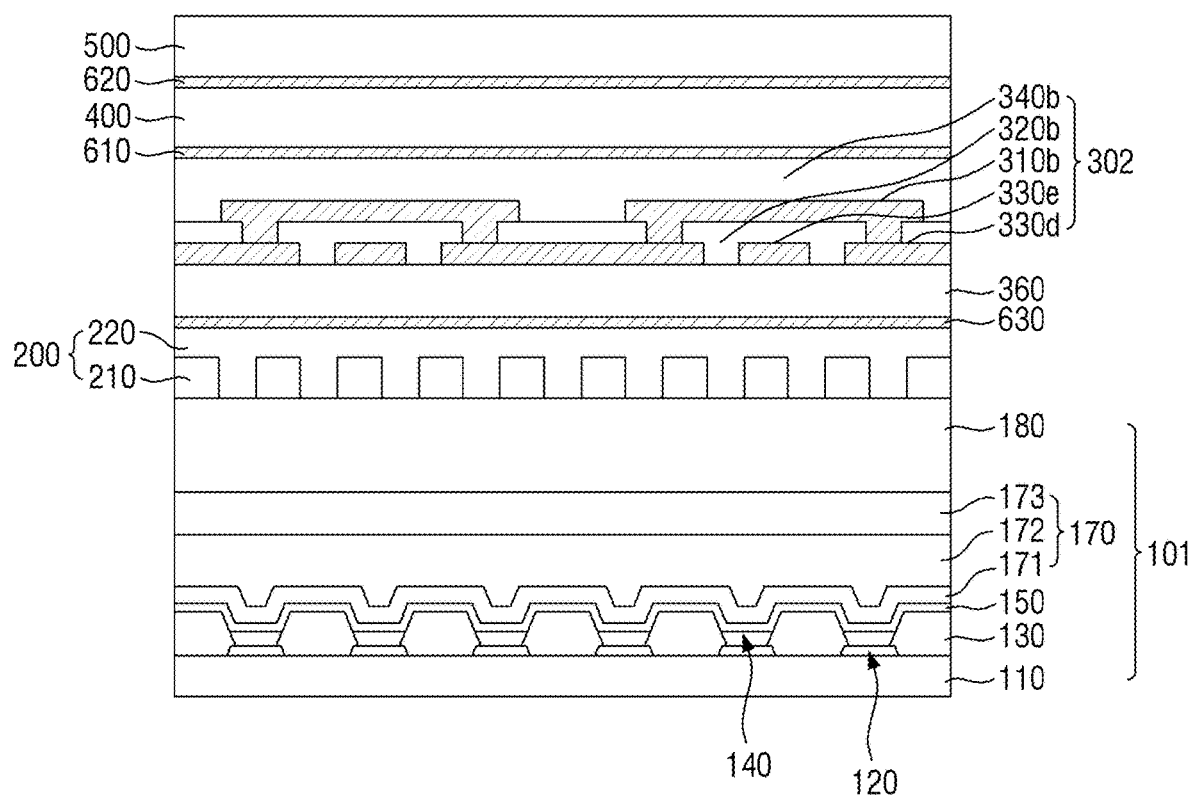
FIG. 42A, FIG. 42B, FIG. 42C, FIG. 42D, FIG. 42E, FIG. 42F, and FIG. 42G are cross-sectional views of display devices according to other exemplary embodiments of the inventive concept.

Referring to FIG. 42A, a diffraction pattern layer 200 may be disposed on a display panel 101. In one exemplary embodiment, the diffraction pattern layer 200 and the display panel 101 may be formed by a continuous process.

A second input sensing layer 302 may be disposed on the diffraction pattern layer 200. In one exemplary embodiment, the second input sensing layer 302 may be coupled to the diffraction pattern layer 200 via a third adhesive member 630. A base layer 360 may be disposed between the second input sensing layer 302 and the third adhesive member 630. The base layer 360 may provide a base surface for the second input sensing layer 302. In one exemplary embodiment, the base layer 360 may include a film-type retarder. The second input sensing layer 302 and the base layer 360 may be formed by a continuous process.

In a case where the third adhesive member 630 is not provided, the second input sensing layer 302, the base layer 360, and the diffraction pattern layer 200 may be formed by a continuous process.

An anti-reflection panel 400 may be coupled to the first input sensing layer 301 via a first adhesive member 610. In one exemplary embodiment, the base layer 360, the second input sensing layer 302, and the anti-reflection panel 400 may be formed by a continuous process. In another exemplary embodiment, the anti-reflection panel 400 may be formed by a separate process from the base layer 360 and the second input sensing layer 302, and may then be coupled to the base layer 360 and the second input sensing layer 302.

A window panel 500 may be coupled to the anti-reflection panel 400 via a second adhesive member 620.

Figure 42B:
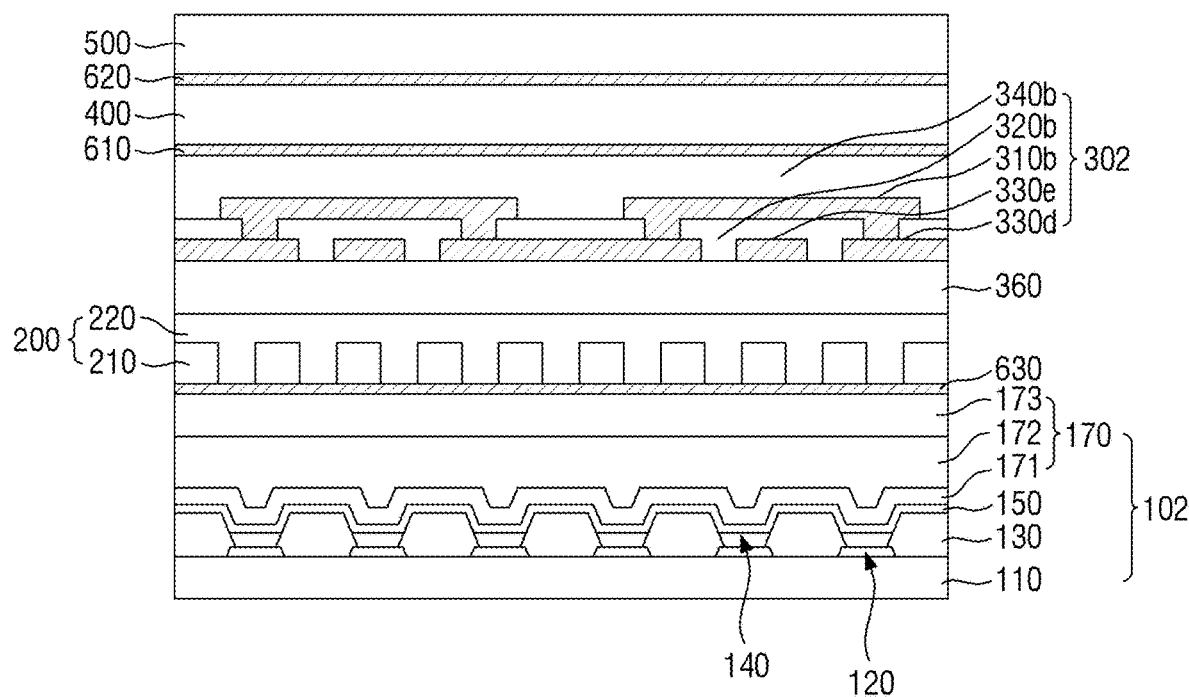

Referring to FIG. 42B, a diffraction pattern layer 200 may be disposed on a third adhesive member 630 and a base layer 360. In one exemplary embodiment, the diffraction pattern layer 200, a second input sensing layer 302, and the base layer 360 may be formed by a continuous process. In another exemplary embodiment, the diffraction pattern layer 200, the second input sensing layer 302, the base layer 360, and an anti-reflection panel 400 may be formed by a continuous process.

Figure 42C:
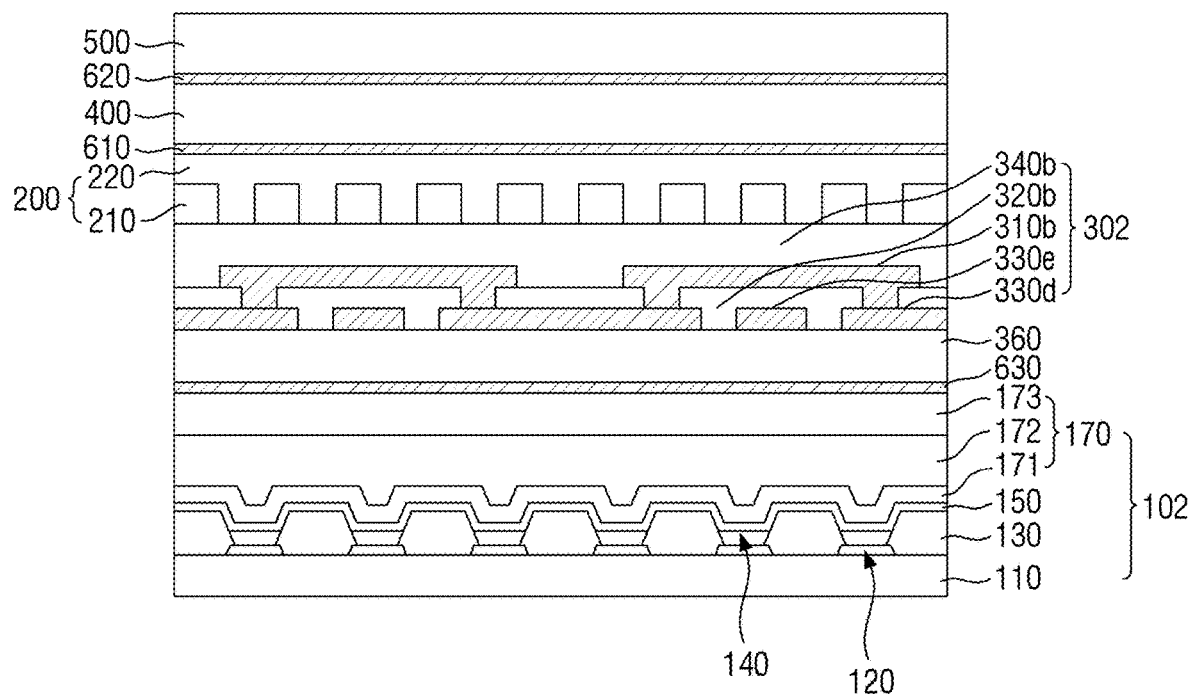

Referring to FIG. 42C, a diffraction pattern layer 200 may be disposed on a second input sensing layer 302. That is, the diffraction pattern layer 200 may be disposed directly on the second input sensing layer 302. Although not specifically illustrated, an additional passivation layer may be disposed between the diffraction pattern layer 200 and the second input sensing layer 302.

Figure 42D:
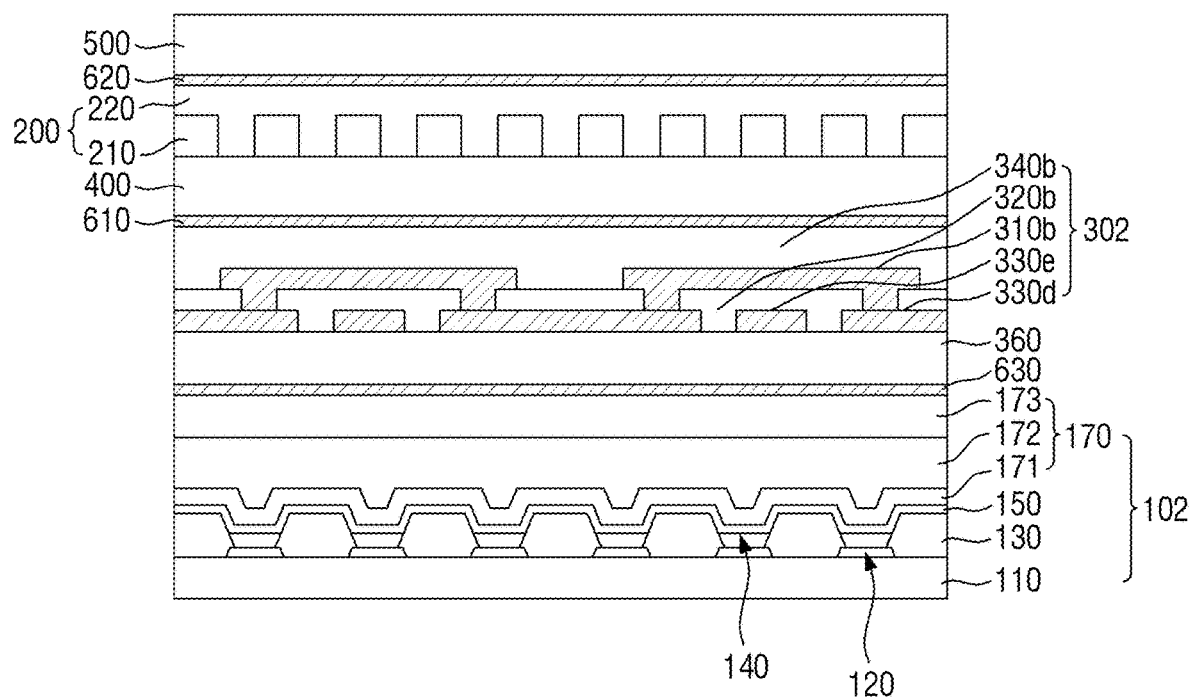

Referring to FIG. 42D, a diffraction pattern layer 200 may be disposed on an anti-reflection panel 400. Although not specifically illustrated, an additional passivation layer may be disposed between the anti-reflection panel 400 and the diffraction pattern layer 200. In one exemplary embodiment, the diffraction pattern layer 200 and the anti-reflection panel 400 may be formed by a continuous process.

Figure 42E:
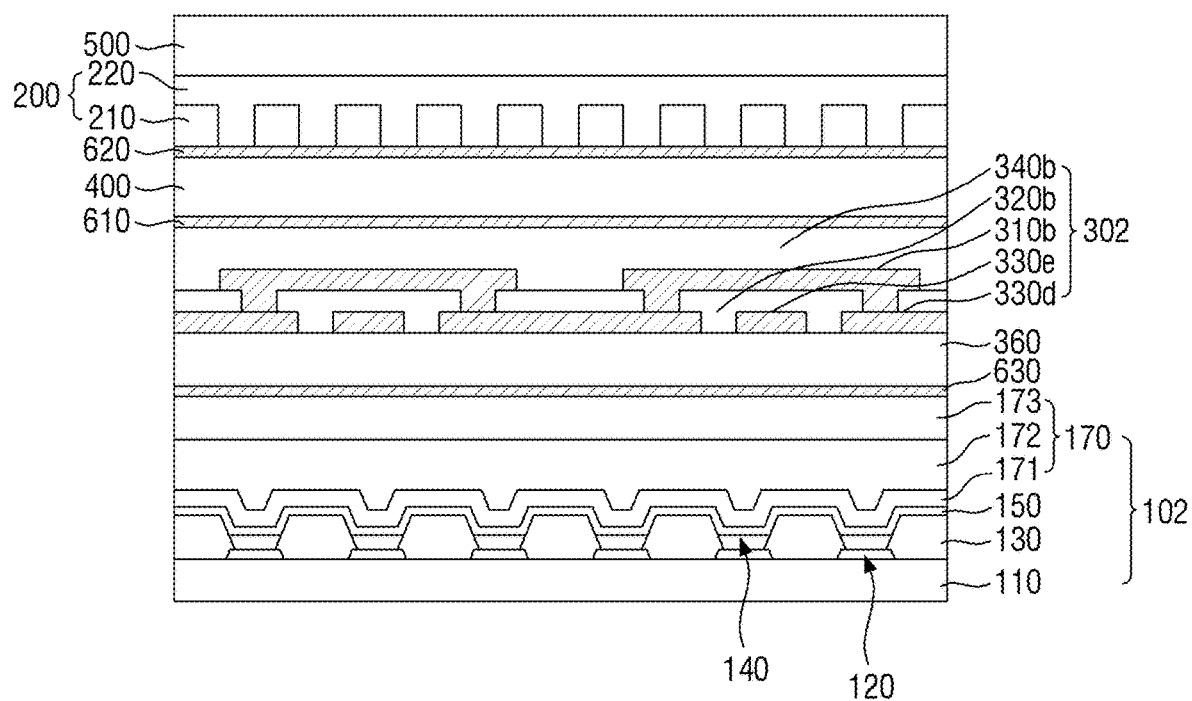

Referring to FIG. 42E, a diffraction pattern layer 200 may be disposed between a second adhesive member 620 and a window panel 500. In one exemplary embodiment, the diffraction pattern layer 200 and the window panel 500 may be formed by a continuous process.

Figure 42F:
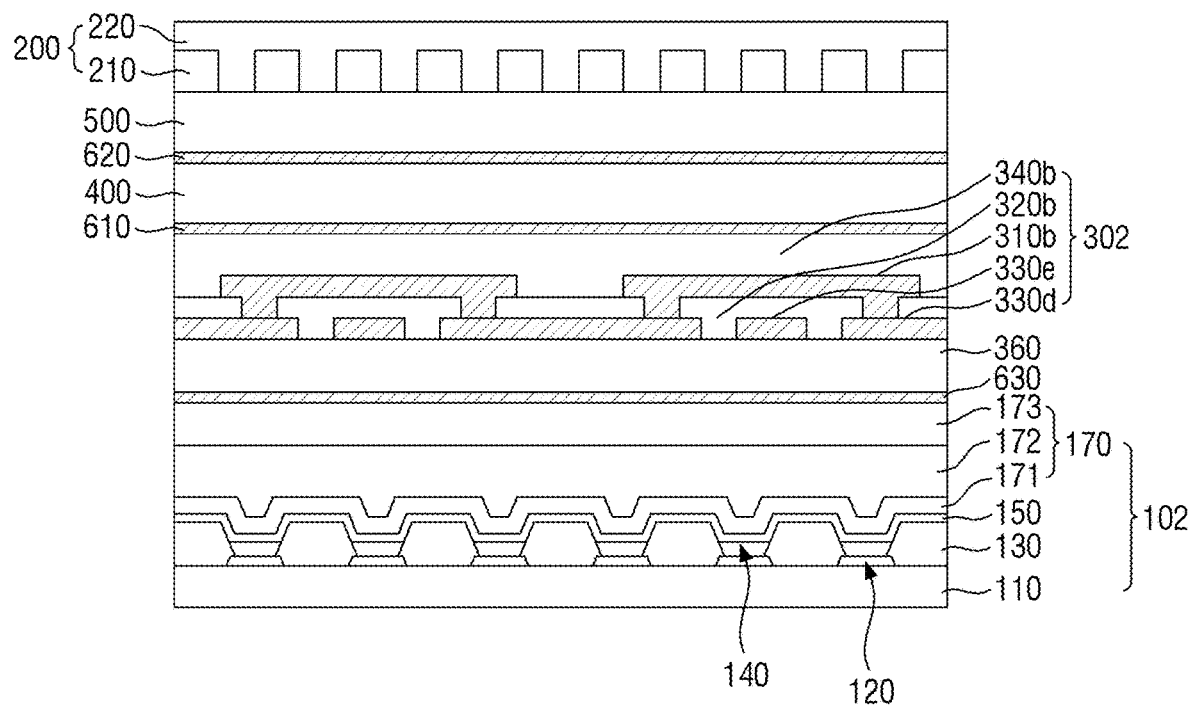

Referring to FIG. 42F, a diffraction pattern layer 200 may be disposed on a window panel 500. In one exemplary embodiment, the diffraction pattern layer 200 may be attached on the window panel 500 in the form of a film. In another exemplary embodiment, a plurality of diffraction patterns 210 may be formed by depositing an inorganic film on the window panel 500 and etching the inorganic film. In another exemplary embodiment, the diffraction patterns 210 may be formed by etching the window panel 500, in which case, the diffraction patterns 210 and the window panel 500 may comprise the same material.

Figure 42G:
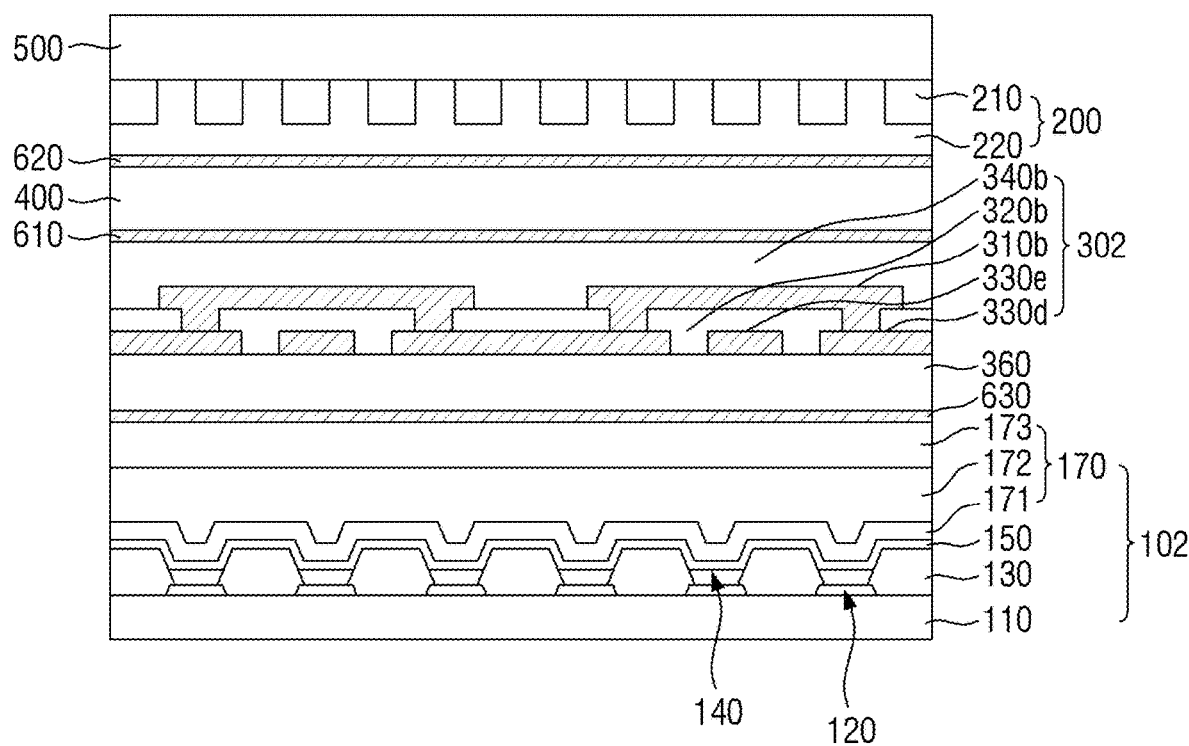

Referring to FIG. 42G, a diffraction pattern layer 200 may be disposed below a window panel 500, and a plurality of diffraction patterns 210 may protrude from the bottom surface of the window panel 500. A method to form the diffraction pattern layer 200 is not particularly limited. In one exemplary embodiment, the diffraction pattern layer 200 may be attached on the bottom of the window panel 500 in the form of a film. In another exemplary embodiment, the diffraction patterns 210 may be formed by depositing an inorganic film at the bottom of the window panel 500 and etching the inorganic film. In another exemplary embodiment, the diffraction patterns 210 may be formed by etching the window panel 500, in which case, the diffraction patterns 210 and the window panel 500 may comprise the same material.

Although not specifically illustrated, the display devices of FIGS. 42A through 42G may include a display panel 100 having a first encapsulation layer 160, instead of the display panel 101 (or 102) having a second encapsulation layer 170.

Although not specifically illustrated, the diffraction pattern layer 200 may include a plurality of diffraction patterns 210 extending from the bottom of a particular element toward the display panel 100, as illustrated in FIG. 42G. That is, the diffraction patterns 210 may be formed to extend from the anti-reflection panel 400, the input sensing layer 300, or another element (for example, a base layer) toward the display panel 100.

FIGS. 43A through 43F are cross-sectional views of display devices according to other exemplary embodiments of the inventive concept. The display devices of FIGS. 43B through 43F include the same elements, but differ from one another in the order in which those elements are stacked. The display device of FIG. 42A includes a display panel 101 having a second buffer layer 180, whereas the display devices of FIGS. 43B through 43F include a display panel 102 having no second buffer layer 180. However, the inventive concept is not limited to this. That is, the second buffer layer 180 may not be omitted even from the display device of FIG. 43A. Also, the second buffer layer 180 may be included even in the display devices of FIGS. 43B through 43F.

Referring to FIGS. 43A through 43F, a display panel 101 (or 102) may include a second encapsulation layer 170. In one exemplary embodiment, the second encapsulation layer 170 may include a first inorganic layer 171, an organic layer 172, and a second inorganic layer 173.

Figure 43A:
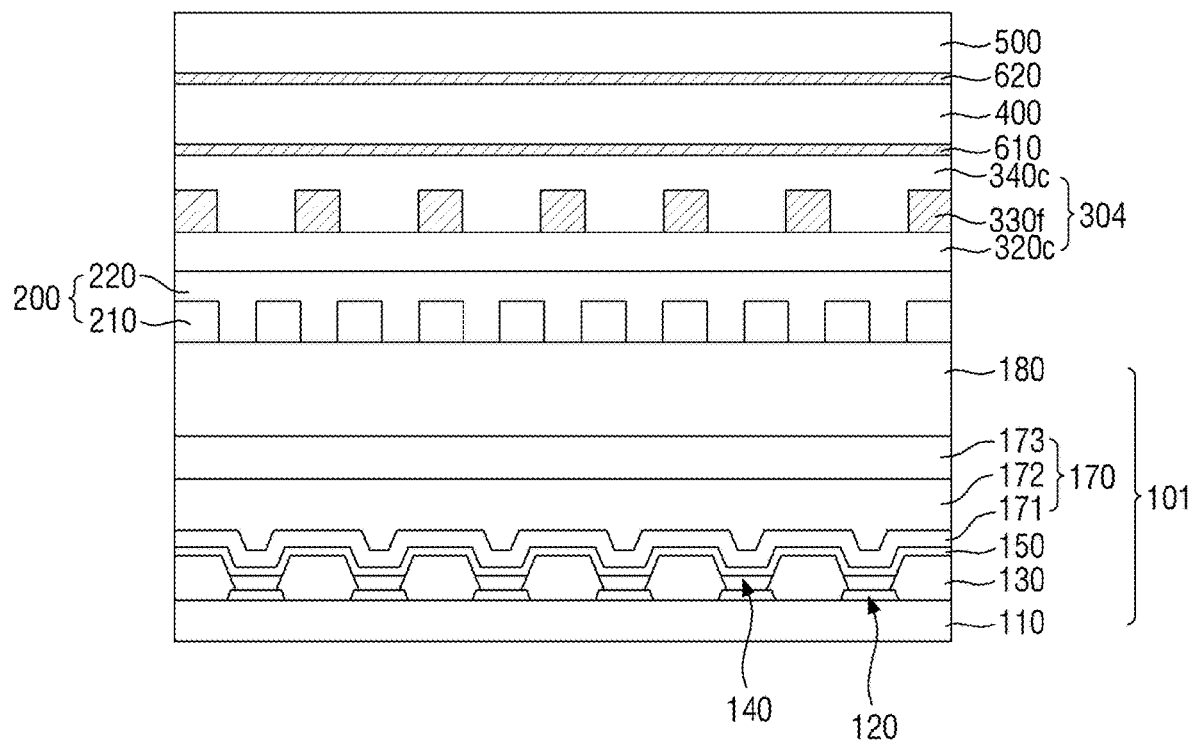
FIG. 43A, FIG. 43B, FIG. 43C, FIG. 43D, FIG. 43E, and FIG. 43F are cross-sectional views of display devices according to other exemplary embodiments of the inventive concept.

Referring to FIG. 43A, a diffraction pattern layer 200 may be disposed on a display panel 101. In one exemplary embodiment, the diffraction pattern layer 200 and the display panel 101 may be formed by a continuous process. A fourth input sensing layer 304 may be disposed on the diffraction pattern layer 200. Although not specifically illustrated, an additional passivation layer may be disposed between the fourth input sensing layer 304 and the diffraction pattern layer 200.

In one exemplary embodiment, the display panel 101, the diffraction pattern layer 200 and the anti-reflection panel 400 may be formed by a continuous process.

The anti-reflection panel 400 may be coupled to the first input sensing layer 301 via a first adhesive member 610. The window panel 500 may be coupled to the anti-reflection panel 400 via a second adhesive member 620.

Figure 43B:
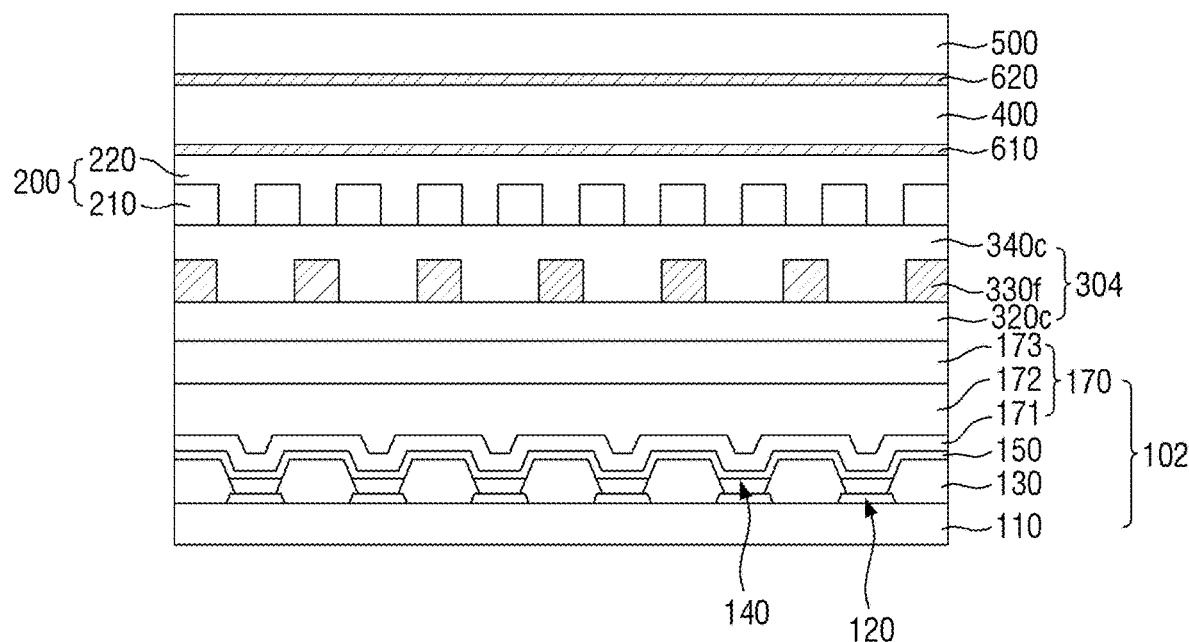

Referring to FIG. 43B, a diffraction pattern layer 200 may be disposed on a fourth input sensing layer 304. That is, the fourth input sensing layer 304 may be disposed directly on a second encapsulation layer 170. Although not specifically illustrated, an additional passivation layer may be disposed between an anti-reflection panel 400 and the diffraction pattern layer 200.

Figure 43C:
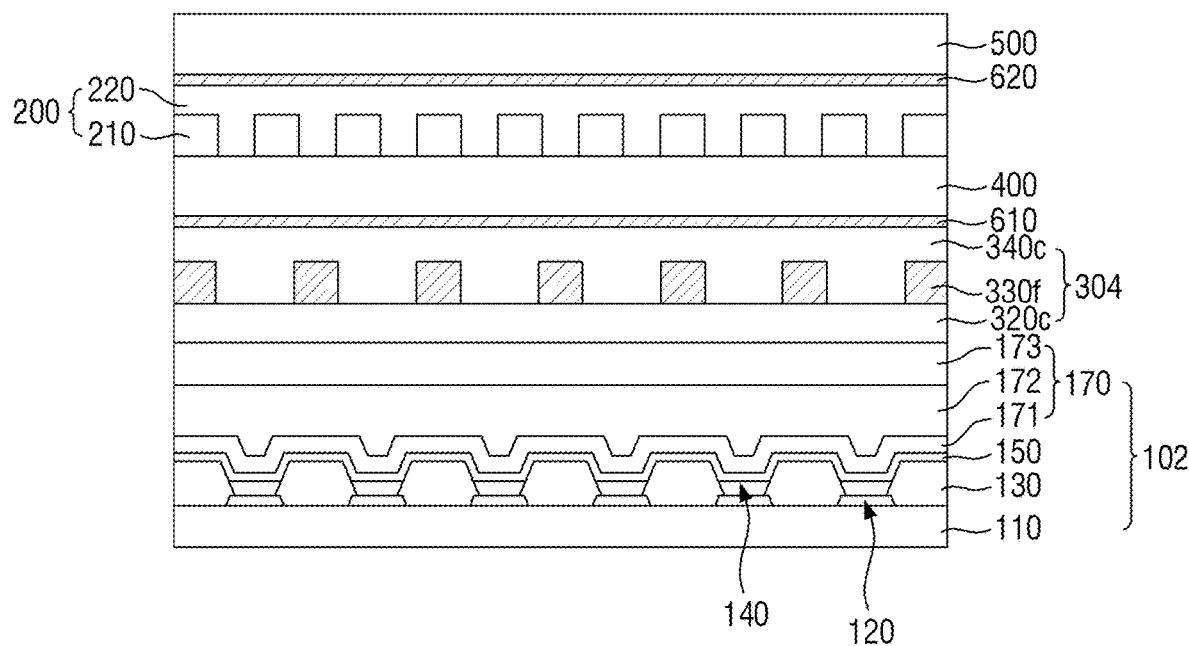

Referring to FIG. 43C, a diffraction pattern layer 200 may be disposed on an anti-reflection panel 400. Although not specifically illustrated, an additional passivation layer may be disposed between the anti-reflection panel 400 and the diffraction pattern layer 200. In one exemplary embodiment, the diffraction pattern layer 200 and the anti-reflection panel 400 may be formed by a continuous process.

Figure 43D:
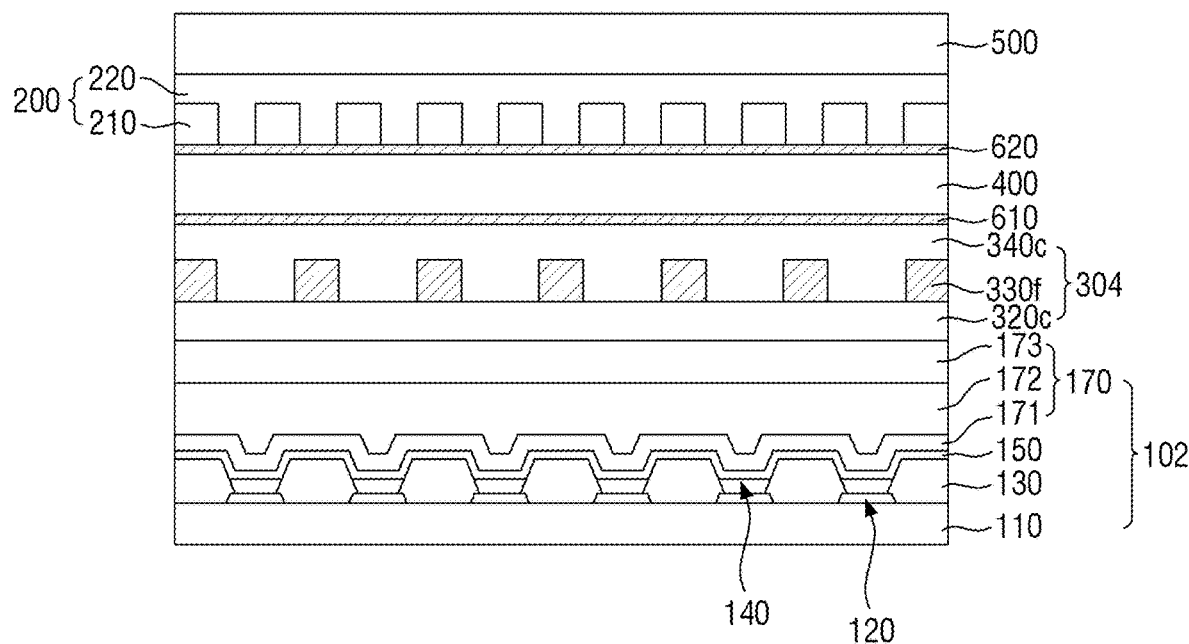

Referring to FIG. 43D, a diffraction pattern layer 200 may be disposed between a second adhesive member 620 and a window panel 500. In one exemplary embodiment, the diffraction pattern layer 200 and the window panel 500 may be formed by a continuous process.

Figure 43E:
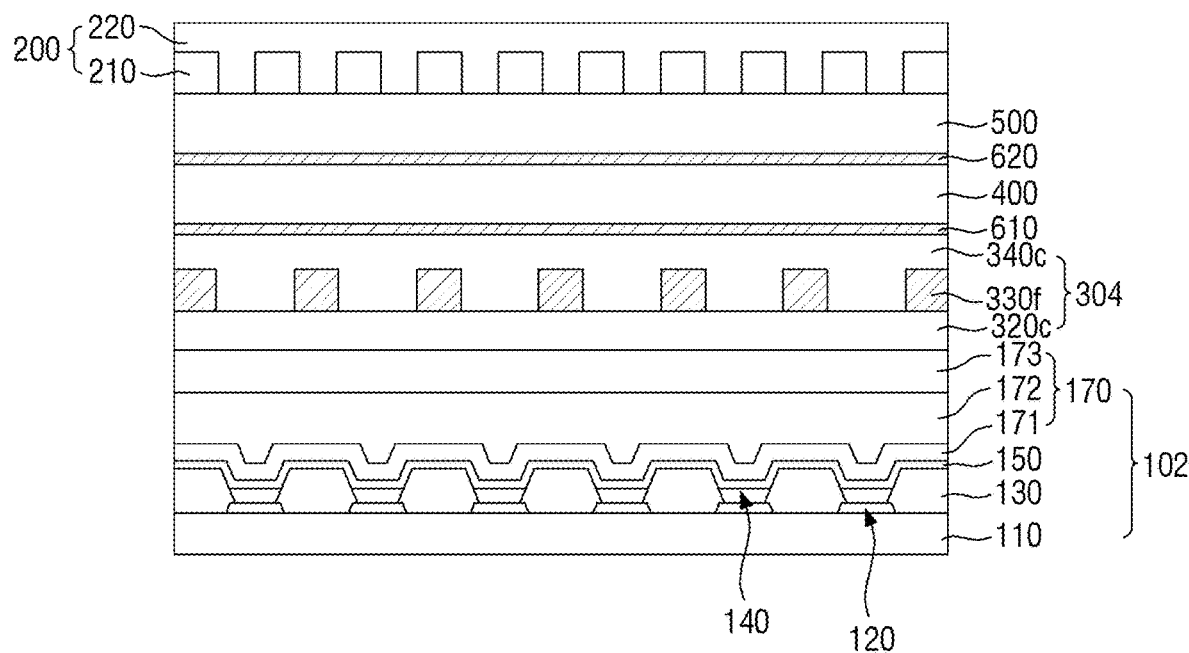

Referring to FIG. 43E, a diffraction pattern layer 200 may be disposed on a window panel 500. In one exemplary embodiment, the diffraction pattern layer 200 may be attached on the window panel 500 in the form of a film. In another exemplary embodiment, a plurality of diffraction patterns 210 may be formed by depositing an inorganic film on the window panel 500 and etching the inorganic film. In another exemplary embodiment, the diffraction patterns 210 may be formed by etching the window panel 500, in which case, the diffraction patterns 210 and the window panel 500 may comprise the same material.

Figure 43F:
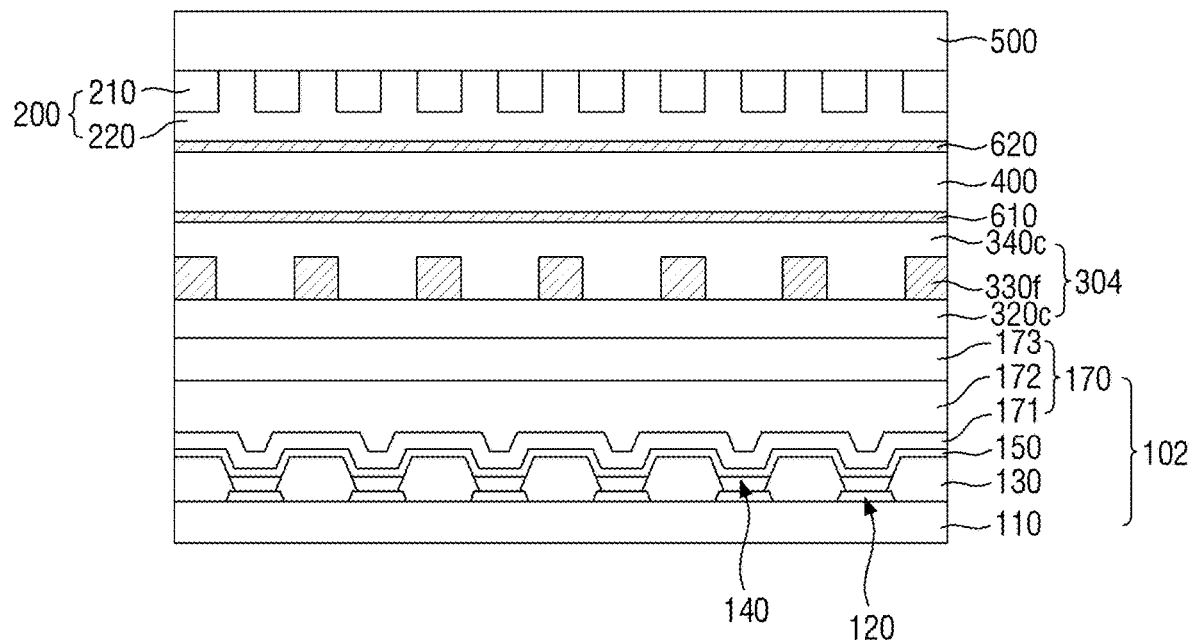

Referring to FIG. 43F, a diffraction pattern layer 200 may be disposed below a window panel 500, and a plurality of diffraction patterns 210 may protrude from the bottom surface of the window panel 500. A method to form the diffraction pattern layer 200 is not particularly limited. In one exemplary embodiment, the diffraction pattern layer 200 may be attached on the bottom of the window panel 500 in the form of a film. In another exemplary embodiment, the diffraction patterns 210 may be formed by depositing an inorganic film at the bottom of the window panel 500 and etching the inorganic film. In another exemplary embodiment, the diffraction patterns 210 may be formed by etching the window panel 500, in which case, the diffraction patterns 210 and the window panel 500 may comprise the same material.

Although not specifically illustrated, the diffraction pattern layer 200 may include a plurality of diffraction patterns 210 extending from the bottom of a particular element toward a display panel 100, as illustrated in FIG. 43F. That is, the diffraction patterns 210 may be formed to extend from the anti-reflection panel 400, the input sensing layer 300, or another element (for example, a base layer) toward the display panel 100.

FIGS. 44A through 44F are cross-sectional views of display devices according to other exemplary embodiments of the inventive concept. The display devices of FIGS. 44B through 44F include the same elements, but differ from one another in the order in which those elements are stacked. The display device of FIG. 44A includes a display panel 101 having a second buffer layer 180, whereas the display devices of FIGS. 44B through 44F include a display panel 102 having no second buffer layer 180. However, the inventive concept is not limited to this. That is, the second buffer layer 180 may not be omitted even from the display device of FIG. 44A. Also, the second buffer layer 180 may be included even in the display devices of FIGS. 44B through 44F.

Figure 44A:
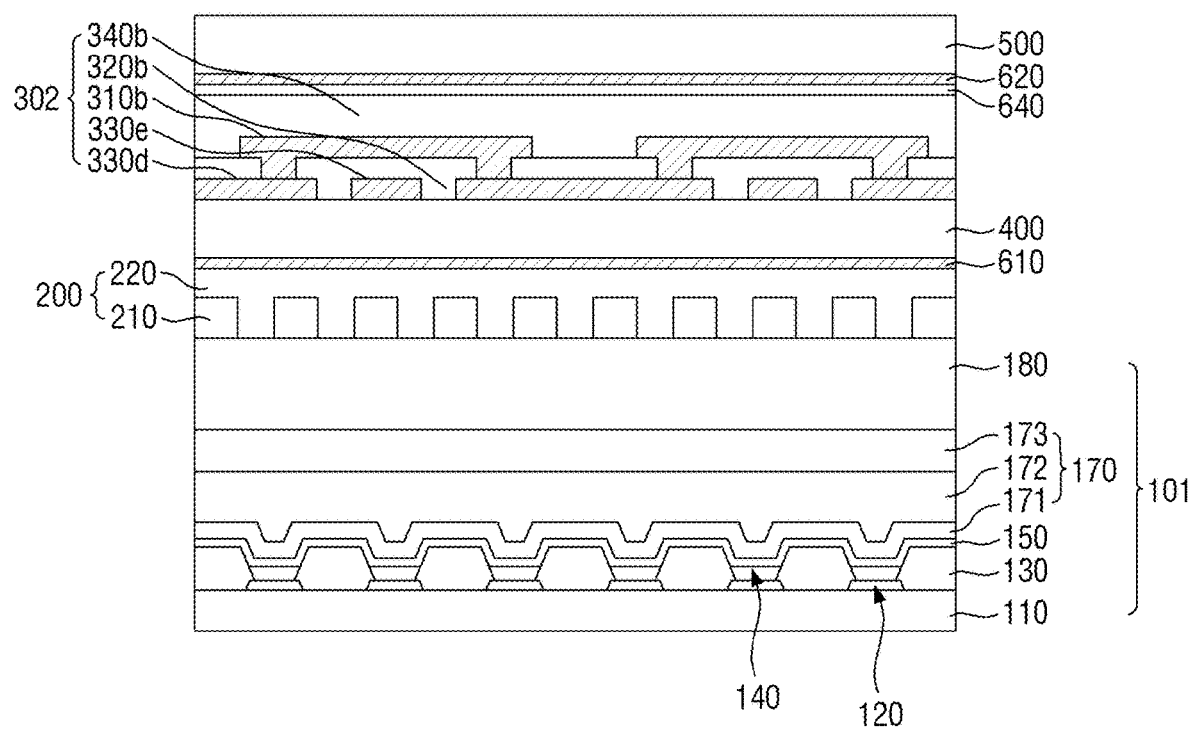
FIG. 44A, FIG. 44B, FIG. 44C, FIG. 44D, FIG. 44E, and FIG. 44F are cross-sectional views of display devices according to other exemplary embodiments of the inventive concept.

Referring to FIG. 44A, a diffraction pattern layer 200 may be disposed on a display panel 101. In one exemplary embodiment, the diffraction pattern layer 200 and the display panel 101 may be formed by a continuous process.

An anti-reflection panel 400 may be coupled to the diffraction pattern layer 200 via a first adhesive member 610. That is, the anti-reflection panel 400 may be disposed below a second input sensing layer 302.

The second input sensing layer 302 may be disposed on the anti-reflection panel 400. Although not specifically illustrated, an additional passivation layer may be disposed between the anti-reflection panel 400 and the second input sensing layer 302.

A reinforcing film 640 may be disposed on the second input sensing layer 302. The reinforcing film 640 may be formed by the same process as the second input sensing layer 302. The reinforcing film 640 may not be provided.

The window panel 500 may be coupled to the reinforcing film 640 via a second adhesive member 620.

Figure 44B:
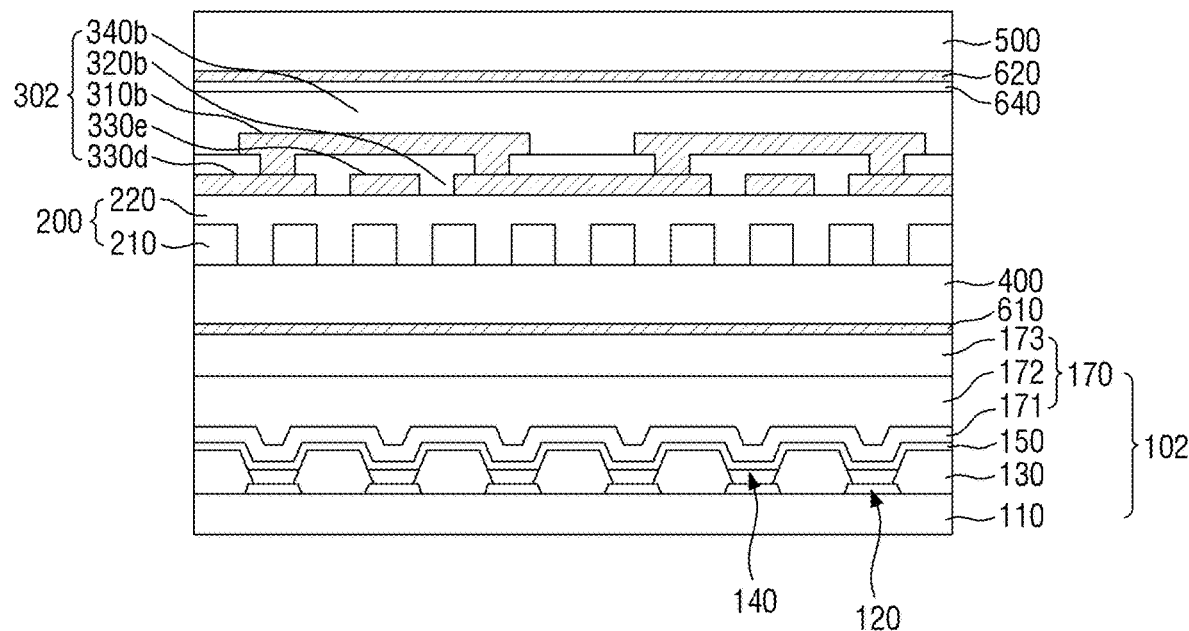

Referring to FIG. 44B, a diffraction pattern layer 200 may be disposed on an anti-reflection panel 400. That is, the anti-reflection panel 400 may be directly coupled to a display panel 102 via a first adhesive member 610. The diffraction pattern layer 200 and the anti-reflection panel 400 may be formed by a continuous process, or the diffraction pattern layer 200 and the second input sensing layer 302 may be formed by a continuous process.

Figure 44C:
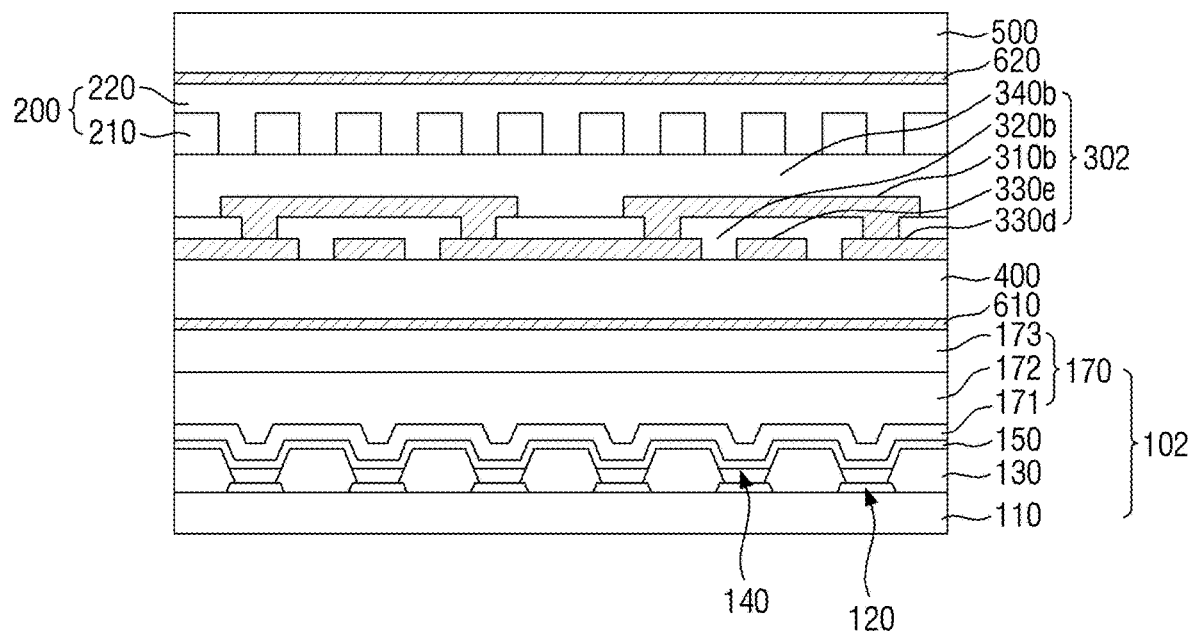

Referring to FIG. 44C, a diffraction pattern layer 200 may be disposed on a second input sensing layer 302. In one exemplary embodiment, the diffraction pattern layer 200 and the second input sensing layer 302 may be formed by a continuous process.

Figure 44D:
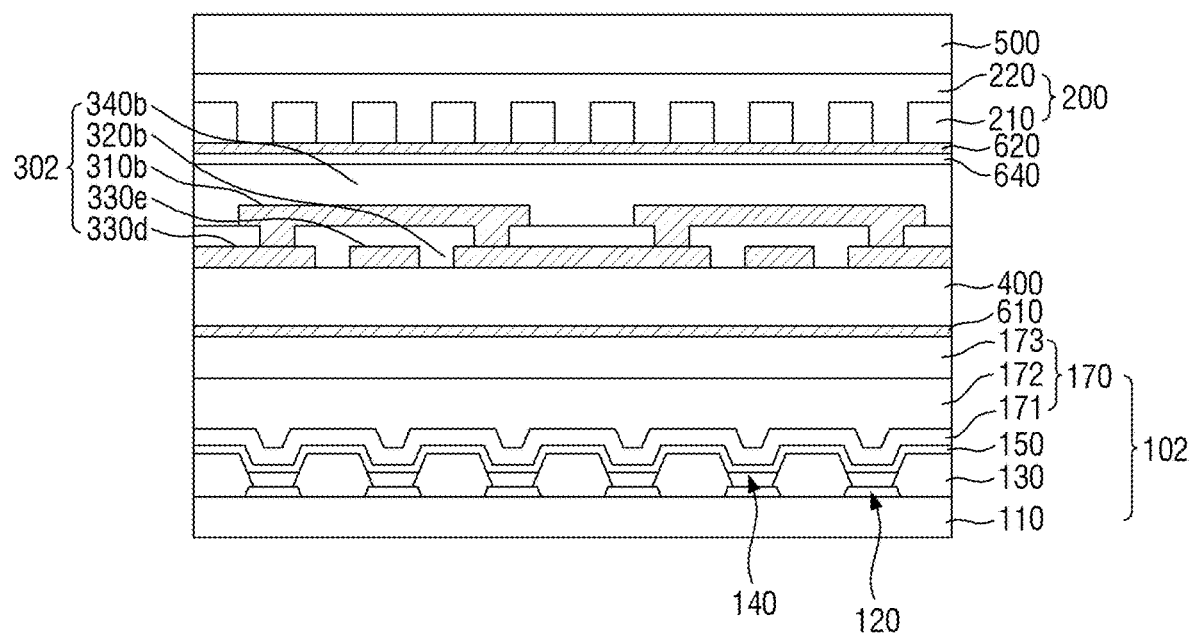

Referring to FIG. 44D, a diffraction pattern layer 200 may be disposed between a second adhesive member 620 and a window panel 500. In one exemplary embodiment, the diffraction pattern layer 200 and the window panel 500 may be formed by a continuous process.

Figure 44E:
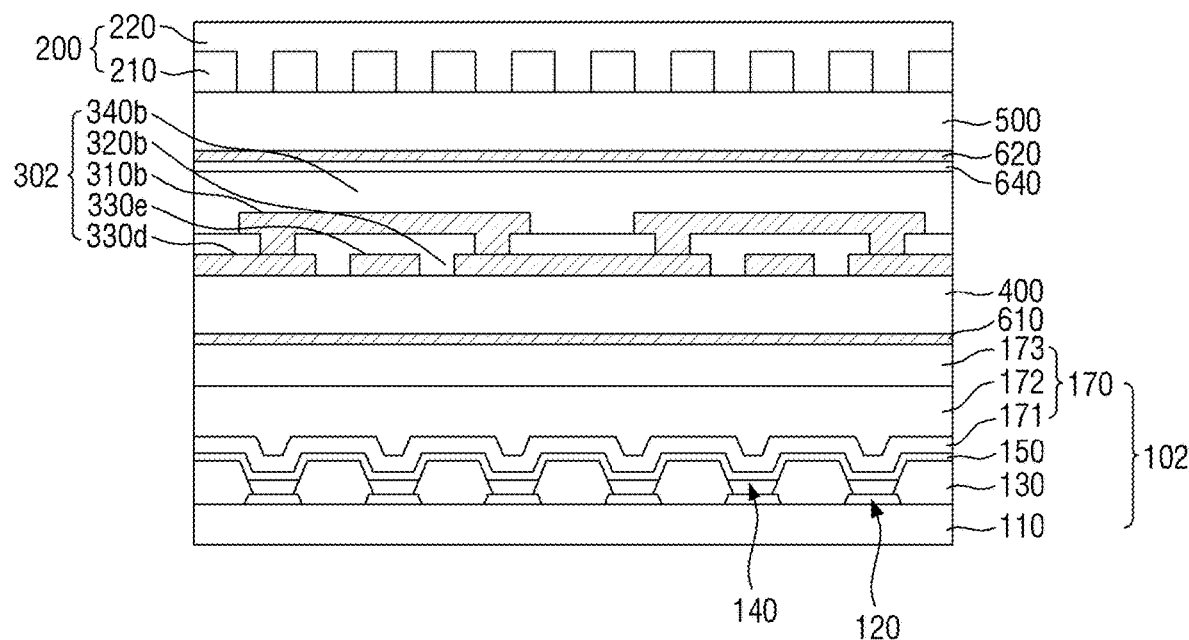

Referring to FIG. 44E, a diffraction pattern layer 200 may be disposed on a window panel 500. In one exemplary embodiment, the diffraction pattern layer 200 may be attached on the window panel 500 in the form of a film. In another exemplary embodiment, a plurality of diffraction patterns 210 may be formed by depositing an inorganic film on the window panel 500 and etching the inorganic film. In another exemplary embodiment, the diffraction patterns 210 may be formed by etching the window panel 500, in which case, the diffraction patterns 210 and the window panel 500 may comprise the same material.

Figure 44F:
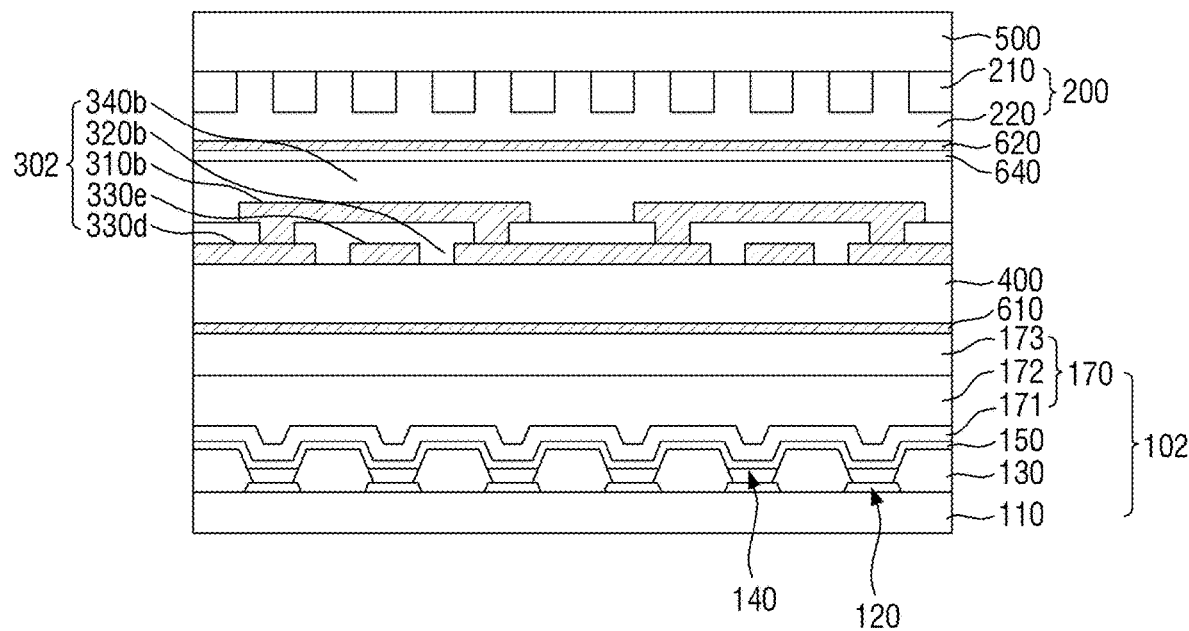

Referring to FIG. 44F, a diffraction pattern layer 200 may be disposed below a window panel 500, and a plurality of diffraction patterns 210 may protrude from the bottom surface of the window panel 500. A method to form the diffraction pattern layer 200 is not particularly limited. In one exemplary embodiment, the diffraction pattern layer 200 may be attached on the bottom of the window panel 500 in the form of a film. In another exemplary embodiment, the diffraction patterns 210 may be formed by depositing an inorganic film at the bottom of the window panel 500 and etching the inorganic film. In another exemplary embodiment, the diffraction patterns 210 may be formed by etching the window panel 500, in which case, the diffraction patterns 210 and the window panel 500 may comprise the same material.

Although not specifically illustrated, the display devices of FIGS. 44A through 44G may include a display panel 100 having a first encapsulation layer 160, instead of the display panel 101 (or 102) having a second encapsulation layer 170.

Although not specifically illustrated, the diffraction pattern layer 200 may include a plurality of diffraction patterns 210 extending from the bottom of a particular element toward a display panel 100, as illustrated in FIG. 44F. That is, the diffraction patterns 210 may be formed to extend from the anti-reflection panel 400, the input sensing layer 300, or another element (for example, a base layer) toward the display panel 100.

Figure 45A:
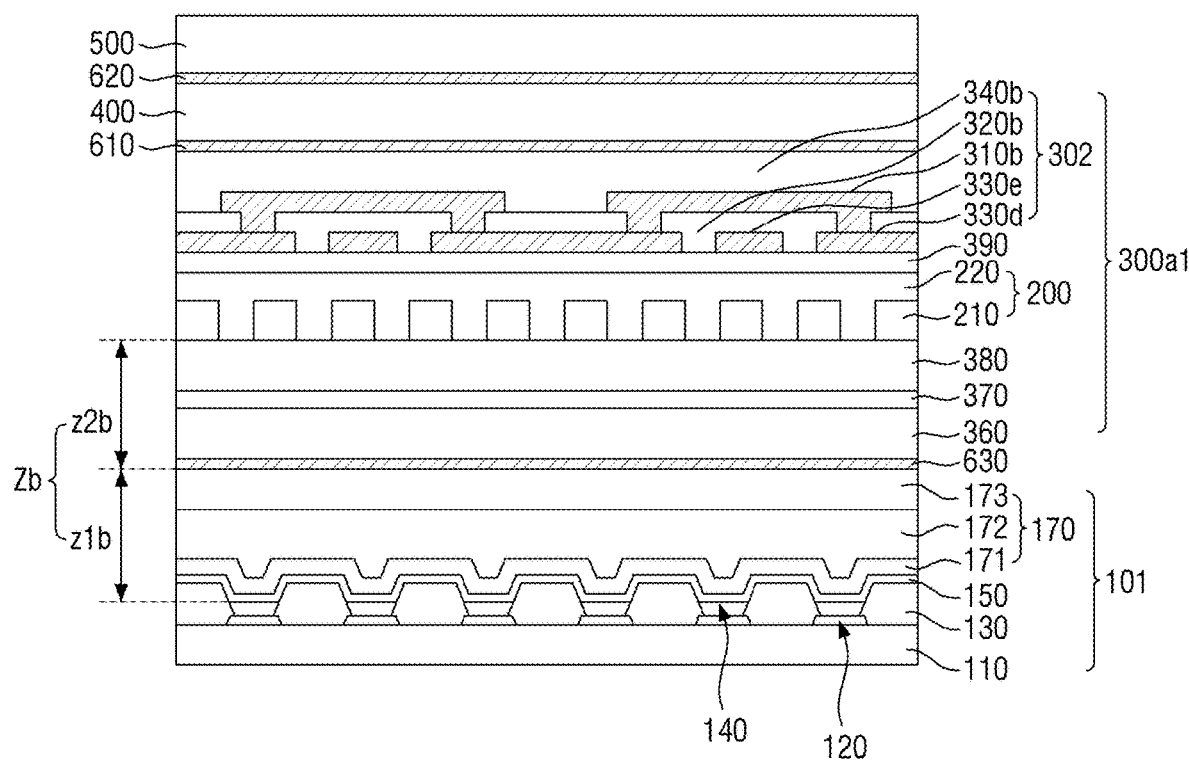
FIG. 45A is a cross-sectional view of a display device according to another exemplary embodiment of the inventive concept.

FIG. 45A is a cross-sectional view of a display device according to another exemplary embodiment of the inventive concept. Descriptions of elements that have already been described with reference to FIGS. 1 through 44F will be omitted. An input sensing panel 300a1 of FIG. 45A may be an example of the input sensing panel 300a of FIG. 39.

Referring to FIG. 45A, a display panel 101 may include a second encapsulation layer 170 in which a plurality of organic/inorganic layers are stacked. The input sensing panel 300a1 may be disposed on the display panel 101. Specifically, the input sensing panel 300a1 and the display panel 101 may be coupled to each other via a third adhesive member 630.

The input sensing panel 300a may include a first input sensing layer 301, a diffraction pattern layer 200, a base layer 360, an adhesive layer 370, a sixth passivation layer 380, and a seventh passivation layer 390.

The base layer 360 may provide a base surface of the input sensing panel 300a. In one exemplary embodiment, the base layer 360 may include a film-type retarder.

The adhesive layer 370 may be disposed between the base layer 360 and the sixth passivation layer 380 to couple the base layer 360 and the sixth passivation layer 380. In one exemplary embodiment, the adhesive layer 370 may be an ultraviolet (UV) adhesive. The adhesive layer 370 may not be provided.

The sixth passivation layer 380 may be coupled to the base layer 360 via the adhesive layer 370. In one exemplary embodiment, the sixth passivation layer 380 may comprise a polymer organic material. The polymer organic material may include at least one selected from the group consisting of PI, polyvinyl alcohol (PVA), polyamic acid, polyamide (PA), polyethylene (PE), polystylene (PS), polynorbornene (PNBE), a phenylmaleimide copolymer, polyazobenzene, polyphenylenephthalamide, polyester, polymethyl methacrylate (PMMA), polyarylate, a cinnamate-based polymer, a coumarin-based polymer, a phthalimidine-based polymer, a chalcone-based polymer, and an aromatic acetylene-based polymer.

The sixth passivation layer 380 may protect the diffraction pattern layer 200 and the first input sensing layer 301 from external contact. In one exemplary embodiment, the input sensing panel 300a1 may include an additional passivation layer, which is disposed between the sixth passivation layer 380 and the first input sensing layer 301 and protects the first input sensing layer 301 from external contact. The sixth passivation layer 380 may not be provided.

The diffraction pattern layer 200 may be included in the input sensing panel 300a1 as an element. That is, the diffraction pattern layer 200 may be formed on the sixth passivation layer 380 by a continuous process during the fabrication of the input sensing panel 300a1.

The seventh passivation layer 390 may be disposed on the diffraction pattern layer 200. The seventh passivation layer 390 may protect the diffraction pattern layer 200 and the first input sensing layer 301 from external contact or impact. In one exemplary embodiment, the refractive index of the seventh passivation layer 390 may be between the refractive index of the diffraction pattern layer 200 and the refractive index of the first input sensing layer 301. The seventh passivation layer 390 may not be provided.

The first input sensing layer 301 may include a plurality of first sensing portions 330$d$ and a plurality of second connecting portions 330$e$, and the first sensing portions 330$d$ and the second connecting portions 330$e$ may be disposed on the same layer. A first insulating layer 320$b$ may be formed to cover the first sensing portions 330$d$ and the second connecting portions 330$e$. First connecting portions 310$b$ may be electrically connected to the first sensing portions 330$d$ through contact holes. A second insulating layer 340$b$ may be disposed on the first insulating layer 320$b$ and may be formed to cover the first connecting portions 310$b$.

An anti-reflection panel 400 may be coupled to the input sensing panel 300a1 via a first adhesive member 610. In one exemplary embodiment, the first adhesive member 610 may be a PSA member. In one exemplary embodiment, the anti-reflection panel 400 may include a film-type polarizer and a film-type retarder, but the inventive concept is not limited thereto. That is, the anti-reflection panel 400 may not include a polarizer or a polarizing layer. In one exemplary embodiment, the anti-reflection panel 400 may include a color filter transmitting light of a predetermined wavelength band therethrough.

The window panel 500 may be coupled to the anti-reflection panel 400 via a second adhesive member 620. In one exemplary embodiment, the second adhesive member 620 may be an OCA member.

Since the base layer 360, the adhesive layer 370, and the sixth passivation layer 380 are disposed between the diffraction pattern layer 200 and a plurality of organic light-emitting elements 140, a distance Zb between the organic light-emitting elements 140 and the diffraction pattern layer 200 increases, as compared to the display device of FIG. 2. As a result, a first diffraction distance β1 may be varied. The varied first diffraction distance may be defined as a sixth diffraction distance β6.

For convenience, when calculating the sixth diffraction distance β6, the refractive indexes of the elements included in the display panel 101 may be collectively considered a single factor and represented by the refractive index of the display panel 101, and it is assumed that the base layer 360, the adhesive layer 370, and the sixth passivation layer 380 have the same refractive index. The sixth diffraction distance β6 may be represented by Equation (14):

$$\beta 6 = z1b \cdot \tan[\sin^{-1}(\lambda/DP1 \cdot 1/n101)] + z2b \cdot \tan[\sin^{-1}(\lambda/DP1 \cdot 1/n380)] \quad \text{Equation (14)}$$

where n380 denotes the refractive index of the base layer 360, the adhesive layer 370, and the sixth passivation layer 380.

If the base layer 360, the adhesive layer 370, and the sixth passivation layer 380 have different refractive indexes, the sixth diffraction distance β6 may be controlled using the thicknesses and the refractive indexes of the base layer 360, the adhesive layer 370, and the sixth passivation layer 380.

Since the base layer 360, the adhesive layer 370, and the sixth passivation layer 380 are disposed between the diffraction pattern layer 200 and the organic light-emitting elements 140, the distance Zb between the organic light-emitting elements 140 and the diffraction pattern layer 200 can be sufficiently secured in the display panel 101. Accordingly, the second buffer layer 180 of FIG. 30 may not be provided, and as a result, the thickness of the display panel 101 may be reduced.

Figure 45B:
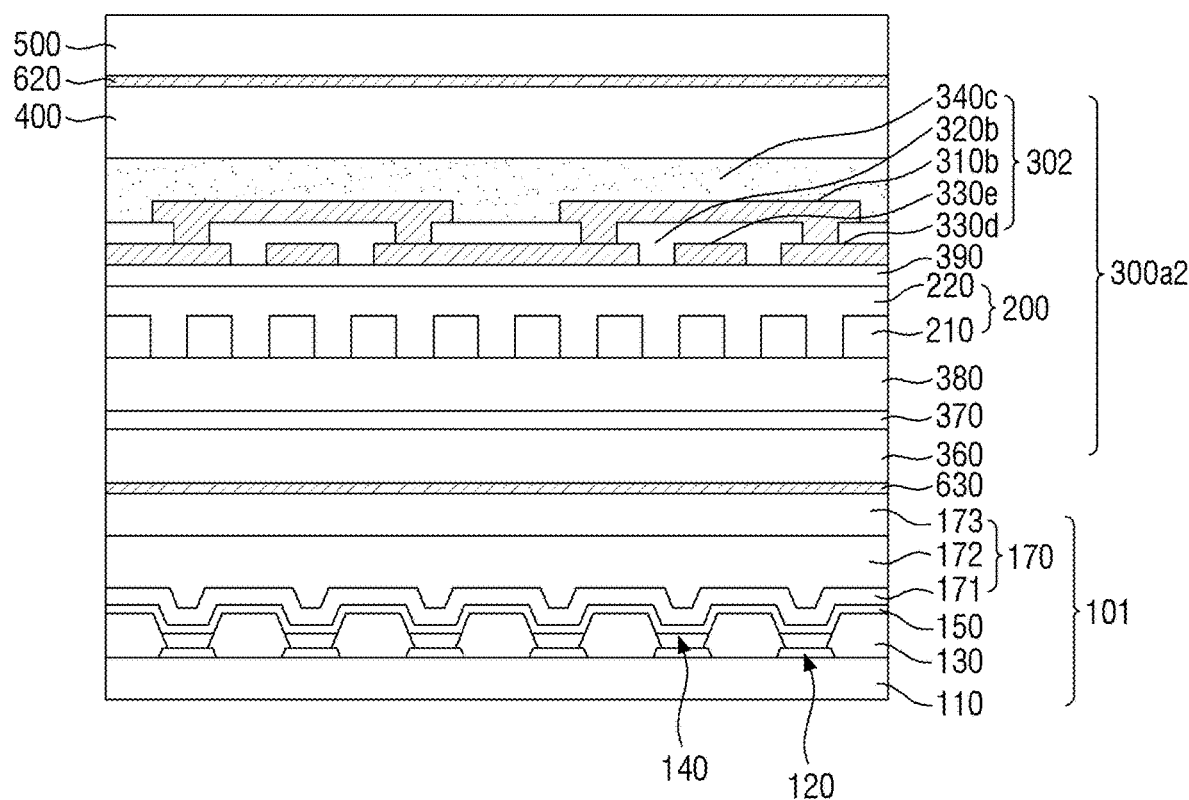
FIG. 45B is a cross-sectional view of a display device according to another exemplary embodiment of the inventive concept.

FIG. 45B is a cross-sectional view of a display device according to another exemplary embodiment of the inventive concept. Descriptions of elements that have already been described with reference to FIG. 45A will be omitted.

Referring to FIG. 45B, a sixth input sensing layer 306 may include a second insulating layer 340$d$ having an adhesive material. The second insulating layer 340$d$ may be placed in direct contact with an anti-reflection panel 400. Thus, an input sensing panel 300a2 and the anti-reflection panel 400 may be coupled to each other via a second insulating layer 340$d$. Although not specifically illustrated, an additional adhesive member may not be provided in a case where an insulating layer or a passivation layer including an adhesive material is provided.

Figure 46:
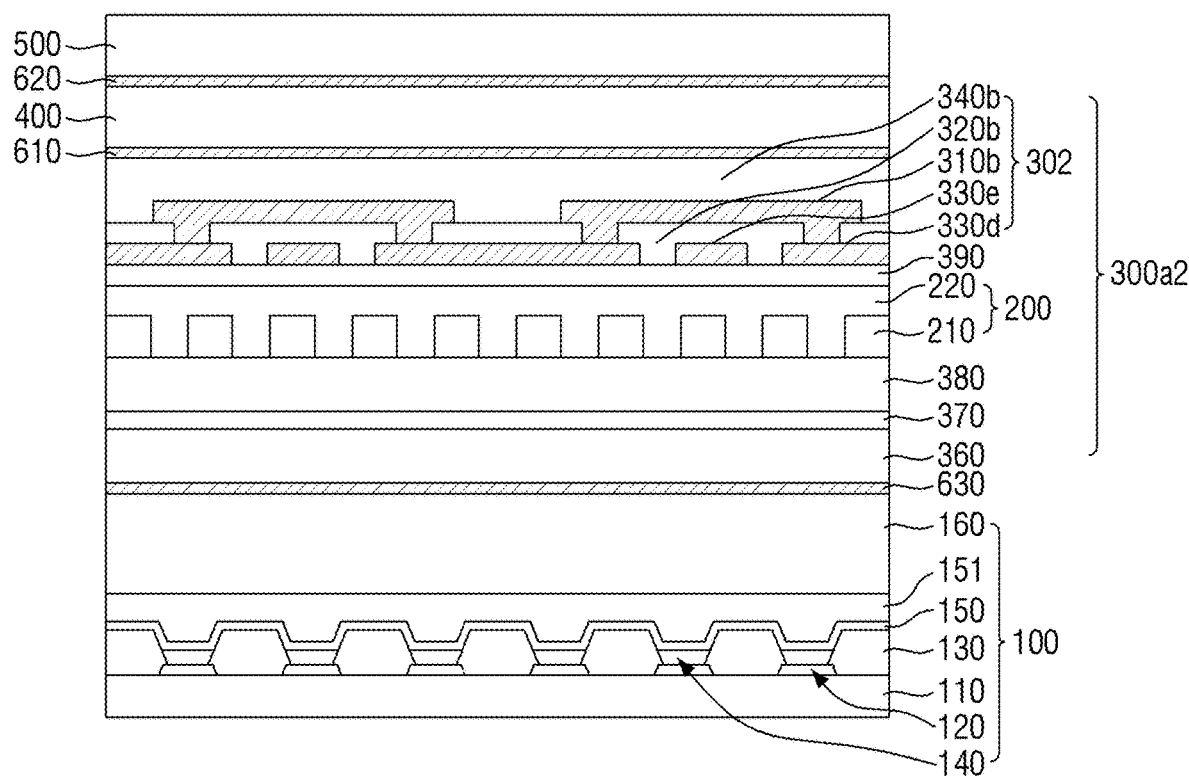
FIG. 46, FIG. 47, FIG. 48, FIG. 49, and FIG. 50 are cross-sectional views of display devices according to other exemplary embodiments of the inventive concept.

FIG. 46 is a cross-sectional view of a display device according to another exemplary embodiment of the inventive concept.

Referring to FIG. 46, the display panel 101 of FIG. 45A may be replaced with a display panel 100 including a first encapsulation layer 160, which may be formed as a glass insulating substrate.

Figure 47:
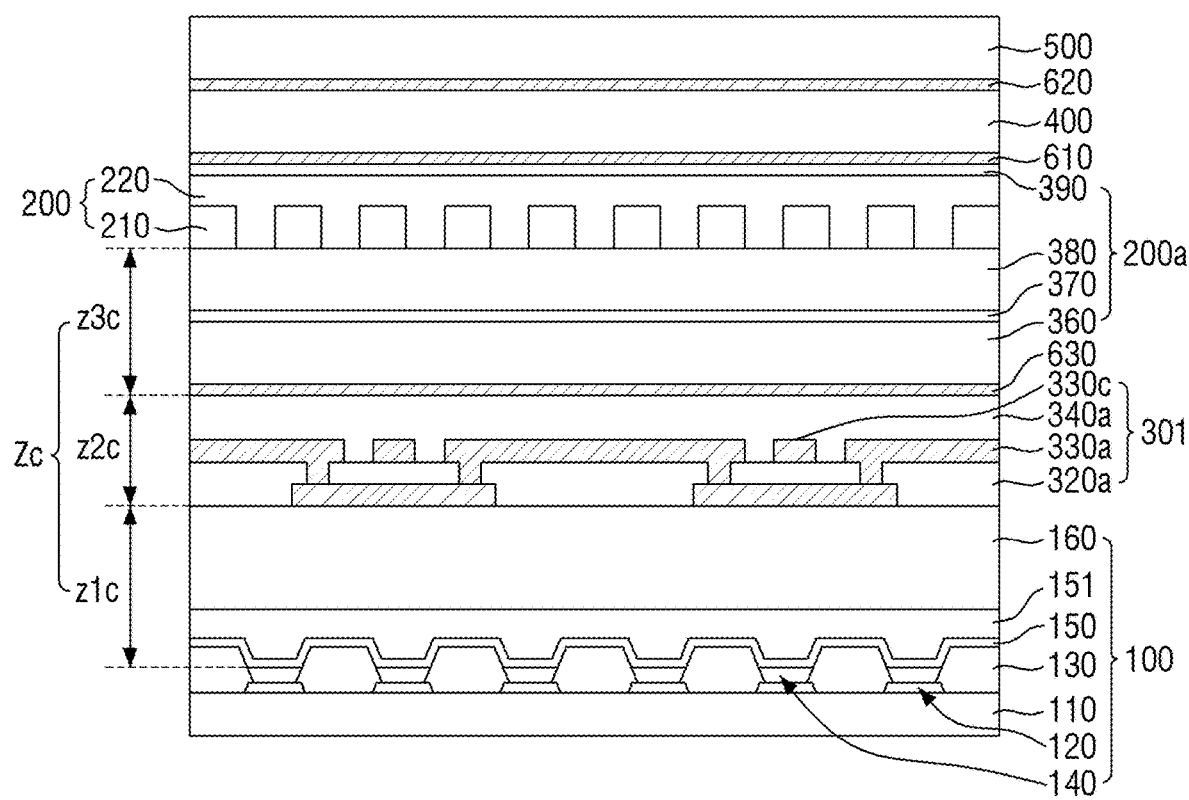

FIG. 47 is a cross-sectional view of a display device according to another exemplary embodiment of the inventive concept.

Referring to FIG. 47, the display device may include a display panel 100, a first input sensing layer 301, a diffraction unit 200$a$, an anti-reflection panel 400, and a window panel 500.

In one exemplary embodiment, the display panel 100 may include a first encapsulation layer 160, which may be formed as a glass insulating substrate. The first input sensing layer 301 may be disposed directly on the glass insulating substrate.

The diffraction unit 200$a$ may be disposed on the first input sensing layer 301. The diffraction unit 200$a$ and the first input sensing layer 301 may be coupled to each other via a third adhesive member 630. In one exemplary embodiment, the third adhesive member 630 may be an OCA member or a PSA member.

The diffraction unit 200a may include a base layer 360, an adhesive layer 370, a sixth passivation layer 380, a diffraction pattern layer 200, and a seventh passivation layer 390. That is, the base layer 360, the adhesive layer 370, the sixth passivation layer 380, the diffraction pattern layer 200, and the seventh passivation layer 390 are provided as the elements of the diffraction unit 200a, rather than as the elements of an input sensing panel 300a.

The diffraction unit 200a may be fabricated separately during the manufacture of the display device. That is, the display panel 100, the first input sensing layer 301, and the anti-reflection panel 400 may be formed by separate processes. Then, the diffraction unit 200a may be coupled to the first input sensing layer 301 via the third adhesive member 630, and may be coupled to the anti-reflection panel 400 via a second adhesive member 620.

The anti-reflection panel 400 may be coupled to the diffraction unit 200a via a first adhesive member 610. In one exemplary embodiment, the first adhesive member 610 may be a PSA member. The window panel 500 may be coupled to the anti-reflection panel 400 via the second adhesive member 620. In one exemplary embodiment, the second adhesive member 620 may be an OCA member.

Since the first input sensing layer 301, the base layer 360, the adhesive layer 370, and the sixth passivation layer 380 are disposed between the diffraction pattern layer 200 and a plurality of organic light-emitting elements 140, a distance Zc between the organic light-emitting elements 140 and the diffraction pattern layer 200 increases, as compared to the display device of FIG. 2. As a result, a first diffraction distance β1 may be varied. The varied first diffraction distance may be defined as a seventh diffraction distance β7.

For convenience, when calculating the seventh diffraction distance β7, the refractive indexes of the elements included in the display panel 101 may be collectively considered a single factor and represented by the refractive index of the display panel 101, and the elements included in the first input sensing layer 301 may be collectively considered a single factor and represented by the refractive index of the first input sensing layer 301. Also, it is assumed that the base layer 360, the adhesive layer 370, and the sixth passivation layer 380 have the same refractive index. The seventh diffraction distance β7 may be represented by Equation (15):

$$\beta 7 = z1c \cdot \tan\left[\sin^{-1}\left(\frac{\lambda}{DP1} \cdot \frac{1}{n100}\right)\right] + \\ z2c \cdot \tan\left[\sin^{-1}\left(\frac{\lambda}{DP1} \cdot \frac{1}{n301}\right)\right] + \\ z3c \cdot \tan\left[\sin^{-1}\left(\frac{\lambda}{DP1} \cdot \frac{1}{n380}\right)\right]$$

Equation (15)

where n380 denotes the refractive index of the base layer 360, the adhesive layer 370, and the sixth passivation layer 380.

If the base layer 360, the adhesive layer 370, and the sixth passivation layer 380 have different refractive indexes, the seventh diffraction distance β7 may be controlled using the thicknesses and the refractive indexes of the base layer 360, the adhesive layer 370, and the sixth passivation layer 380.

Since the first input sensing layer 301, the base layer 360, the adhesive layer 370, and the sixth passivation layer 380 are disposed between the diffraction pattern layer 200 and the organic light-emitting elements 140, the distance Zc between the organic light-emitting elements 140 and the diffraction pattern layer 200 can be sufficiently secured in the display panel 101. Accordingly, the thickness of the first encapsulation layer 160 may be reduced.

Figure 48:
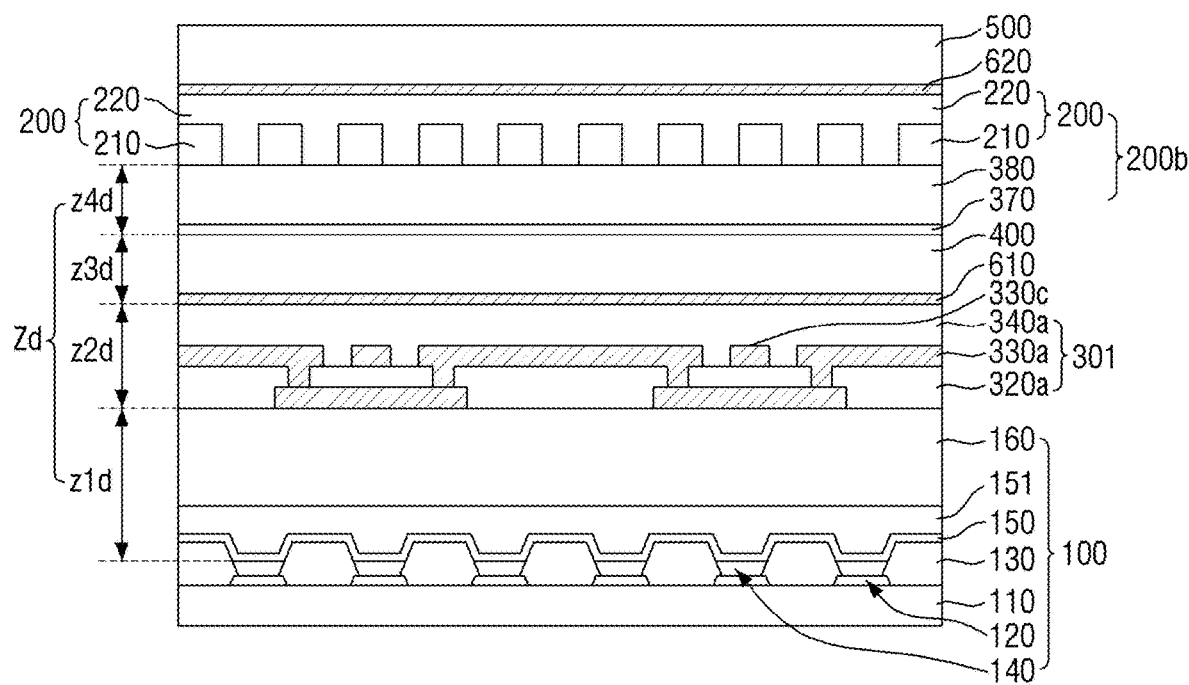

FIG. 48 is a cross-sectional view of a display device according to another exemplary embodiment of the inventive concept.

Referring to FIG. 48, the display device may include a display panel 100, a first input sensing layer 301, an anti-reflection panel 400, a diffraction unit 200b, and a window panel 500.

The diffraction unit 200b may be disposed between the anti-reflection panel 400 and the window panel 500. In one exemplary embodiment, the diffraction unit 200b may be coupled to the anti-reflection panel 400 via the adhesive layer 370. That is, the anti-reflection panel 400 and the diffraction unit 200b may be coupled to each other via the adhesive layer 370 and may thus form a single panel together. Since the diffraction unit 200b including a diffraction pattern layer 200 is disposed on the anti-reflection panel 400, a base layer 360, which may be formed as a film-type retarder, may not be provided.

Since various elements including the anti-reflection panel 400 are disposed between the diffraction pattern layer 200 and a plurality of organic light-emitting elements 140, the distance between the organic light-emitting elements 140 and the diffraction pattern layer 200 may increase. A diffraction distance may be controlled by reflecting the thicknesses and refractive indexes of the various elements, including the anti-reflection panel 400.

Figure 49:
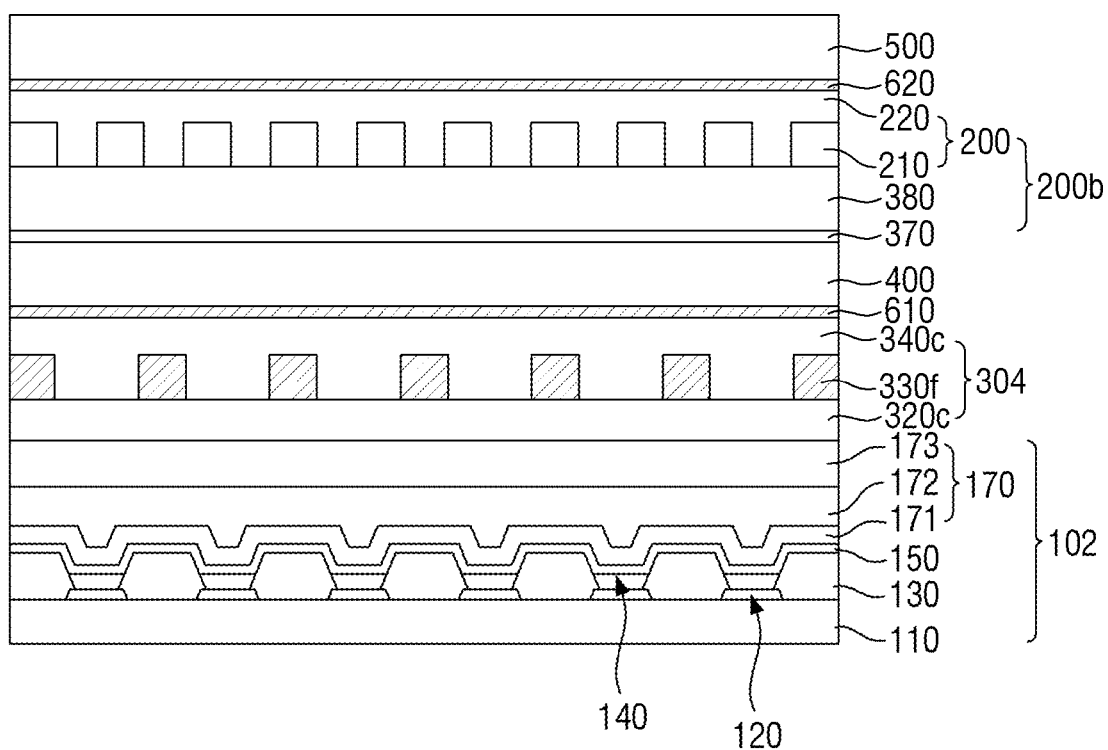

FIG. 49 is a cross-sectional view of a display device according to another exemplary embodiment of the inventive concept.

Referring to FIG. 49, the display device includes a display panel 102 a fourth input sensing layer 304, an anti-reflection panel 400, a diffraction unit 200b, and a window panel 500.

The display panel 102 may include a second encapsulation layer 170 in which a plurality of organic/inorganic layers are stacked. The display panel 102 may not include the second buffer layer 180 of FIG. 30. Alternatively, the display panel 102 may include a buffer layer having a different thickness from the second buffer layer 180 of FIG. 30.

The fourth input sensing layer 304 may be disposed on the display panel 102. Specifically, the fourth input sensing layer 304 may be formed on a second inorganic layer 173 by a continuous process.

The fourth input sensing layer 304 may include a plurality of first sensing portions 330f having a plurality of mesh wires that define a plurality of mesh holes. In one exemplary embodiment, the mesh wires may have a three-layer structure of Ti/Al/Ti. In one exemplary embodiment, the first sensing portions 330f may overlap with a pixel defining film 130 in a vertical direction with respect to a first substrate 110.

Since various elements including the anti-reflection panel 400 are disposed between the diffraction pattern layer 200 and a plurality of organic light-emitting elements 140, the distance between the organic light-emitting elements 140 and the diffraction pattern layer 200 may increase. A diffraction distance may be controlled by reflecting the thicknesses and refractive indexes of the various elements, including the anti-reflection panel 400.

Figure 50:
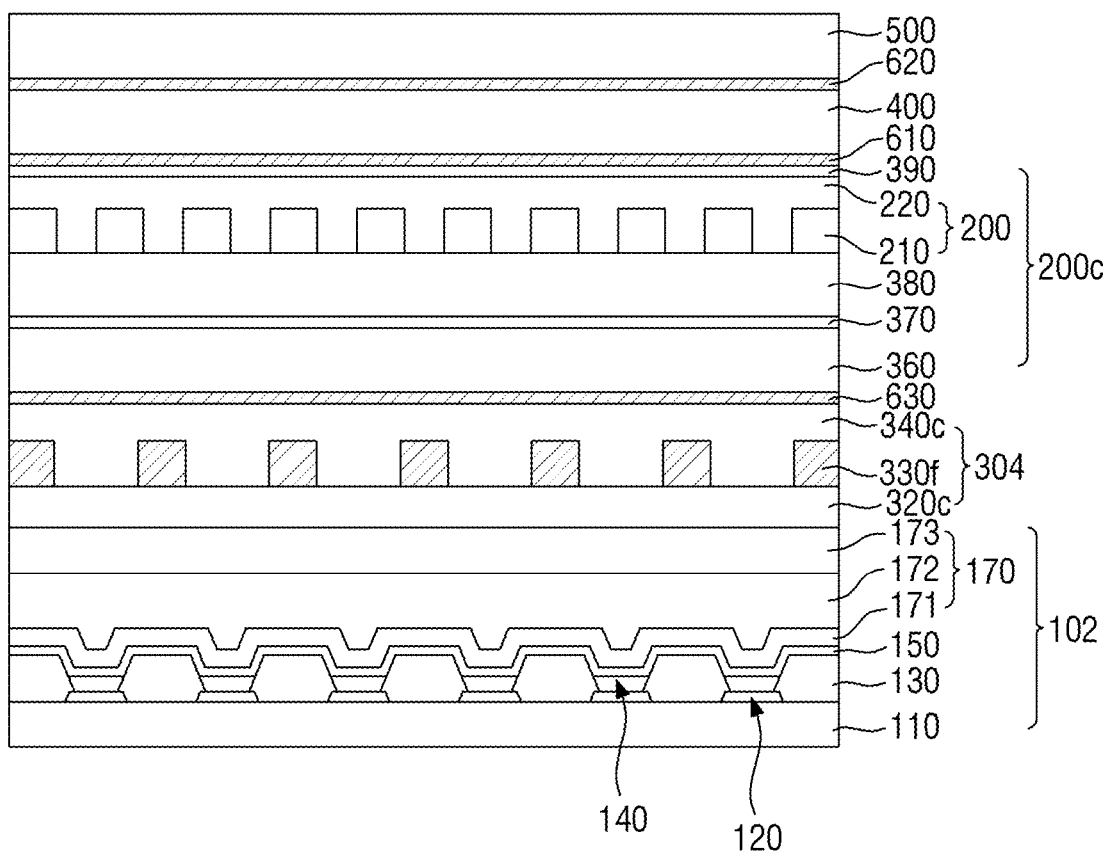

FIG. 50 is a cross-sectional view of a display device according to another exemplary embodiment of the inventive concept.

Referring to FIG. 50, a diffraction unit 200c may be coupled to a fourth input sensing layer 304 via a third adhesive member 630. The display device of FIG. 50 differs from the display device of FIG. 49 in that an anti-reflection panel 400 is disposed on the diffraction unit 200c.

Accordingly, the diffraction unit 200c may additionally include a base layer 360 providing a base surface. In one exemplary embodiment, the base layer 360 may include a film-type retarder.

Since the base layer 360, an adhesive layer 370, sixth and seventh passivation layers 380 and 390, and a fourth input sensing layer 304 are disposed between a diffraction pattern layer 200 and a plurality of organic light-emitting elements 140, the distance between the organic light-emitting elements 140 and the diffraction pattern layer 200 may increase. A diffraction distance may be controlled by reflecting the thicknesses and refractive indexes of the base layer 360, the adhesive layer 370, the sixth and seventh passivation layers 380 and 390, and the fourth input sensing layer 304.

The arrangement of, and the relationships among, the display panel, the diffraction pattern layer, the input sensing layer (or the input sensing panel), the anti-reflection layer (or the anti-reflection panel), and the window layer (or the window panel) of each of the display devices according to exemplary embodiments of the inventive concept is not limited to those illustrated in the accompanying drawings. That is, the arrangement of, and the relationships among, the display panel, the diffraction pattern layer, the input sensing layer (or the input sensing panel), the anti-reflection layer (or the anti-reflection panel), and the window layer (or the window panel) may vary.

Diffraction pattern layers according to other exemplary embodiments of the inventive concept will hereinafter be described.

Figure 51:
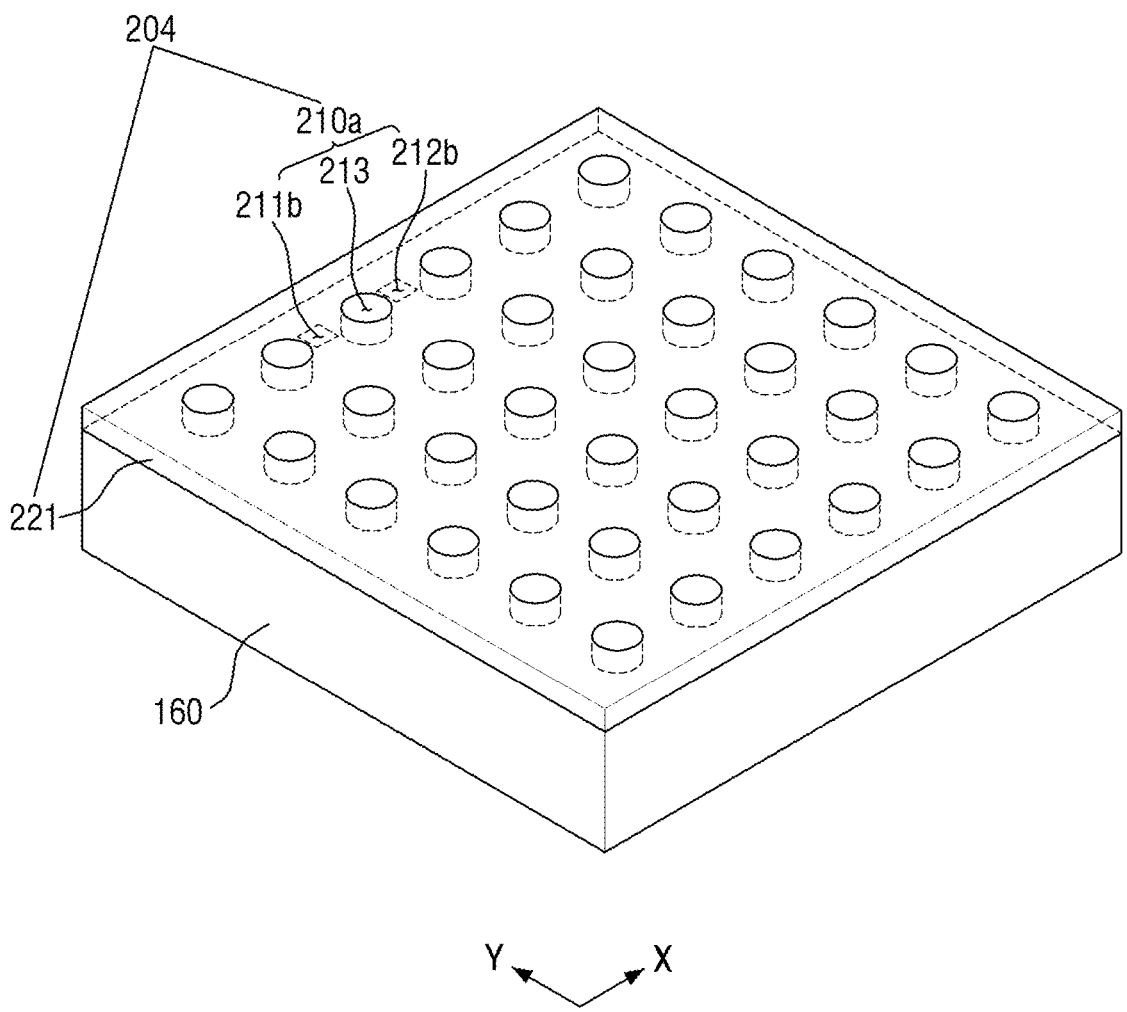
FIG. 51 is a perspective view of a diffraction pattern layer according to another exemplary embodiment of the inventive concept.
Figure 52:
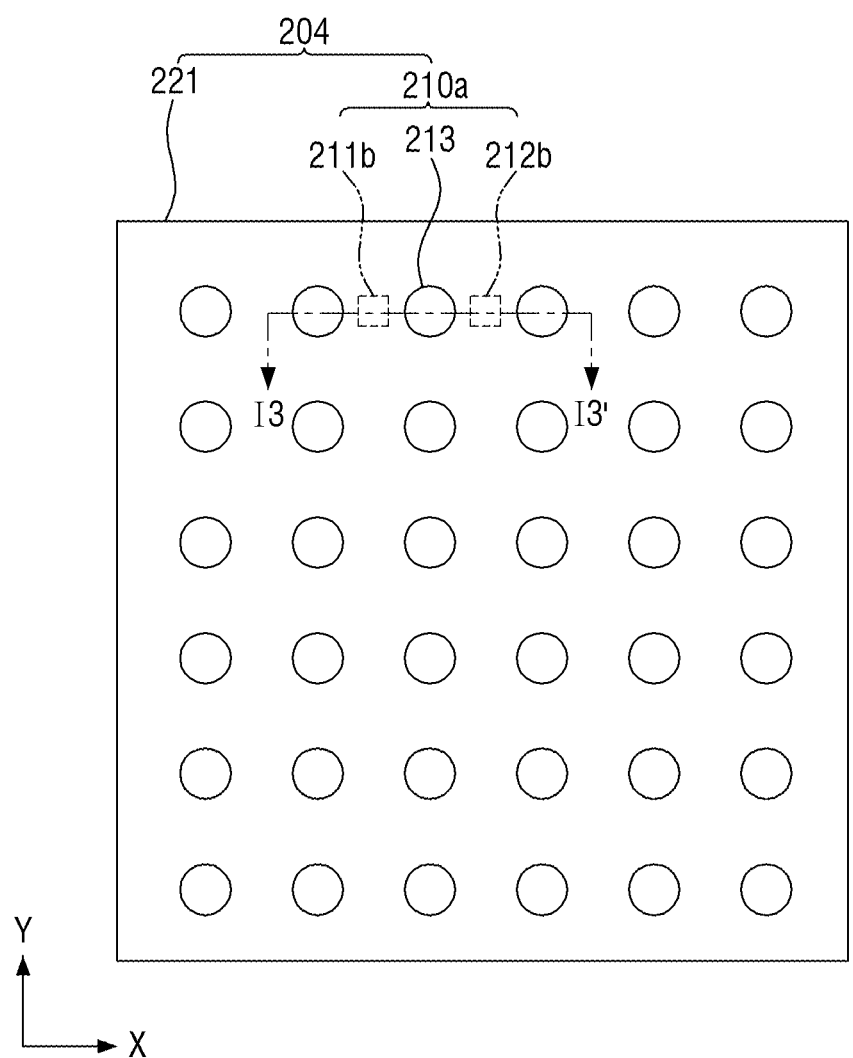
FIG. 52 is a plan view of the diffraction pattern layer of FIG. 51.
Figure 53:
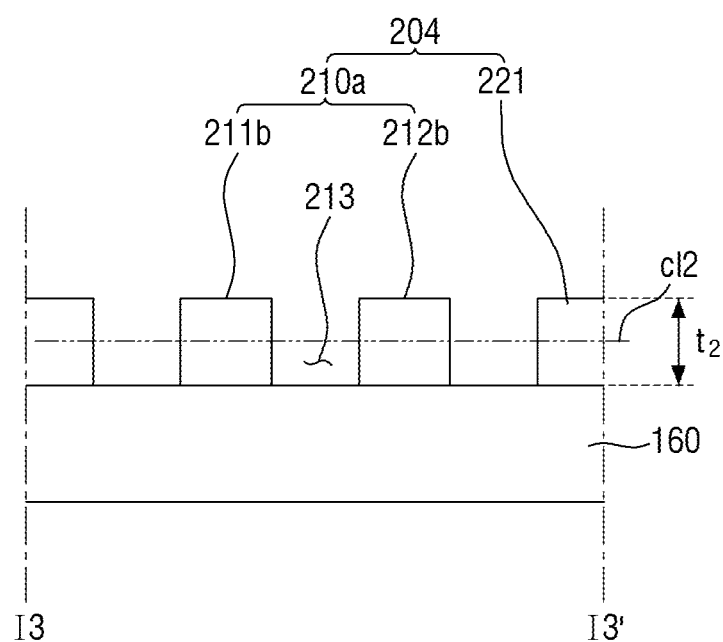
FIG. 53 is a cross-sectional view taken along line 13-13' of FIG. 52.
Figure 54:
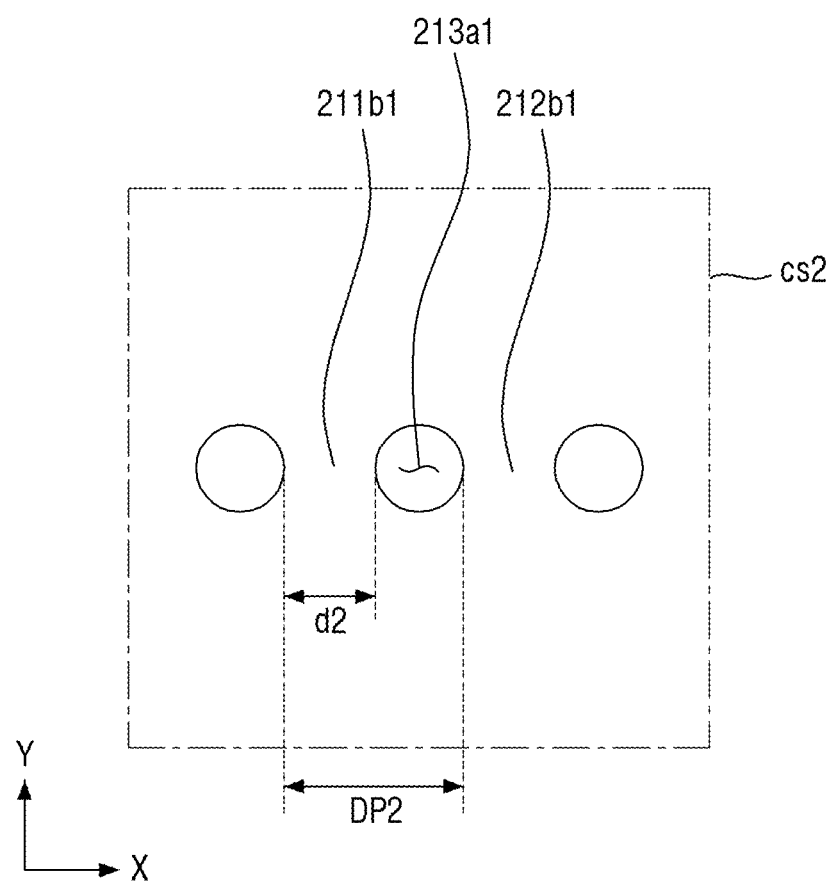
FIG. 54 is a cross-sectional view taken along a second imaginary line cl2 of FIG. 53.

FIG. 51 is a perspective view of a diffraction pattern layer according to another exemplary embodiment of the inventive concept. FIG. 52 is a plan view of the diffraction pattern layer of FIG. 51. FIG. 53 is a cross-sectional view taken along line 13-13' of FIG. 52. FIG. 54 is a cross-sectional view taken along a second imaginary line of FIG. 53. Descriptions of elements that have already been described above with reference to FIGS. 2 through 16 will be omitted. FIGS. 51 through 54 illustrate an example in which a diffraction pattern layer 204 is disposed on a first encapsulation layer 160, as illustrated in FIG. 2, but the inventive concept is not limited thereto. That is, the diffraction pattern layer 204 may be disposed on a second encapsulation layer 170, as illustrated in FIG. 30.

Referring to FIGS. 51 through 54, the diffraction pattern layer 204 may include a plurality of diffraction patterns 210 and a first passivation layer 221.

The diffraction patterns 210a may be formed to penetrate a first passivation layer 221. That is, the diffraction pattern layer 204 may include a plurality of engraved holes 213, which are formed to penetrate the first passivation layer 221 along a direction toward the first encapsulation layer 160.

The diffraction patterns 210a may have a second thickness $t_2$. Referring to FIG. 53, the second thickness $t_2$ denotes the distance from the bottom surfaces of the diffraction patterns 210a (i.e., the top surface of the first encapsulation layer 160) to the top surfaces of the diffraction patterns 210a.

The diffraction patterns 210a may be arranged to have a second period DP2. The diffraction patterns 210a may have a second length d2. The second period DP2 and the second length d2 may be defined with respect to a cross-sectional region cs2 taken along a second imaginary line c12. The second imaginary line c12 is a line passing through the midpoints of the diffraction patterns 210a in the direction of the second thickness $t_2$. Reference numeral 211b1 denotes the cross section of a first diffraction pattern 211b taken along the second imaginary line c12. Reference numeral 212b1 denotes the cross section of a second diffraction pattern 212b taken along the second imaginary line c12.

Referring to FIG. 54, the second period DP2 is defined as the distance between a side of the cross section 211b1 of the first diffraction pattern 211b, adjacent to the cross section 212b1 of the second diffraction pattern 212b, and a corresponding side of the cross section 212b1 of the second diffraction pattern 212b. The second length d2 refers to the width of, for example, the cross section 212b1 of the second diffraction pattern 212b.

Referring again to FIGS. 51 through 53, in one exemplary embodiment, the period at which the diffraction patterns 210a are arranged along a first direction X and the period at which the diffraction patterns 210a are arranged along a second direction Y may both be the second period DP2. The number of diffraction patterns 210a arranged along the first direction X and the number of diffraction patterns 210a arranged along the second direction Y may be identical.

Figure 55:
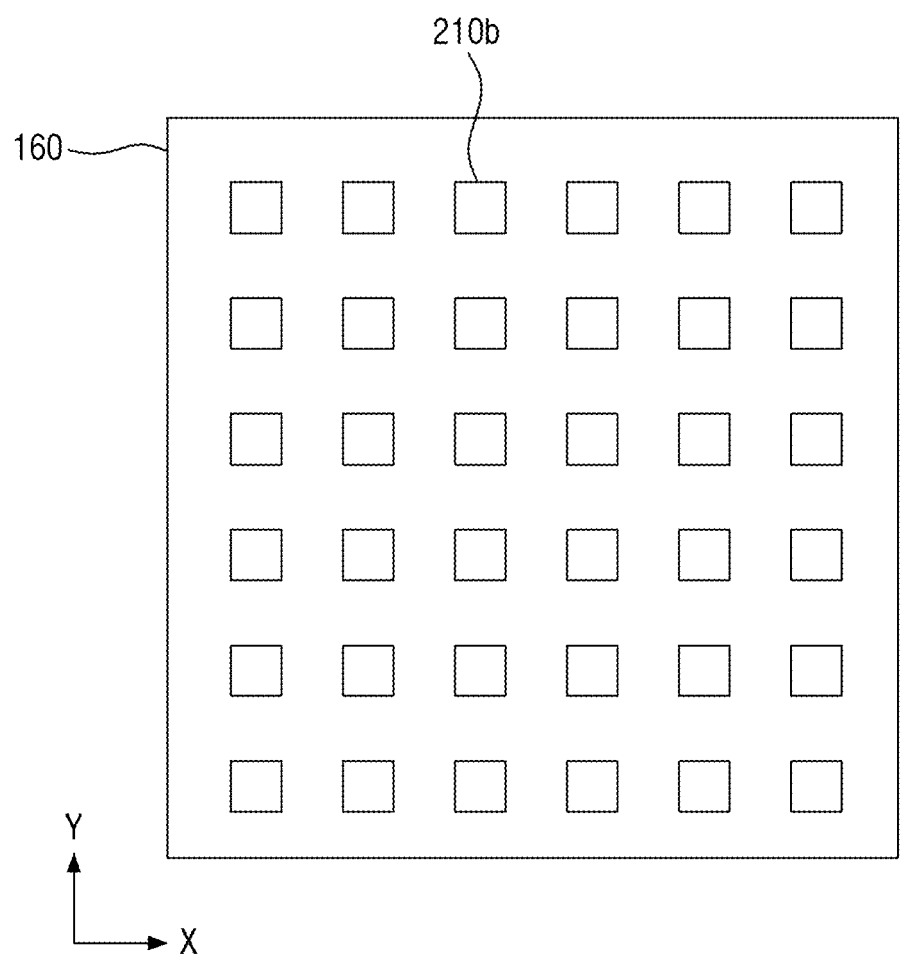
FIG. 55 is a plan view of a diffraction pattern layer according to another exemplary embodiment of the inventive concept.

FIG. 55 is a plan view of a diffraction pattern layer according to another exemplary embodiment of the inventive concept. Descriptions of elements that have already been described above with reference to FIGS. 2 through 16 will be omitted.

Referring to FIG. 55, a diffraction pattern layer may include a plurality of diffraction patterns 210b, which have a rectangular cross-sectional shape. The rectangular cross-sectional shape encompasses a square cross-sectional shape. In one exemplary embodiment, if the diffraction patterns 210b have a square cross-sectional shape, the diffraction patterns 210b may be cubic.

In a case where the diffraction patterns 210b have a rectangular cross-sectional shape, Equation (1) can be modified into the following equation:

$$0.4 \leq d1/DP1 \leq 1 \qquad \text{Equation}$$

That is, since the diffraction patterns 210 have a rectangular cross-sectional shape, no minimum space is provided for diffraction when the first period DP1 and the first length d1 are identical. Thus, a case where d1/DP1=1 is excluded.

The top surfaces of the diffraction patterns 210b may have a different area from the bottom surfaces of the diffraction patterns 210b. This will hereinafter be described with reference to FIGS. 56A, 56B, and 57.

Figure 56A:
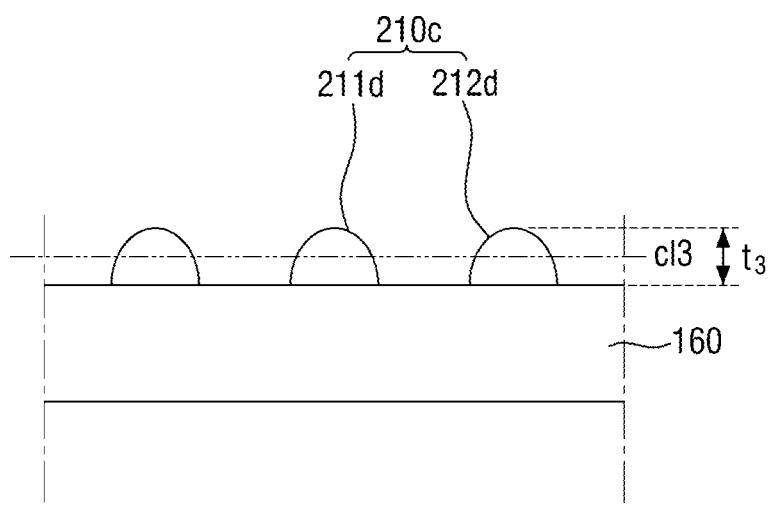
FIG. 56A is a cross-sectional view of a diffraction pattern layer according to another exemplary embodiment of the inventive concept.
Figure 56B:
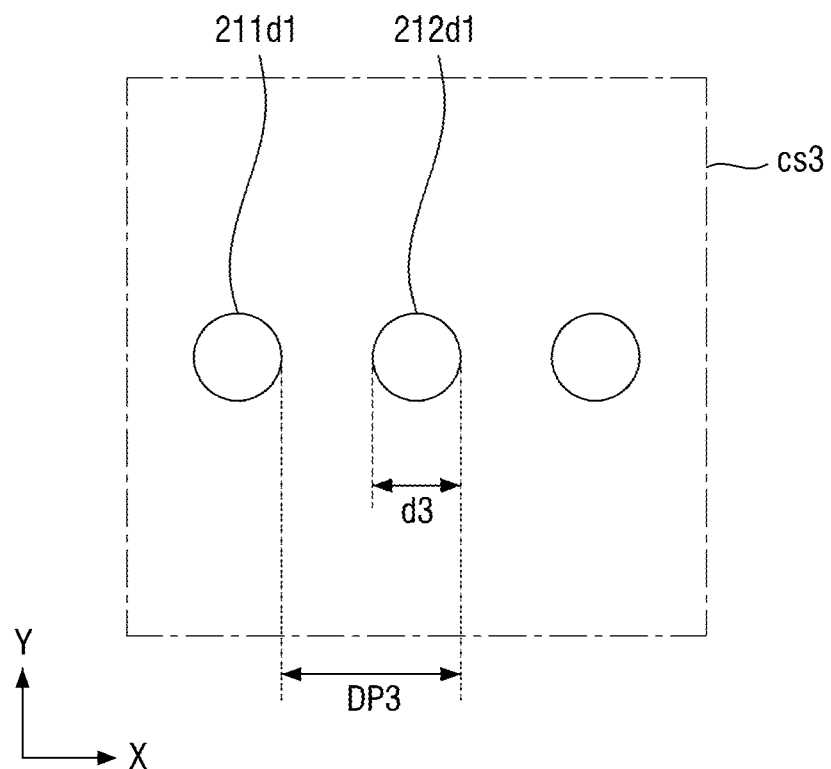
FIG. 56B is a cross-sectional view taken along a third imaginary line c13 of FIG. 56A.

FIGS. 56A, 56B, and 57 show exemplary embodiments in which the top surfaces of a plurality of diffraction patterns have a different area from the bottom surfaces of the diffraction patterns.

Specifically, FIG. 56A is a cross-sectional view of a diffraction pattern layer according to another exemplary embodiment of the inventive concept, and FIG. 56B is a cross-sectional view taken along a third imaginary line of FIG. 56A.

Referring to FIGS. 56A and 56B, a plurality of diffraction patterns 210c may be disposed on a first encapsulation layer 160 and may have a hemispherical shape. That is, the diffraction patterns 210c may protrude from the first encapsulation layer 160 toward a light-emitting direction in the form of hemispheres.

The diffraction patterns 210c may have a third thickness $t_3$. Referring to FIG. 56A, the third thickness $t_3$ denotes the distance from the bottom surfaces of the diffraction patterns 210c (i.e., the top surface of the first encapsulation layer 160) to the top surfaces of the diffraction patterns 210c.

The diffraction patterns 210c may be arranged to have a third period DP3. The diffraction patterns 210c may have a third length d3. The third period DP3 and the third length d3 may be defined with respect to a cross-sectional region cs3 taken along a third imaginary line c13. The third imaginary line c13 is a line passing through the midpoints of the diffraction patterns 210c in the direction of the third thickness $t_3$. Reference numeral 211d1 denotes the cross section of a first diffraction pattern 211d taken along the third imaginary line c13. Reference numeral 212d1 denotes the cross section of a second diffraction pattern 212d taken along the third imaginary line c13.

Referring to FIG. 56B, the third period DP3 is defined as the distance between a side of the cross section 211d1 of the first diffraction pattern 211d, adjacent to the cross section 212d1 of the second diffraction pattern 212d, and a corresponding side of the cross section 212d1 of the second diffraction pattern 212d. The third length d3 refers to the width of, for example, the cross section 212d1 of the second diffraction pattern 212d.

Figure 57A:
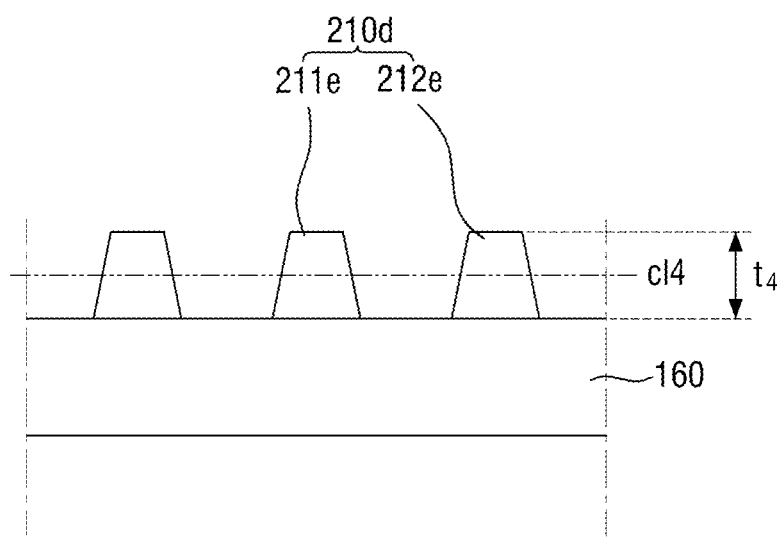
FIG. 57A is a cross-sectional view of a diffraction pattern layer according to another exemplary embodiment of the inventive concept.
Figure 57B:
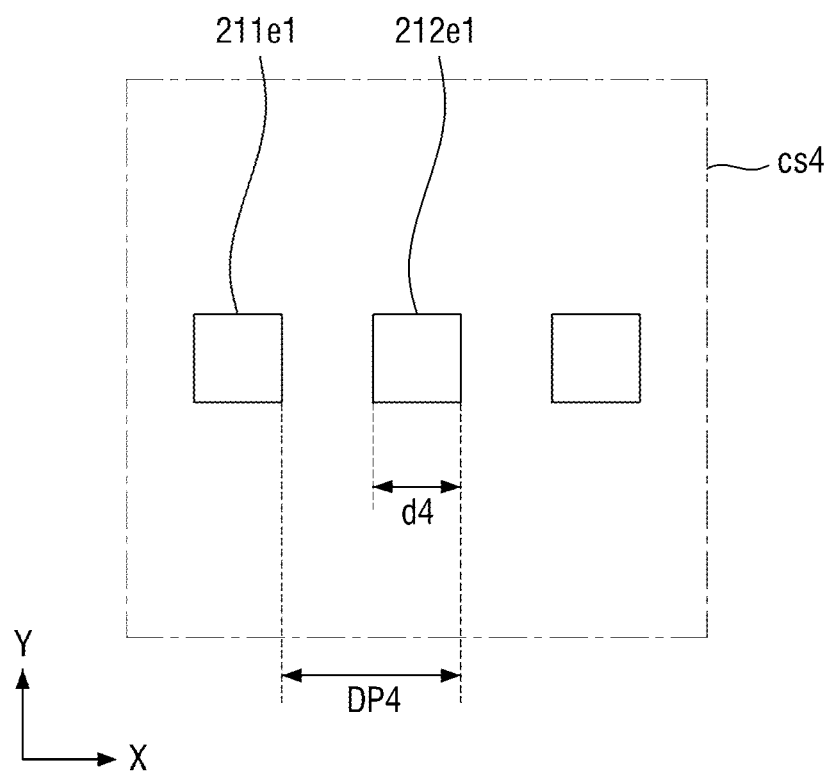
FIG. 57B is a cross-sectional view taken along a fourth imaginary line c14 of FIG. 57A.

FIG. 57A is a cross-sectional view of a diffraction pattern layer according to another exemplary embodiment of the inventive concept, and FIG. 57B is a cross-sectional view taken along a fourth imaginary line c14 of FIG. 57A.

Referring to FIGS. 57A and 57B, a plurality of diffraction patterns 210d may be disposed on a first encapsulation layer 160 and may have a hemispherical shape. That is, the diffraction patterns 210d may protrude from the first encapsulation layer 160 toward a light-emitting direction in the form of trapezoids.

The diffraction patterns 210d may have a fourth thickness $t_4$. Referring to FIG. 57(a), the fourth thickness $t_4$ denotes the distance from the bottom surfaces of the diffraction patterns 210d (i.e., the top surface of the first encapsulation layer 160) to the top surfaces of the diffraction patterns 210d.

The diffraction patterns 210d may be arranged to have a fourth period DP4. The diffraction patterns 210d may have a fourth length d4. The fourth period DP4 and the fourth length d4 may be defined with respect to a cross-sectional region cs4 taken along a fourth imaginary line c14. The fourth imaginary line c14 is a line passing through the midpoints of the diffraction patterns 210d in the direction of the fourth thickness $t_4$. Reference numeral 211e1 denotes the cross section of a first diffraction pattern 211e taken along the fourth imaginary line c14. Reference numeral 212e1 denotes the cross section of a second diffraction pattern 212e taken along the fourth imaginary line c14.

Referring to FIG. 57B, the fourth period DP4 is defined as the distance between a side of the cross section 211e1 of the first diffraction pattern 211e, adjacent to the cross section 212e1 of the second diffraction pattern 212e, and a corresponding side of the cross section 212e1 of the second diffraction pattern 212e. The fourth length d4 refers to the width of, for example, the cross section 212e1 of the second diffraction pattern 212e.

Although not specifically illustrated, in one exemplary embodiment, a diffraction pattern layer 200 may be formed to penetrate the first encapsulation layer 160. The diffraction pattern layer 200 may be formed in one integral body with the first encapsulation layer 160, which means that the diffraction pattern layer 200 and the first encapsulation layer 160 comprise the same material.

A method to form the diffraction pattern layer 200 is not particularly limited. In one exemplary embodiment, the diffraction pattern layer 200 may be formed by growing an inorganic layer on the first encapsulation layer 160 and etching the inorganic layer. The inorganic layer may comprise at least one selected from the group consisting of silicon oxide ($SiO_x$), silicon nitride ($SiN_x$), and silicon oxynitride ($SiON_x$). The type of etching used to etch the inorganic layer is not particularly limited, but in one exemplary embodiment, dry etching may be used to etch the inorganic layer.

As mentioned above, if the distance between pixels changes, at least one of effective light-emitting area ratio and the degree of blurring may change. Pixel arrangements according to exemplary embodiments of the inventive concept that determine the distance between pixels will hereinafter be described with reference to FIGS. 58 and 59.

Figure 58:
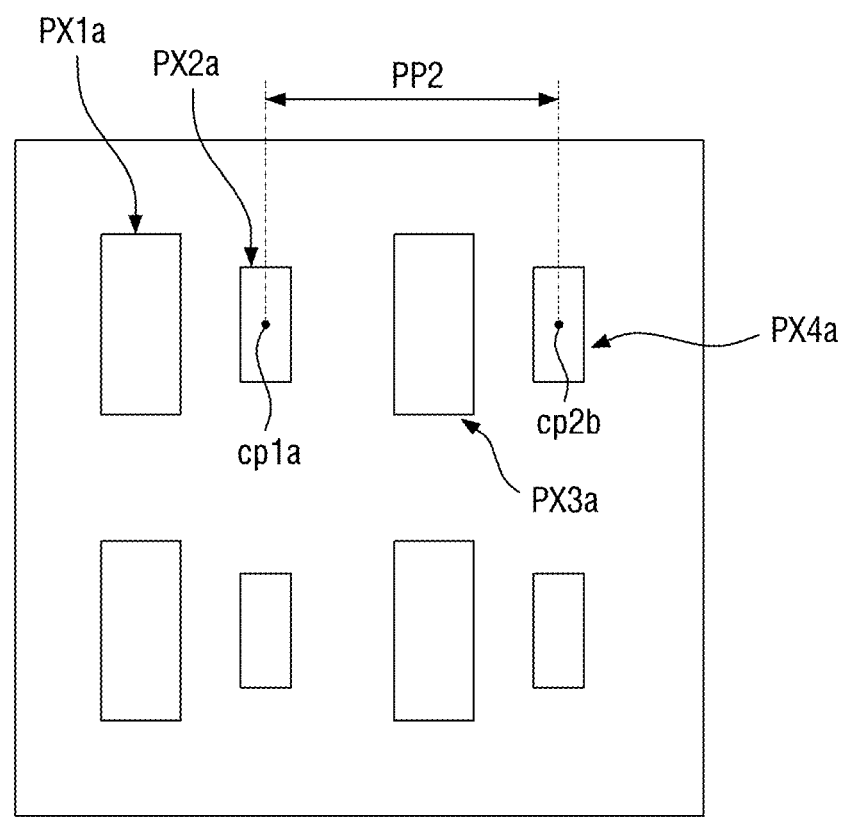
FIG. 58 and FIG. 59 are plan views illustrating the pixel arrangements of display device according to other exemplary embodiment of the inventive concept.
Figure 59:
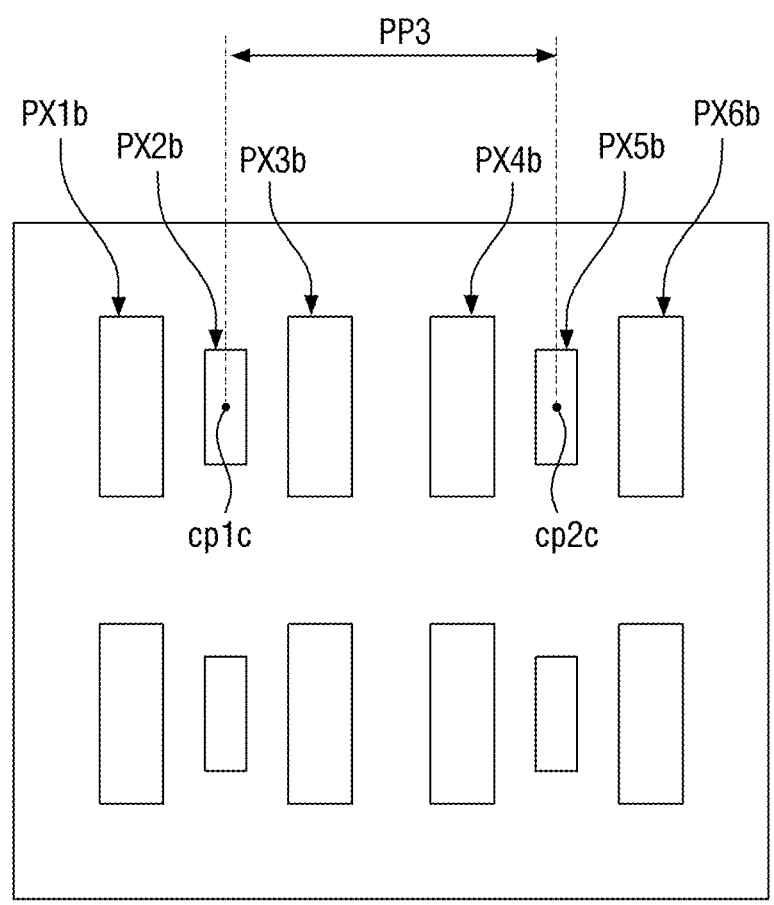

FIGS. 58 and 59 are plan views illustrating the pixel arrangements of display device according to other exemplary embodiments of the inventive concept.

Referring to FIG. 58, first through fourth pixel units PX1a through PX4a may be disposed in the same row to be adjacent to one another. In one exemplary embodiment, the first through fourth pixel units PX1a through PX4a may be rectangular. However, the shape and the size of the first through fourth pixel units PX1a through PX4a are not particularly limited.

The first pixel unit PX1a may display, for example, a red color. That is, the first pixel PX1a may include a red organic light-emitting layer, which emits red light. The second and fourth pixel units PX2a and PX4a may display, for example, a green color. That is, the second and fourth pixels PX2a and PX4a may include a green organic light-emitting layer, which emits green light. The third pixel unit PX3a may display, for example, a blue color. That is, the third pixel PX3a may include a blue organic light-emitting layer, which emits blue light.

The first through fourth pixel units PX1a through PX4a may form a single pixel unit together. That is, the first through fourth pixel units PX1a through PX4a may be arranged in an RGBG PenTile™ configuration.

A distance PP2 between pixels is defined as the distance between pixel units displaying the same color. The distance PP2 will hereinafter be described, taking the second and fourth pixel units PX2a and PX4a.

The distance PP2 may be defined as the shortest distance between a first central point cp1b within the second pixel unit PX2a and a second central point cp2b within the fourth pixel unit PX4a.

Referring to FIG. 59, first through sixth pixel units PX1b through PX6b may be disposed in the same row to be adjacent to one another. In one exemplary embodiment, the first through sixth pixel units PX1b through PX6b may be rectangular. In one exemplary embodiment, the first, second, and third pixel units PX1b through PX3b may display a red color, a green color, and a blue color, respectively, and the fourth, fifth, and sixth pixel units PX4b, PX5b, and PX6b may display a red color, a green color, and a blue color, respectively.

The first through third pixel units PX1b through PX3b may form a single pixel unit together. The fourth through sixth pixel units PX4b through PX6b may form a single pixel together.

A distance PP3 between pixels is defined as the distance between pixel units displaying the same color. Accordingly, the distance PP3 may be defined as the shortest distance between a first central point cp1c within the second pixel unit PX2b and a second central point cp2c within the fifth pixel unit PX5a.

That is, the shortest distance between pixels may be defined as the shortest distance between pixel units displaying the same color and may vary depending on the arrangement of the pixels.

It will be apparent to those skilled in the art that various modifications and variations can be made in the present invention without departing from the spirit and scope of the invention. Thus, it is intended that the present invention cover the modifications and variations of this invention provided they come within the scope of the appended claims and their equivalents.

What is claimed is:

1. A display device, comprising:
a substrate;
a first light-emitting element disposed on the substrate;
an encapsulation layer disposed on the first light-emitting element;
an input sensing layer disposed on the encapsulation layer; and
a diffraction pattern layer disposed on the input sensing layer,
wherein:
the diffraction pattern layer comprises a plurality of diffraction patterns arranged to have a first period in one direction;
the encapsulation layer comprises a glass insulating substrate;
the input sensing layer is disposed directly on the glass insulating substrate;
the input sensing layer comprises:
a first sensing electrode comprising a plurality of first sensing portions and a plurality of first connecting portions electrically connected to the first sensing portions; and
a second sensing electrode comprising a plurality of second sensing portions and a plurality of second connecting portions electrically connected to the second sensing portions;
the first sensing portions and the second sensing portions are disposed on the same layer; and
the first connecting portions and the second connecting portions are disposed on different layers.

2. The display device of claim 1, wherein:
the encapsulation layer includes at least one of an organic layer and an inorganic layer; and
the input sensing layer is disposed directly on the encapsulation layer.

3. The display device of claim 2, wherein:
the input sensing layer comprises a plurality of sensing electrodes and a first signal line electrically connected to the sensing electrodes; and
the sensing electrodes have a mesh shape.

4. A display device, comprising:
a substrate;
a first light-emitting element disposed on the substrate;
an encapsulation layer disposed on the first light-emitting element;
an input sensing layer disposed on the encapsulation layer;
a diffraction pattern layer disposed on the input sensing layer; and
a passivation layer disposed between the input sensing layer and the diffraction pattern layer,
wherein:
the diffraction pattern layer comprises a plurality of diffraction patterns arranged to have a first period in one direction; and
the passivation layer comprises a polymer material.

5. A display device, comprising:
a substrate;
a first light-emitting element disposed on the substrate;
an encapsulation layer disposed on the first light-emitting element;
an input sensing layer disposed on the encapsulation layer;
a diffraction pattern layer disposed on the input sensing layer; and
an anti-reflection layer disposed between the diffraction pattern layer and the input sensing layer,
wherein the diffraction pattern layer comprises a plurality of diffraction patterns arranged to have a first period in one direction.

6. The display device of claim 1, further comprising an anti-reflection layer disposed on the diffraction pattern layer.

7. A display device, comprising:
a substrate;
a first light-emitting element disposed on the substrate;
an encapsulation layer disposed on the first light-emitting element;
an input sensing layer disposed on the encapsulation layer;
a diffraction pattern layer disposed on the input sensing layer; and
an anti-reflection layer disposed between the input sensing layer and the encapsulation layer,
wherein the diffraction pattern layer comprises a plurality of diffraction patterns arranged to have a first period in one direction.

8. The display device of claim 7, wherein the anti-reflection layer comprises a polarizing film.

9. The display device of claim 1, further comprising a window layer disposed between the diffraction pattern layer and the input sensing layer.

10. The display device of claim 1, wherein, when a cross-sectional width of one of the diffraction patterns is defined as a first length, the first period and the first length satisfy the following equation:

$$0.4 \leq d1/DP1 < 1$$

where DP denotes the first period and d1 denotes the first length.

11. A display device, comprising:
a substrate;
a first light-emitting element disposed on the substrate;
an encapsulation layer disposed on the first light-emitting element;
an input sensing layer disposed on the encapsulation layer; and
a diffraction pattern layer disposed on the input sensing layer,
wherein:
the diffraction pattern layer comprises a plurality of diffraction patterns arranged to have a first period in one direction; and
the diffraction patterns generate a reference emission pattern and a first duplicated emission pattern by diffracting light emitted from the first light-emitting element.

12. The display device of claim 11, wherein the luminance of the first duplicated emission pattern is greater than or equal to 3% of the luminance of the reference emission pattern.

13. The display device of claim 11, wherein, when a distance between the first reference emission pattern and the first duplicated emission pattern is defined as a diffraction distance and a distance between the first light-emitting element and the diffraction patterns is defined as a spacing distance, the diffraction distance satisfies the following equation:

$$\beta = z \cdot \tan\left[\sin^{-1}\left(\frac{\lambda}{DP1} \cdot \frac{1}{nEN}\right)\right]$$

where β denotes the diffraction distance, z denotes the spacing distance, DP1 denotes the first period, λ denotes the wavelength of light emitted from the first light-emitting element, and nEN denotes the refractive index of the encapsulation layer.

14. The display device of claim 11, further comprising a second light-emitting element disposed on the substrate, wherein:
the second light-emitting element displays the same color as the first light-emitting element; and
when a distance between the first and second light-emitting elements is defined as a distance between light-emitting elements and a distance between the reference emission pattern and the first duplicated emission pattern is defined as a diffraction distance, the distance between the light-emitting elements and the diffraction distance satisfy the following equation:

0.1≤β/*PP1*≤1.9 where PP1 denotes the distance between the light-emitting elements and β denotes the diffraction distance.

15. A display device, comprising:
a substrate;
a first light-emitting element disposed on the substrate;
an encapsulation layer disposed on the first light-emitting element;
an input sensing layer disposed on the encapsulation layer; and
a diffraction pattern layer disposed on the input sensing layer,
wherein:
the diffraction pattern layer comprises a plurality of diffraction patterns arranged to have a first period in one direction;
the diffraction pattern layer further comprises a passivation layer disposed on the diffraction patterns;
the diffraction patterns have a first refractive index;
the passivation layer has a second refractive index; and
the first refractive index, the second refractive index, and the thickness of one of the diffraction patterns satisfy the following equation:

(*m*\*λ)−60 (nm)≤*A* (nm)≤(*m*\*λ)+60 (nm)

*A*≠Δ*n*·*t*₁ (nm)

where Δn=|n1−n2|, n1 denotes the first refractive index, n2 denotes the second refractive index, $t_1$ denotes the thickness of one of the diffraction patterns, λ is the wavelength of light emitted from the first light-emitting element, and m is an integer greater than or equal to 0.

16. A display device, comprising:
a substrate;
a first light-emitting element disposed on the substrate;
an encapsulation layer disposed on the first light-emitting element;
a diffraction pattern layer disposed on the encapsulation layer;
a first passivation layer disposed between the diffraction pattern layer and the encapsulation layer; and
an input sensing layer disposed on the diffraction pattern layer,
wherein:
the diffraction pattern layer comprises a plurality of diffraction patterns arranged to have a first period in one direction; and
the first passivation layer comprises a polymer organic material.

17. The display device of claim 16, wherein the encapsulation layer comprises at least one of an organic layer and an inorganic layer.

18. The display device of claim 16, further comprising a base layer disposed between the first passivation layer and the encapsulation layer,
wherein the base layer comprises a retarder.

19. A display device, comprising:
a substrate;
a first light-emitting element disposed on the substrate;
an encapsulation layer disposed on the first light-emitting element;
a diffraction pattern layer disposed on the encapsulation layer; and
an input sensing layer disposed on the diffraction pattern layer,
wherein:
the diffraction pattern layer comprises a plurality of diffraction patterns arranged to have a first period in one direction;
the input sensing layer comprises:
a first sensing electrode comprising a plurality of first sensing portions and a plurality of first connecting portions electrically connected to the first sensing portions; and
a second sensing electrode comprising a plurality of second sensing portions and a plurality of second connecting portions electrically connected to the second sensing portions;
the first sensing portions and the second sensing portions are disposed on the same layer, and
the first connecting portions and the second connecting portions are disposed on different layers.

20. The display device of claim 16, wherein the encapsulation layer comprises a glass insulating substrate.

21. The display device of claim 16, further comprising an anti-reflection layer disposed on the input sensing layer.

22. The display device of claim 21, wherein the anti-reflection layer comprises a polarizing film.

23. A display device, comprising:
a substrate;
a first light-emitting element disposed on the substrate;
an encapsulation layer disposed on the first light-emitting element;
a diffraction pattern layer disposed on the encapsulation layer; and
an input sensing layer disposed on the diffraction pattern layer,
wherein:
the diffraction pattern layer comprises a plurality of diffraction patterns arranged to have a first period in one direction;
the diffraction patterns generate a reference emission pattern and a first duplicated emission pattern by diffracting light emitted from the first light-emitting element; and when a distance between the first reference emission pattern and the first duplicated emission pattern is defined as a diffraction distance and a distance between the first light-emitting element and the diffraction patterns is defined as a spacing distance, the diffraction distance satisfies the following equation:

$$\beta = z \cdot \tan\left[\sin^{-1}\left(\frac{\lambda}{DP1} \cdot \frac{1}{nEN}\right)\right]$$

where β denotes the diffraction distance, z denotes the spacing distance, DP1 denotes the first period, λ denotes the wavelength of light emitted from the first light-emitting element, and nEN denotes the refractive index of the encapsulation layer.

24. The display device of claim 23, further comprising a second light-emitting element disposed on the substrate, wherein:
the second light-emitting element displays the same color as the first light-emitting element; and
when a distance between the first and second light-emitting elements is defined as a distance between light-emitting elements and a distance between the reference emission pattern and the first duplicated emission pattern is defined as a diffraction distance, the distance between the light-emitting elements and the diffraction distance satisfy the following equation:

0.1≤β/PP1≤1.9 where PP1 denotes the distance between the light-emitting elements and β denotes the diffraction distance.

25. The display device of claim 16, wherein, when a cross-sectional width of one of the diffraction patterns is defined as a first length, the first period and the first length satisfy the following equation:

0.4≤d1/DP1<1 where DP denotes the first period and d1 denotes the first length.

26. The display device of claim 16, wherein:
the diffraction pattern layer further comprises a passivation layer disposed on the diffraction patterns;
the diffraction patterns have a first refractive index;
the passivation layer has a second refractive index; and
the first refractive index, the second refractive index, and the thickness of one of the diffraction patterns satisfy the following equation:

(m*λ)−60 (nm)≤A (nm)≤(m*λ)+60 (nm)

A≠Δn·$t_1$ (nm)

where Δn=|n1−n2|, n1 denotes the first refractive index, n2 denotes the second refractive index, $t_1$ denotes the thickness of one of the diffraction patterns, λ is the wavelength of light emitted from the first light-emitting element, and m is an integer greater than or equal to 0.

27. A display device, comprising:
a substrate;
a first light-emitting element disposed on the substrate;
an encapsulation layer disposed on the first light-emitting element;
an input sensing layer disposed on the encapsulation layer; and
a diffraction pattern layer comprising a plurality of diffraction patterns disposed on an optical path of light emitted from the first light-emitting element, wherein:
the diffraction patterns are arranged to have a first period in one direction; and
when a cross-sectional width of one of the diffraction patterns is defined as a first length, the first period and the first length satisfy the following equation:

0.4≤d1/DP1<1 where DP denotes the first period and d1 denotes the first length.

28. The display device of claim 27, wherein the diffraction pattern layer is disposed on the input sensing layer.

29. The display device of claim 28, wherein:
the encapsulation layer comprises at least one of an organic layer and an inorganic layer or a glass insulating substrate; and
the input sensing layer is disposed directly on the encapsulation layer.

30. The display device of claim 28, further comprising an anti-reflection layer disposed on the diffraction pattern layer.

31. The display device of claim 28, further comprising an anti-reflection layer disposed between the diffraction pattern layer and the input sensing layer.

32. The display device of claim 28, further comprising a window layer disposed between the diffraction pattern layer and the input sensing layer.

33. The display device of claim 27, wherein the diffraction pattern layer is disposed between the input sensing layer and the encapsulation layer.

34. The display device of claim 33, wherein the diffraction pattern layer is disposed directly on the encapsulation layer.

35. The display device of claim 33, further comprising a passivation layer disposed between the diffraction pattern layer and the encapsulation layer,
wherein the passivation layer comprises a polymer organic material.

36. The display device of claim 27, wherein:
the input sensing layer comprises:
a first sensing electrode comprising a plurality of first sensing portions and a plurality of first connecting portions electrically connected to the first sensing portions; and
a second sensing electrode comprising a plurality of second sensing portions and a plurality of second connecting portions electrically connected to the second sensing portions;
the first sensing portions and the second sensing portions are disposed on the same layer; and
the first connecting portions and the second connecting portions are disposed on different layers.

37. The display device of claim 27, wherein the diffraction patterns generate a reference emission pattern and a first duplicated emission pattern by diffracting light emitted from the first light-emitting element.

38. The display device of claim 37, wherein, when a distance between the first reference emission pattern and the first duplicated emission pattern is defined as a diffraction distance and a distance between the first light-emitting element and the diffraction patterns is defined as a spacing distance, the diffraction distance satisfies the following equation:

$$\beta = z \cdot \tan\left[\sin^{-1}\left(\frac{\lambda}{DP1} \cdot \frac{1}{nEN}\right)\right]$$

where β denotes the diffraction distance, z denotes the spacing distance, DP1 denotes the first period, λ denotes the wavelength of light emitted from the first light-emitting element, and nEN denotes the refractive index of the encapsulation layer.

39. The display device of claim 37, further comprising a second light-emitting element disposed on the substrate, wherein:
the second light-emitting element displays the same color as the first light-emitting element; and
when a distance between the first and second light-emitting elements is defined as a distance between light-emitting elements and a distance between the reference emission pattern and the first duplicated emission pattern is defined as a diffraction distance, the distance between the light-emitting elements and the diffraction distance satisfy the following equation:

$$0.1 \leq \beta/PP1 \leq 1.9$$

where PP1 denotes the distance between the light-emitting elements and β denotes the diffraction distance.

40. The display device of claim 27, wherein:
the diffraction pattern layer further comprises a passivation layer disposed on the diffraction patterns;
the diffraction patterns have a first refractive index;
the passivation layer has a second refractive index; and
the first refractive index, the second refractive index, and the thickness of one of the diffraction patterns satisfy the following equation:

$$(m*\lambda)-60 \text{ (nm)} \leq A \text{ (nm)} \leq (m*\lambda)+60 \text{ (nm)}$$

$$A \neq \Delta n \cdot t_1 \text{ (nm)}$$

where $\Delta n = |n1-n2|$, n1 denotes the first refractive index, n2 denotes the second refractive index, $t_1$ denotes the thickness of one of the diffraction patterns, λ is the wavelength of light emitted from the first light-emitting element, and m is an integer not smaller than 0.

* * * * *